US011876135B2

(12) United States Patent
Lee et al.

(10) Patent No.: US 11,876,135 B2
(45) Date of Patent: Jan. 16, 2024

(54) EPITAXIAL SOURCE/DRAIN STRUCTURES FOR MULTIGATE DEVICES AND METHODS OF FABRICATING THEREOF

(71) Applicant: Taiwan Semiconductor Manufacturing Company, Ltd., Hsin-Chu (TW)

(72) Inventors: Chen-Ming Lee, Yangmei (TW); I-Wen Wu, Hsinchu (TW); Po-Yu Huang, Hsinchu (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 248 days.

(21) Appl. No.: 17/383,989

(22) Filed: Jul. 23, 2021

(65) Prior Publication Data

US 2022/0238713 A1 Jul. 28, 2022

Related U.S. Application Data

(60) Provisional application No. 63/142,886, filed on Jan. 28, 2021.

(51) Int. Cl.
*H01L 29/78* (2006.01)
*H01L 27/12* (2006.01)
(Continued)

(52) U.S. Cl.
CPC ........ *H01L 29/7848* (2013.01); *H01L 27/127* (2013.01); *H01L 27/1266* (2013.01);
(Continued)

(58) Field of Classification Search
CPC ............. H01L 29/7848; H01L 27/1218; H01L 29/42392; H01L 27/1266; H01L 27/127;
(Continued)

(56) References Cited

U.S. PATENT DOCUMENTS

2018/0286861 A1 10/2018 Choi et al.
2019/0214459 A1 7/2019 Cheng et al.
(Continued)

*Primary Examiner* — Changhyun Yi
(74) *Attorney, Agent, or Firm* — HAYNES AND BOONE, LLP

(57) ABSTRACT

Epitaxial source/drain structures for enhancing performance of multigate devices, such as fin-like field-effect transistors (FETs) or gate-all-around (GAA) FETs, and methods of fabricating the epitaxial source/drain structures, are disclosed herein. An exemplary device includes a dielectric substrate. The device further includes a channel layer, a gate disposed over the channel layer, and an epitaxial source/drain structure disposed adjacent to the channel layer. The channel layer, the gate, and the epitaxial source/drain structure are disposed over the dielectric substrate. The epitaxial source/drain structure includes an inner portion having a first dopant concentration and an outer portion having a second dopant concentration that is less than the first dopant concentration. The inner portion physically contacts the dielectric substrate, and the outer portion is disposed between the inner portion and the channel layer. In some embodiments, the outer portion physically contacts the dielectric substrate.

20 Claims, 47 Drawing Sheets

(51) Int. Cl.
*H01L 29/786* (2006.01)
*H01L 29/423* (2006.01)
*H01L 29/06* (2006.01)

(52) U.S. Cl.
CPC .... *H01L 29/78621* (2013.01); *H01L 27/1218* (2013.01); *H01L 29/0673* (2013.01); *H01L 29/42392* (2013.01); *H01L 29/785* (2013.01); *H01L 29/78603* (2013.01); *H01L 29/78696* (2013.01)

(58) Field of Classification Search
CPC ............. H01L 29/78621; H01L 29/785; H01L 29/0673; H01L 29/78603; H01L 29/78696
See application file for complete search history.

(56) References Cited

U.S. PATENT DOCUMENTS

2020/0295014 A1 9/2020 Yu et al.
2020/0295136 A1 9/2020 Chen et al.
2020/0395237 A1 12/2020 Lin et al.
2022/0115500 A1* 4/2022 Choi ................... H01L 29/7848
2022/0190134 A1* 6/2022 Jeong ................ H01L 29/41775

* cited by examiner

FIG. 1A
100A
170
BEOL Structure
162
160
165
155
150
152
132
134
136
130A
130B
130C
138
146
144
142
120A
120B
120C
144A
144B
142A
142B
140
105
108
106
110
112
114
T
$T_U$
$T_L$
t1
t2
t3
t4
t5
t6
t7
t9
d1
d2
s
140
142
144
146
144A
144B
Z
X
Y

EPITAXIAL SOURCE/DRAIN STRUCTURES FOR MULTIGATE DEVICES AND METHODS OF FABRICATING THEREOF

This application is a non-provisional application of and claims benefit of U.S. Provisional Patent Application Ser. No. 63/142,886, filed Jan. 28, 2021, the entire disclosure of which is incorporated herein by reference.

BACKGROUND

Recently, multigate devices, which have gates that extend, partially or fully, around a channel to provide access to the channel on at least two sides, have been introduced to improve gate control. Multigate devices enable aggressive scaling down of IC technologies, maintaining gate control and mitigating short-channel effects (SCEs), while seamlessly integrating with conventional IC manufacturing processes. However, as multigate devices continue to scale, advanced techniques are needed for optimizing multigate device reliability. Accordingly, although existing multigate devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
FIG. 1A and FIG. 1B are fragmentary cross-sectional view of multigate devices, in portion or entirety, according to various aspects of the present disclosure.

The present disclosure relates generally to epitaxial source/drain structures for enhancing performance of multigate devices, such as fin-like field-effect transistors (FETs) or gate-all-around (GAA) FETs, and methods of fabricating the epitaxial source/drain structures.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Figure 1B:
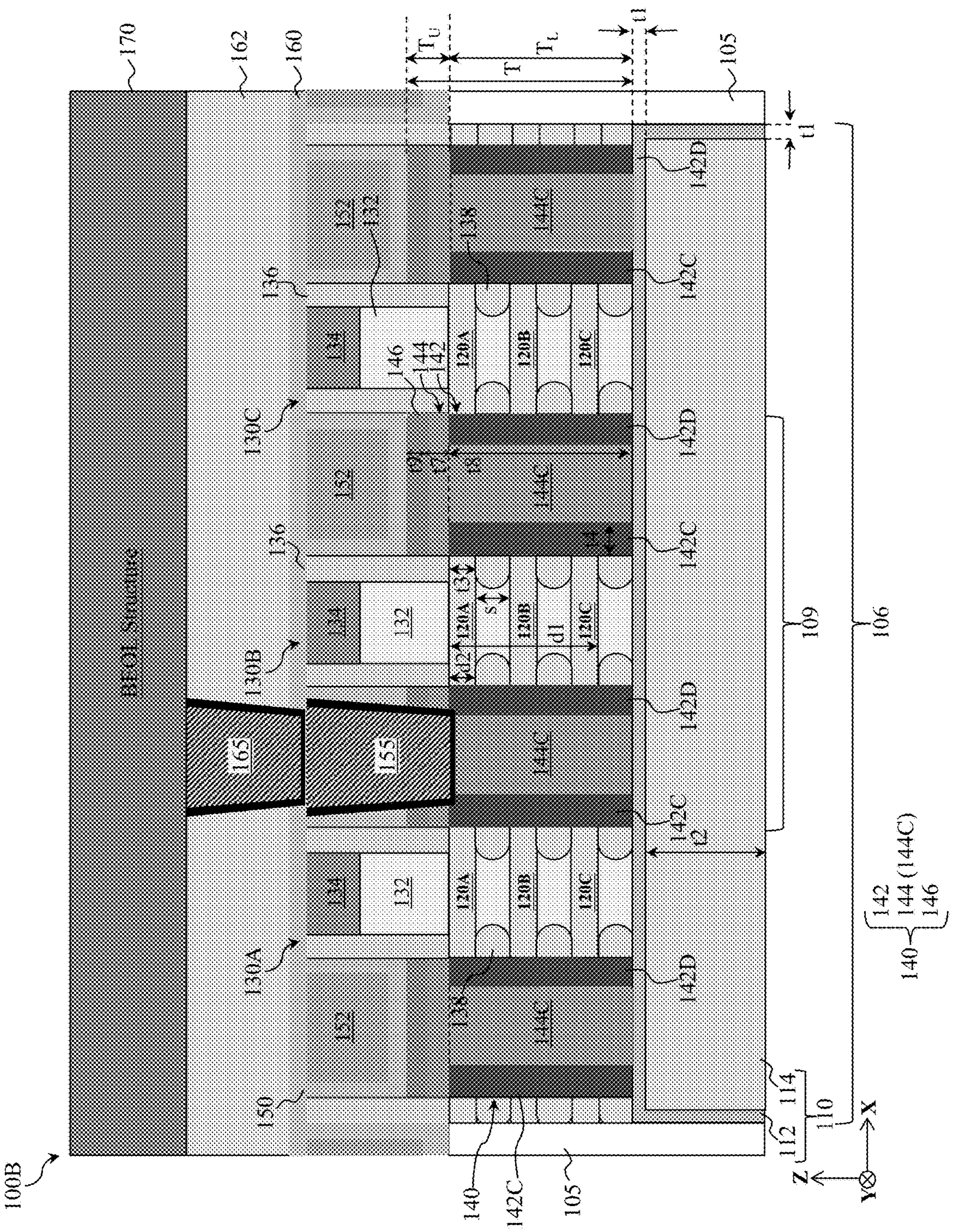

FIG. 1A is a fragmentary cross-sectional view of a multigate device 100A, in portion or entirety, according to various aspects of the present disclosure; and FIG. 1B is a fragmentary cross-sectional view of a multigate device 100B, in portion or entirety, according to various aspects of the present disclosure. Similar features of multigate device 100A in FIG. 1A and multigate device 100B in FIG. 1B are identified by the same reference numerals. Multigate device 100A and multigate device 100B each include at least one GAA transistor (i.e., a transistor having a gate that surrounds at least one suspended channel (for example, nanowires, nanosheets, nanobars, etc.). Multigate device 100A and multigate device 100B are similar in many respects, except multigate device 100A is configured with at least one p-type GAA transistor and multigate device 100B is configured with at least one n-type GAA transistor. Multigate device 100A and/or multigate device 100B may be included in a microprocessor, a memory, and/or other IC device. In some embodiments, multigate device 100A and/or multigate device 100B is a portion of an IC chip, a system on chip (SoC), or portion thereof, that includes various passive and active microelectronic devices, such as resistors, capacitors, inductors, diodes, p-type FETs (PFETs), n-type FETs (NFETs), metal-oxide semiconductor FETs (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIG. 1A and FIG. 1B have been simplified for the sake of clarity to better understand the inventive concepts of the present disclosure. Additional features can be added in multigate device 100A and/or multigate device 100B, and some of the features described below can be replaced, modified, or eliminated in other embodiments of multigate device 100A and/or multigate device 100B.

Both multigate device 100A and multigate device 100B include isolation features 105 that isolate various regions of multigate device 100A and multigate device 100B, respectively, such as active device regions and/or passive device regions, from each other. In FIG. 1A, isolation features 105 electrically isolate an active multigate device region 106, which includes at least one p-type GAA transistor 108, from other device regions. In FIG. 1A, isolation features 105 electrically isolate active multigate device region 106, which includes at least one n-type GAA transistor 109, from other device regions. Transistors in active multigate device regions 106, such as p-type GAA transistor 108 and/or n-type GAA transistor 109, are disposed over a dielectric substrate 110. In FIG. 1A and FIG. 1B, dielectric substrate 110 is disposed between isolation features 105. Dielectric substrate 110 includes one or more dielectric layers, such as a dielectric layer 112 and a dielectric layer 114. Dielectric layer 112 wraps dielectric layer 114. For example, dielectric layer 112 is disposed along a top and sidewalls of dielectric layer 114. Dielectric layer 112 separates dielectric layer 114 from isolation features 105. In some embodiments, dielectric layer 112 separates dielectric layer 114 from another dielectric structure, a semiconductor structure, and/or a metal structure. Dielectric layer 112 and dielectric layer 114 include different dielectric materials, each of which can include silicon, oxygen, nitrogen, carbon, other suitable dielectric constituent, or combinations thereof. In the depicted embodiments, dielectric layer 112 includes silicon and nitrogen, and dielectric layer 114 includes oxygen. For example, dielectric layer 112 is a silicon nitride layer, and dielectric layer 114 is an oxide layer. In some embodiments, dielectric layer 114 further includes silicon, such as a silicon oxide layer. Dielectric layer 112 has a thickness t1. In some embodiments, thickness t1 is about 1 nm to about 5 nm. Dielectric layer 114 has a thickness t2. In some embodiments, thickness t2 is about 10 nm to about 50 nm. In some embodiments, thickness t1 is substantially uniform, such that thickness t1 along a top surface of dielectric layer 114 is substantially the same as thickness t1 along sidewalls of dielectric layer 114. In some embodiments, thickness t1 varies along the top surface and/or the sidewalls of dielectric layer 114.

Both multigate device 100A and multigate device 100B include further include semiconductor layer stacks. Each semiconductor layer stack includes one or more semiconductor layers disposed and suspended over dielectric substrate 110. In the depicted embodiments, each semiconductor layer stack includes three semiconductor layers—a topmost semiconductor layer 120A, a middle semiconductor layer 120B, and a bottommost semiconductor layer 120C—which provides transistors of multigate device 100A, such as p-type GAA transistor 108, and transistors of multigate device 100B, such as n-type GAA transistor 109, with three channels. Semiconductor layers 120A-120C can thus alternatively be referred to as channel layers. In some embodiments, the semiconductor layer stacks include more or less than three semiconductor layers, for example, depending on a number of channels desired for transistors of multigate device 100A and/or transistors of multigate device 100B. Semiconductor layers 120A-120C include a semiconductor material, such as silicon, germanium, silicon germanium, silicon carbide, gallium arsenide, gallium phosphide, indium phosphide, indium arsenide, indium antimonide, GaAsP, AlInAs, AlGaAs, GaInAs, GaInP, GaInAsP, or combinations thereof. In the depicted embodiments, semiconductor layers 120A-120C are silicon channel layers or silicon germanium channel layers. In some embodiments, semiconductor layers 120A-120C include n-type dopants (e.g., phosphorus, arsenic, other n-type dopant, or combinations thereof) and/or p-type dopants (e.g., boron, indium, other p-type dopant, or combinations thereof). Semiconductor layers 120A-120C have a thickness t3 and are separated by spacing s. In some embodiments, thickness t3 is about 3 nm to about 7 nm. In some embodiments, spacing s is about 8 nm to about 12 nm. In some embodiments, semiconductor layers 120A-120C have nanometer-sized dimensions and can be referred to as "nanostructures," alone or collectively. For example, semiconductor layers 120A-120C can have widths along the x-direction that are about 5 nm to about 100 nm, lengths along the y-direction that are about 5 nm to about 100 nm, and thickness t3 along the z-direction that is about 3 nm to about 7 nm. The present disclosure also contemplates embodiments where semiconductor layers 120A-120C have sub-nanometer dimensions and/or greater than nanometer dimensions. Semiconductor layers 120A-120C can have cylindrical-shaped profiles (e.g., nanowires), rectangular-shaped profiles (e.g., nanobars), sheet-shaped profiles (e.g., nanosheets (e.g., dimensions in the X-Y plane are greater than dimensions in the X-Z plane and the Y-Z plane to form sheet-like structures)), or any other suitable shaped profile in the Y-Z plane.

Various gate structures, such as a gate structure 130A, a gate structure 130B, and a gate structure 130C, are disposed over dielectric substrate 110. Gate structures 130A-130C each include a respective metal gate 132, a respective hard mask 134, and respective gate spacers 136 disposed adjacent to (for example, along sidewalls of) their respective metal gate 132. Each metal gate 132 engages and wraps a respective set of channel layers (i.e., a respective set of semiconductor layers 120A-120C). In some embodiments, semiconductor layers 120A-120C are surrounded by metal gates 132 (e.g., in the Y-Z plane). Metal gates 132 engage respective channel regions of multigate device 100A that are defined between source/drain regions of multigate device 100A and respective channel regions of multigate device 100B that are defined between source/drain regions of multigate device 100B, such that current can flow between the source/drain regions (e.g., epitaxial source/drain structures 140) during operation. For example, p-type GAA transistor 108 includes gate structure 130B disposed over a respective set of semiconductor layers 120A-120C and between respective epitaxial source/drain structures 140, where metal gate 132 of gate structure 130B wraps the respective set of semiconductor layers 120A-120C, and n-type GAA transistor 109 includes gate structure 130B disposed over a respective set of semiconductor layers 120A-120C and between respective epitaxial source/drain structures 140, where metal gate 132 of gate structure 130B wraps the respective set of semiconductor layers 120A-120C. During operation of p-type GAA transistor 108 and n-type GAA transistor 109, current can flow through the respective set of semiconductor layers 120A-120C and the respective epitaxial source/drain structures 140. In FIG. 1A and FIG. 1B, metal gates 132 are disposed between gate spacers 136, between inner spacers 138, between hard masks 134 and semiconductor layers 120A, between semiconductor layers 120A and semiconductor layers 120B, between semiconductor layers 120B and semiconductor layers 120C, and between semiconductor layers 120C and dielectric substrate 105. Metal gates 132 physically contact dielectric substrate 110, instead of a semiconductor substrate. Inner spacers 138 are disposed between metal gates 132 and epitaxial source/drain structures 140, between semiconductor layers 120A and semiconductor layers 120B, between semiconductor layers 120B and semiconductor layers 120C, and between semiconductor layers 120C and dielectric substrate 110. In the depicted embodiments, metal gates 132 and inner spacers 138 physically contact dielectric substrate 110, instead of a semiconductor substrate.

Epitaxial source/drain structures 140 are disposed in source/drain regions of multigate device 100A and multigate device 100B. Epitaxial source/drain structures 140 have a thickness T, which is a sum of a lower thickness $T_L$ of lower epitaxial portions of epitaxial source/drain structures 140 (e.g., portions of epitaxial source/drain structures 140 below top surfaces of topmost semiconductor layers 120A) and an upper thickness $T_U$ of upper epitaxial portions of epitaxial source/drain structures 140 (e.g., portions of epitaxial source/drain structures 140 above top surfaces of topmost semiconductor layers 120A). Epitaxial source/drain structures 140 include epitaxial layers 142, epitaxial layers 144, and epitaxial layers 146. Epitaxial layers 142 and epitaxial layers 144 include silicon, germanium, silicon germanium, other suitable semiconductor material, or combinations thereof. In some embodiments, as further discussed below, epitaxial layers 142 and epitaxial layers 144 include the same material but with different compositions. Epitaxial source/drain structures 140 (in particular, epitaxial layers 142 and epitaxial layers 144) physically contact dielectric substrate 110, instead of a semiconductor substrate, which enhances performance of multigate device 100A and multigate device 100B. For example, in a multigate device having a semiconductor substrate, a parasitic transistor can form between a metal gate surrounding a bottommost channel layer, the semiconductor substrate, and epitaxial source/drain structures disposed in the semiconductor substrate and negatively impact performance, for example, by introducing leakage current. In some embodiments, replacing the semiconductor substrate with a dielectric substrate in multigate device 100A and multigate device 100B can substantially suppress (or, in some embodiments, eliminate) any parasitic transistor formed between metal gates 132, epitaxial source/drain structures 140, and their underlying substrate (here, dielectric substrate 110), thereby improving performance (for example, by reducing leakage current) compared to multigate devices having epitaxial source/drain structures disposed in and/or physically contacting semiconductor substrates.

Epitaxial layers 142 form sidewalls of lower epitaxial portions of epitaxial source/drain structures 140. In FIG. 1A, epitaxial layers 142 of multigate device 100A include epitaxial sidewalls 142A and epitaxial sidewalls 142B. In FIG. 1B, epitaxial layers 142 of multigate device 100B include epitaxial sidewalls 142C and epitaxial sidewalls 142D. Epitaxial sidewalls 142A-142D extend continuously (i.e., without interruption) from top surfaces of respective topmost semiconductor layers 120A to dielectric substrate 110 (and thus have lower thickness $T_L$ along the z-direction) and cover sidewalls of respective semiconductor layers 120A-120C and sidewalls of respective inner spacers 138. Epitaxial sidewalls 142A-142D physically contact dielectric substrate 110 and have a thickness t4 along the x-direction (i.e., a sidewall thickness). In some embodiments, thickness t4 is about 2 nm to about 7 nm. In some embodiments, thickness t4 of epitaxial sidewalls 142A, 142B is about 3 nm to about 7 nm. In some embodiments, thickness t4 of epitaxial sidewalls 142C, 142D is about 2 nm to about 6 nm. In FIG. 1A and FIG. 1B, thickness t4 is uniform along the z-direction, such that thickness t4 proximate semiconductor layers 120A is substantially the same as thickness t4 proximate dielectric substrate 110. In some embodiments, thickness t4 may vary along the z-direction. For example, thickness t4 may taper in an increasing or decreasing manner, such that thickness t4 increases or decreases along the z-direction from semiconductor layers 120A to dielectric substrate 110. In some embodiments, epitaxial sidewalls 142A-142D may extend above top surfaces of topmost semiconductor layers 120A-120C, such that epitaxial sidewalls 142A-142D have a thickness that is greater than thickness $T_L$ along the z-direction and form a part of upper epitaxial portions of epitaxial source/drain structures 140. In some embodiments, epitaxial sidewalls 142A-142D have a thickness that is less than thickness $T_L$ along the z-direction, such that epitaxial sidewalls 142A-142D extend along a portion of sidewalls of epitaxial layers 144 in lower epitaxial portions of epitaxial source/drain structures 140. In some embodiments, epitaxial sidewalls 142A are discrete and separate from epitaxial sidewalls 142B, such that epitaxial sidewalls 142A are not connected to epitaxial sidewalls 142B. In some embodiments, epitaxial sidewalls 142C are discrete and separate from epitaxial sidewalls 142D, such that epitaxial sidewalls 142C are not connected to epitaxial sidewalls 142D. In some embodiments, epitaxial layers 142 are continuous sidewall layers that surround epitaxial layers 144. In such embodiments, epitaxial sidewalls 142A are connected to epitaxial sidewalls 142B and/or epitaxial sidewalls 142C are connected to epitaxial sidewalls 142D.

Epitaxial layers 144 extend a depth that is greater than or equal to a depth of bottommost channel layers of multigate device 100A and multigate device 100B to ensure that current flows through/from epitaxial layers 144 to bottommost channel layers during operation of multigate device 100A and multigate device 100B. For example, epitaxial layers 144 extend to a depth that is greater than a depth d1 of bottom surfaces of bottommost semiconductor layers 120C so that current can flow between epitaxial layers 144 and semiconductor layers 120C during operation of multigate device 100A and multigate device 100B. In FIG. 1A, epitaxial layers 144 of multigate device 100A have epitaxial sub-layers 144A and epitaxial sub-layers 144B. In FIG. 1B, epitaxial layers 144 of multigate device 100B have epitaxial layers 144C. In the depicted embodiments, epitaxial layers 144 of both multigate device 100A and multigate device 100B physically contact dielectric substrate 110. For example, epitaxial sub-layers 144A of multigate device 100A and epitaxial layers 144C of multigate device 100B physically contact dielectric substrate 110. In some embodiments, epitaxial layers 142 are disposed between epitaxial layers 144 and dielectric substrate 110, such as between epitaxial sub-layers 144A and dielectric substrate 110 of multigate device 100A and/or between epitaxial layers 144C and dielectric substrate 110 of multigate device 100B. In such embodiments, epitaxial layers 142 separate a portion or an entirety of bottoms of epitaxial sub-layers 144A from dielectric substrate 110 and/or bottoms of epitaxial layers 144C from dielectric substrate 110.

In multigate device 100A (FIG. 1A), epitaxial sub-layers 144B are disposed over epitaxial sub-layers 144A, epitaxial sub-layers 144A form a part of lower epitaxial portions of epitaxial source/drain structures 140, and epitaxial sub-layers 144B form a part of lower epitaxial portions of epitaxial source/drain structures 140 and a part of upper epitaxial portions of epitaxial source/drain structures 140. In lower epitaxial portions of epitaxial source/drain structures 140, epitaxial sub-layers 144A and lower portions of epitaxial sub-layers 144B are disposed between epitaxial sidewalls 142A and epitaxial sidewalls 142B, such that epitaxial sidewalls 142A, 142B separate epitaxial sub-layers 144A and epitaxial sub-layers 144B from semiconductor layers 120A-120C and inner spacers 138. Epitaxial sub-layers 144A have a thickness t5 and lower portions of epitaxial sub-layers 144B have a thickness t6. A sum of thickness t5 and thickness t6 is greater than or equal to depth d1. In the depicted embodiment, a sum of thickness t5 and thickness t6 is equal to about thickness $T_L$. In some embodiments, thickness t5 is about 17 nm to about 33 nm. In some embodiments, thickness t6 is less than about 40 nm. In embodiments where epitaxial layers 142 are disposed between epitaxial sub-layers 144A and dielectric substrate 110, a sum of thickness t5 and thickness t6 may be less thickness $T_L$. In some embodiments, epitaxial sub-layers 144B extend a depth that is greater than or equal to a depth of topmost channel layers of multigate device 100A to ensure that current flows through/from epitaxial sub-layers 144B to topmost channel layers during operation of multigate device 100A. For example, epitaxial sub-layers 144B extend to a depth that is greater than a depth d2 of bottom surfaces of topmost semiconductor layers 120A to ensure that current flows between epitaxial sub-layers 144B and semiconductor layers 120A during operation of multigate device 100A. In the depicted embodiment, epitaxial sub-layers 144B extend to a depth that is also greater than a depth of bottom surfaces of middle semiconductor layers 120B, such that current also flows between epitaxial sub-layers 144B and semiconductor layers 120B during operation of multigate device 100A. As described further below, a composition of epitaxial sub-layers 144B is different than a composition of epitaxial sub-layers 144A, where the composition of epitaxial sub-layers 144B may impart greater strain on channel regions (i.e., semiconductor layers 120A-120C) of multigate device 100A than the composition of epitaxial sub-layers 144A.

In multigate device 100B (FIG. 1B), epitaxial layers 144C form lower epitaxial portions of epitaxial source/drain structures 140 and a part of upper epitaxial portions of epitaxial source/drain structures 140. In lower epitaxial portions of epitaxial source/drain structures 140, epitaxial layers 144C are disposed between epitaxial sidewalls 142C and epitaxial sidewalls 142D, such that epitaxial sidewalls 142C, 142D separate epitaxial layers 144C from semiconductor layers 120A-120C and inner spacers 138. Lower portions of epitaxial layers 144C have a thickness t8 that is greater than or equal to depth d1. In the depicted embodiment, thickness t8 is equal to about thickness $T_L$. In some embodiments, thickness t8 is about 33 nm to about 57 nm. In embodiments where epitaxial layers 142 are disposed between epitaxial layers 144C and dielectric substrate 110, thickness t8 may be less thickness $T_L$. In some embodiments, epitaxial layers 144C extend a depth that is greater than or equal to a depth of topmost channel layers of multigate device 100B to ensure that current flows through/from epitaxial layers 144C to topmost channel layers during operation of multigate device 100B. For example, epitaxial layers 144C extend to a depth that is greater than depth d2 of bottom surfaces of topmost semiconductor layers 120A to ensure that current flows between epitaxial layers 144C and semiconductor layers 120A during operation of multigate device 100B. In the depicted embodiment, epitaxial layers 144C extend to a depth that is also greater than a depth of bottom surfaces of middle semiconductor layers 120B, such that current also flows between epitaxial layers 144C and semiconductor layers 120B during operation of multigate device 100B.

In upper epitaxial portions of epitaxial source/drain structures 140, epitaxial layers 146 and upper portions of epitaxial sub-layers 144B of multigate device 100A and epitaxial layers 146 and upper portions of epitaxial layers 144C are disposed between gate spacers 136 of adjacent gate structures (e.g., between gate spacers 136 of gate structure 130B and gate spacers 136 of gate structure 130C). Upper portions of epitaxial sub-layers 144B (FIG. 1A) and upper portions of epitaxial layers 144C (FIG. 1B), having a thickness t7, are positioned above top surfaces of semiconductor layers 120A. Upper portions of epitaxial sub-layers 144B (FIG. 1A) cover top surfaces of epitaxial sidewalls 142A, 142B, while upper portions of epitaxial layers 144C (FIG. 1B) cover top surfaces of epitaxial sidewalls 142C, 142D. In some embodiments, thickness t7 is about 2 nm to about 8 nm. In some embodiments, a total thickness of epitaxial sub-layers 144B (i.e., a sum of thickness t6 and thickness t7) is about 2 nm to about 48 nm. In some embodiments, a total thickness of epitaxial layers 144C (i.e., a sum of thickness t8 and thickness t7) is about 35 nm to about 65 nm. Epitaxial layers 146, having thickness t9, are disposed over epitaxial sub-layers 144B of multigate device 100A and epitaxial layers 144C of multigate device 100B. In some embodiments, thickness t9 is less than about 5 nm. In the depicted embodiment, a sum of thickness t7 and thickness t9 is about equal to thickness $T_U$. In some embodiments, epitaxial layers 146 are omitted from epitaxial source/drain structures 140. Epitaxial layers 146 include silicon, germanium, silicon germanium, other suitable semiconductor material, or combinations thereof. In the depicted embodiment, epitaxial layers 146 include undoped or unintentionally doped (UID) silicon.

For multigate device 100A (FIG. 1A), in some embodiments, epitaxial layers 142 and epitaxial layers 144 include p-doped silicon germanium but with different germanium concentrations and/or different p-type dopant concentrations. The p-type dopant can be boron, indium, other suitable p-type dopant, or combinations thereof. In some embodiments, a germanium concentration of epitaxial layers 142 is less than a germanium concentration of epitaxial layers 144, a p-type dopant concentration of epitaxial layers 142 is less than a p-type dopant concentration of epitaxial layers 144, or both the germanium concentration and the p-type dopant concentration of epitaxial layers 142 are less than the germanium concentration and the p-type dopant concentration, respectively, of epitaxial layers 144. In some embodiments, epitaxial layers 142 have a germanium concentration of about 15 atomic percent (at %) to about 30 at %, and epitaxial layers 144 have a germanium concentration of about 15 at % to about 65 at %. In some embodiments, epitaxial layers 142 have a boron dopant concentration of about $1\times10^{20}$ dopants/$cm^3$ ($cm^{-3}$) to about $5\times10^{20}$ $cm^{-3}$, and epitaxial layers 144 have a boron dopant concentration of about $5\times10^{20}$ $cm^{-3}$ to about $1.5\times10^{21}$ $cm^{-3}$. In some embodiments, epitaxial sub-layers 144A and epitaxial sub-layers 144B include the same material but with different compositions. For example, epitaxial sub-layers 144A and epitaxial sub-layers 144B include p-doped silicon germanium but with different germanium concentrations and/or different p-type dopant concentrations. In the depicted embodiment, a germanium concentration of epitaxial sub-layers 144B is greater than a germanium concentration of epitaxial sub-layers 144A, while a boron dopant concentration is substantially the same in epitaxial sub-layers 144B and epitaxial sub-layers 144A. For example, epitaxial sub-layers 144A have a germanium concentration of about 15 at % to about 65 at %, epitaxial sub-layers 144B have a germanium concentration of about 50 at % to about 65 at %, and epitaxial sub-layers 144A and epitaxial sub-layers 144B have a boron dopant concentration of about $5\times10^{20}$ $cm^{-3}$ to about $1.5\times10^{21}$ $cm^{-3}$. In some embodiments, the boron dopant concentration of epitaxial sub-layers 144B is greater than or less than the boron dopant concentration of epitaxial sub-layers 144A.

In some embodiments, epitaxial layers 142 and/or epitaxial layers 144 have a substantially uniform germanium concentration and/or a substantially uniform p-type dopant concentration along thickness T. For example, the germanium concentration and/or the p-type dopant concentration at a depth of semiconductor layers 120A is substantially the same as the germanium concentration and/or the p-type dopant concentration depth of semiconductor layers 120C. In some embodiments, epitaxial layers 142 and/or epitaxial layers 144 have a gradient germanium concentration and/or a gradient p-type dopant concentration that increases or decreases along thickness T. For example, a germanium concentration decreases from a maximum germanium concentration at a depth of semiconductor layers 120A to a minimum germanium concentration at a depth of semiconductor layers 120C (or proximate dielectric substrate 110) or the germanium concentration increases from a minimum germanium concentration at a depth of semiconductor layers 120A to a maximum germanium concentration at a depth of semiconductor layers 120C (or proximate dielectric substrate 110)). In another example, a p-type dopant concentration decreases from a maximum p-type dopant concentration at a depth of semiconductor layers 120A to a minimum p-type dopant concentration at a depth of semiconductor layers 120C (or proximate dielectric substrate 110) or the p-type dopant concentration increases from a minimum p-type dopant concentration at a depth of semiconductor layers 120A to a maximum p-type dopant concentration at a depth of semiconductor layers 120C (or proximate dielectric substrate 110)). In some embodiments, epitaxial layers 142 and/or epitaxial layers 144 have discrete portions having different germanium concentrations and/or different p-type dopant concentrations, such as a first portion with a first germanium concentration and/or a first p-type dopant concentration and a second portion with a second germanium concentration that is different than the first germanium concentration and/or a second p-type dopant concentration that is different than the first p-type dopant concentration. In some embodiments, epitaxial sub-layers 144A and/or epitaxial sub-layers 144B have a substantially uniform germanium concentration, a substantially uniform p-type dopant concentration, a gradient germanium concentration, a gradient p-type dopant concentration, other germanium concentration profile, other p-type dopant concentration profile, or combinations thereof. In FIG. 1A, epitaxial sub-layers 144A have a gradient germanium concentration that increases along thickness t5 from dielectric substrate 110 to an interface between epitaxial sub-layers 144A and epitaxial sub-layers 144B (i.e., a germanium concentration of epitaxial subs-layers 144A proximate dielectric substrate 110 is less than a germanium concentration of epitaxial sub-layers 144A at the interface), while a germanium concentration of epitaxial sub-layers 144B is substantially uniform or gradient.

For multigate device 100B (FIG. 1B), in some embodiments, epitaxial layers 142 and epitaxial layers 144 include n-doped silicon with different n-type dopant concentrations or n-doped silicon carbide with different carbon concentrations and/or different n-type dopant concentrations. The n-type dopant can be arsenic, phosphorous, other suitable n-type dopant, or combinations thereof. In some embodiments, a carbon concentration of epitaxial layers 142 is less than a carbon concentration of epitaxial layers 144, an n-type dopant concentration of epitaxial layers 142 is less than an n-type dopant concentration of epitaxial layers 144, or both the carbon concentration and the n-type dopant concentration of epitaxial layers 142 are less than the carbon concentration and the n-type dopant concentration, respectively, of epitaxial layers 144. In some embodiments, epitaxial layers 142 have a carbon concentration of about 0 at % to about 2 at %, and epitaxial layers 144 have a carbon concentration of about 0 at % to about 2 at %. In some embodiments, epitaxial layers 142 have an arsenic dopant concentration of about $1\times10^{20}$ $cm^{-3}$ to about $2\times10^{21}$ $cm^{-3}$, and epitaxial layers 144 have an arsenic dopant concentration of about $2\times10^{21}$ $cm^{-3}$ to about $4\times10^{21}$ $cm^{3}$. In some embodiments, epitaxial layers 142 have a phosphorous dopant concentration of about $1\times10^{20}$ $cm^{-3}$ to about $2\times10^{21}$ $cm^{-3}$, and epitaxial layers 144 have a phosphorous dopant concentration of about $2\times10^{21}$ $cm^{-3}$ to about $4\times10^{21}$ $cm^{-3}$. In some embodiments, epitaxial layers 142 and/or epitaxial layers 144 have a substantially uniform carbon concentration and/or a substantially uniform n-type dopant concentration (e.g., arsenic dopant concentration or arsenic dopant concentration) along thickness T. For example, a carbon concentration and/or an n-type dopant concentration at a depth of semiconductor layers 120A is substantially the same as a carbon concentration and/or an n-type dopant concentration at a depth of semiconductor layers 120C. In some embodiments, epitaxial layers 142 and/or epitaxial layers 144 have a gradient carbon concentration and/or a gradient n-type dopant concentration that increases or decreases along thickness T. For example, a carbon concentration decreases from a maximum carbon concentration at a depth of semiconductor layers 120A to a minimum carbon concentration at a depth of semiconductor layers 120C (or proximate dielectric substrate 110) or the carbon concentration increases from a minimum carbon concentration at a depth of semiconductor layers 120A to a maximum carbon concentration at a depth of semiconductor layers 120C (or proximate dielectric substrate 110)). In another example, an n-type dopant concentration decreases from a maximum n-type dopant concentration at a depth of semiconductor layers 120A to a minimum n-type dopant concentration at a depth of semiconductor layers 120C (or proximate dielectric substrate 110) or the n-type dopant concentration increases from a minimum n-type dopant concentration at a depth of semiconductor layers 120A to a maximum n-type dopant concentration at a depth of semiconductor layers 120C (or proximate dielectric substrate 110)). In some embodiments, epitaxial layers 142 and/or epitaxial layers 144 have discrete portions having different carbon concentrations and/or different n-type dopant concentrations, such as a first portion with a first carbon concentration and/or a first n-type dopant concentration and a second portion with a second carbon concentration that is different than the first carbon concentration and/or a second n-type dopant concentration that is different than the first n-type dopant concentration.

Multigate device 100A and multigate device 100B further include a multilayer interconnect feature, which includes a device-level contact structure (e.g., a contact etch stop layer (CESL) 150, an interlayer dielectric (ILD) layer 152, one or more source/drain contacts 155 extending through ILD layer 152 and/or CESL 150 to respective epitaxial source/drain structures 140), a middle-of-line structure (e.g., a CESL 160, an ILD layer 162, and via and/or contacts extending through CESL 160 and/or ILD layer 162, such as source/drain contacts 165 and/or gate contacts to one or more of metal gates 132 of gate structures 130A-130C), and a BEOL structure 170. The MLI feature facilitates operation of transistors of multigate device 100A, such as p-type GAA transistor 108, and/or transistors of multigate device 100B, such as n-type GAA transistor 109. The MLI feature electrically couples various devices (for example, p-type transistors and/or n-type transistors of multigate device 100A and/or multigate device 100B, resistors, capacitors, and/or inductors) and/or components (for example, metal gates 132 and/or epitaxial source/drain features 140), such that the various devices and/or components can operate as specified by design requirements of multigate device 100A and/or multigate device 100B. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different levels (or different layers) of the MLI feature. During operation, the MLI features routes signals between the devices and/or the components of multigate device 100A and/or multigate device 100B and/or distribute signals (for example, clock signals, voltage signals, and/or ground signals) to the devices and/or the components of multigate device 100A and/or multigate device 100B.

Figure 2A:
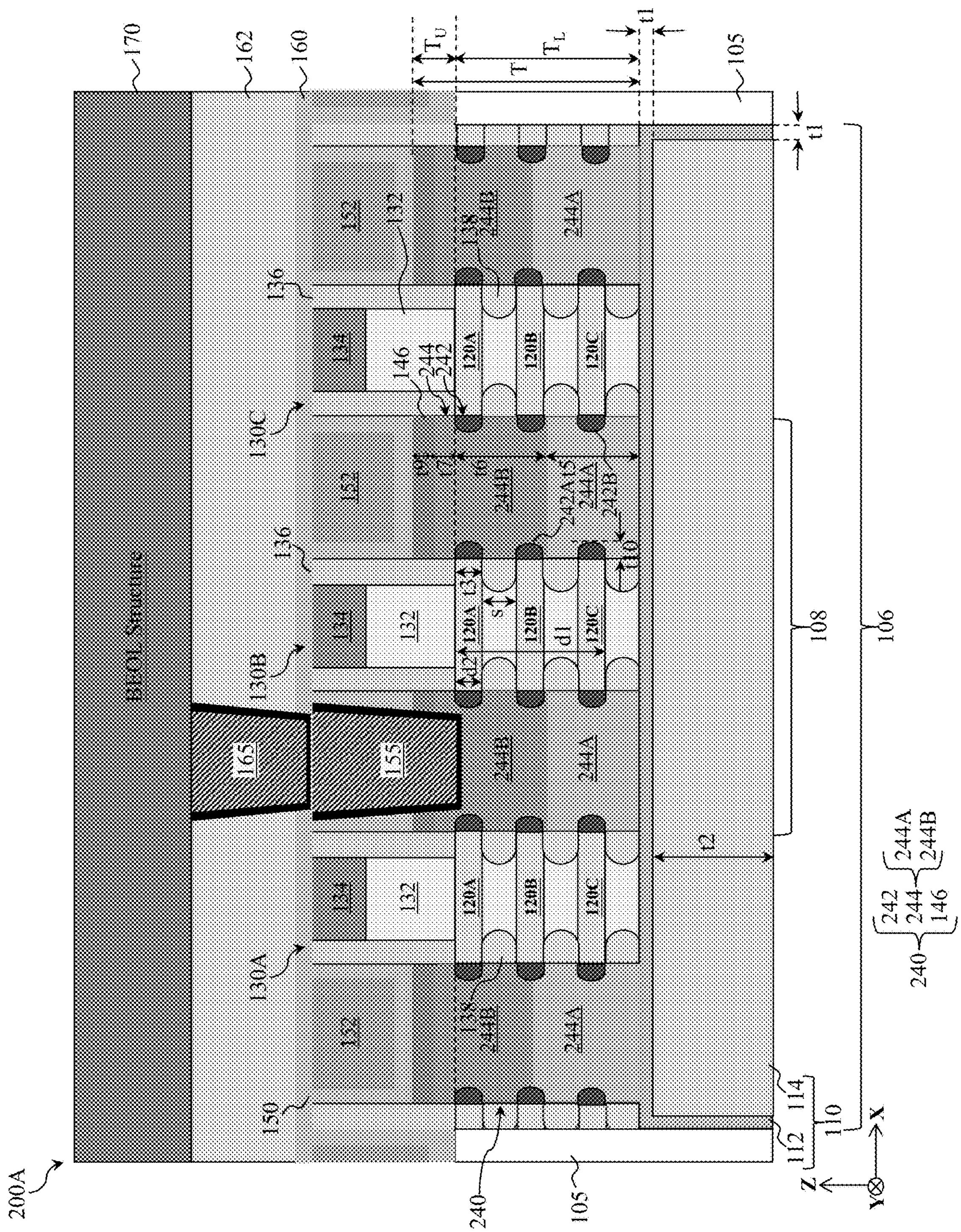
FIG. 2A and FIG. 2B are fragmentary cross-sectional view of multigate devices, in portion or entirety, according to various aspects of the present disclosure.
Figure 2B:
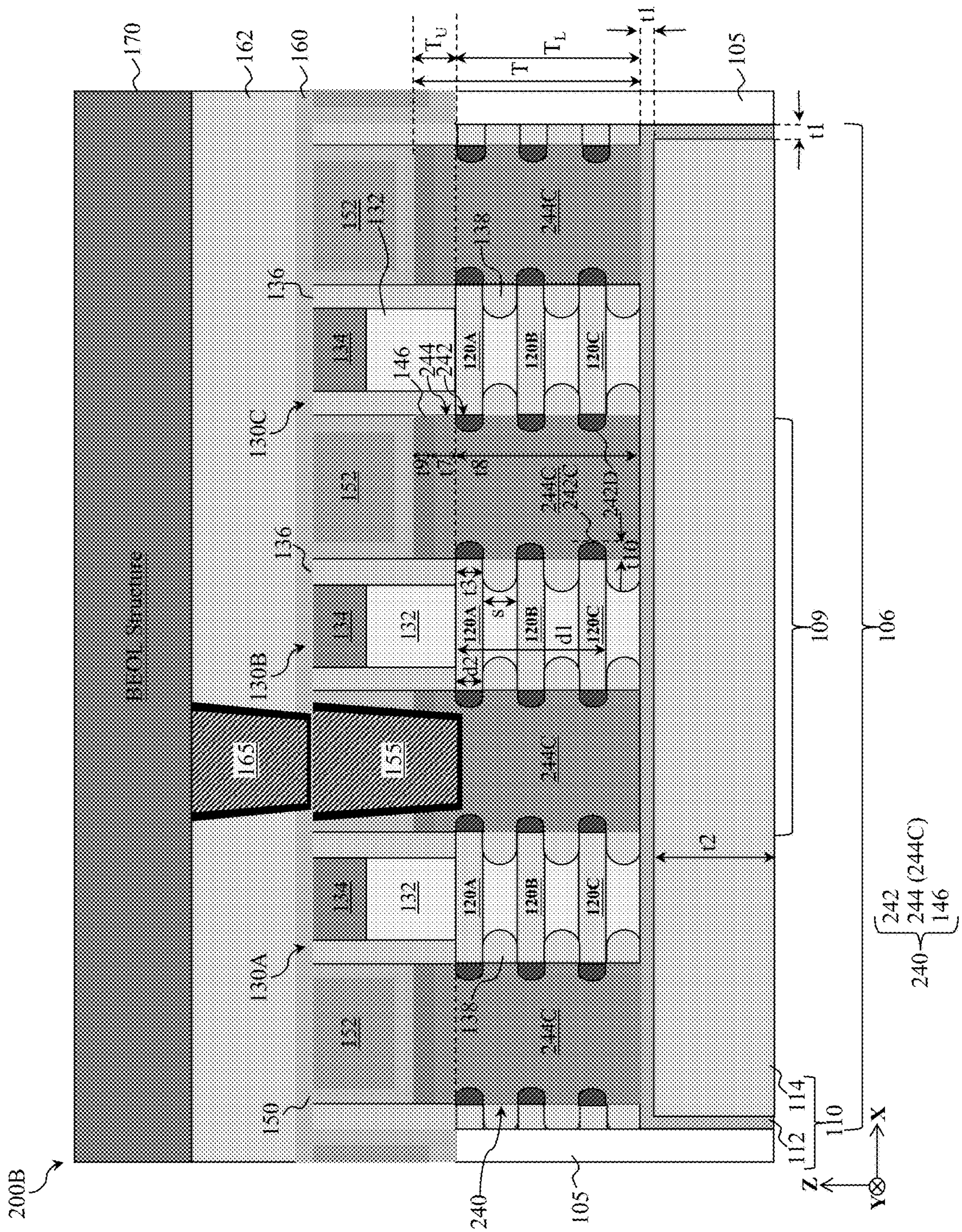

FIG. 2A is a fragmentary cross-sectional view of a multigate device 200A, in portion or entirety, according to various aspects of the present disclosure; and FIG. 2B is a fragmentary cross-sectional view of a multigate device 200B, in portion or entirety, according to various aspects of the present disclosure. For clarity and simplicity, similar features of multigate device 100A in FIG. 1A, multigate device 100B in FIG. 1B, multigate device 200A in FIG. 2A, and multigate device 200B in FIG. 2B are identified by the same reference numerals. Multigate device 200A and multigate device 200B are similar in many respects to multigate device 100A and multigate device 100B, respectively, except multigate device 200A and multigate device 200B include epitaxial source/drain structures 240, instead of epitaxial source/drain structures 140, disposed in their respective source/drain regions as further described below. Multigate device 200A and/or multigate device 200B may be included in a microprocessor, a memory, and/or other IC device. In some embodiments, multigate device 200A and/or multigate device 200B is a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 2A and FIG. 2B have been simplified for the sake of clarity to better understand the inventive concepts of the present disclosure. Additional features can be added in multigate device 200A and/or multigate device 200B, and some of the features described below can be replaced, modified, or eliminated in other embodiments of multigate device 200A and/or multigate device 200B.

Epitaxial source/drain structures 240 have thickness T, which is a sum of lower thickness $T_L$ of lower epitaxial portions of epitaxial source/drain structures 240 (e.g., portions of epitaxial source/drain structures 240 below top surfaces of topmost semiconductor layers 120A) and upper thickness $T_U$ of upper epitaxial portions of epitaxial source/drain structures 240 (e.g., portions of epitaxial source/drain structures 240 above top surfaces of topmost semiconductor layers 120A). Similar to epitaxial source/drain structure 140, epitaxial source/drain structures 240 physically contact dielectric substrate 110, instead of a semiconductor substrate. Epitaxial source/drain structures 240 include epitaxial layers 242, epitaxial layers 244, and epitaxial layers 146. In FIG. 2A, epitaxial layers 242 of multigate device 200A include epitaxial sidewalls 242A and epitaxial sidewalls 242B that form portions of sidewalls of lower epitaxial portions of epitaxial source/drain structures 240, and epitaxial layers 244 include epitaxial sub-layers 244A and epitaxial sub-layers 244B. In FIG. 2B, epitaxial layers 242 of multigate device 200B include epitaxial sidewalls 242C and epitaxial sidewalls 242D, and epitaxial layers 244 include epitaxial layers 244C. Compositions of epitaxial layers 242 (e.g., epitaxial sidewalls 242A-242D) and epitaxial layers 244 (e.g., epitaxial sub-layers 244A, epitaxial sub-layers 244B, and/or epitaxial sub-layers 244C) are similar to compositions of epitaxial layers 142 (e.g., epitaxial sidewalls 142A-142D) and epitaxial layers 144 (e.g., epitaxial sub-layers 144A, epitaxial sub-layers 144B, and/or epitaxial sub-layers 144C), respectively. For example, epitaxial layers 242 and epitaxial layers 244 include silicon, germanium, silicon germanium, other suitable semiconductor material, or combinations thereof configured as describe above. In some embodiments, epitaxial layers 242 and epitaxial layers 244 include the same material but with different compositions.

Instead of extending continuously (i.e., without interruption) from top surfaces of respective topmost semiconductor layers 120A to dielectric substrate 110 and physically contacting dielectric substrate 110, in both multigate device 200A and multigate device 200B, epitaxial layers 242 are discontinuous along sidewalls of epitaxial source/drain structures 240, where epitaxial sidewalls 242A-242D are discrete portions that cover sidewalls of respective semiconductor layers 120A-120C. Accordingly, epitaxial sub-layers 244A and epitaxial sub-layers 244B are separated from semiconductor layers 120A-120C by epitaxial sidewalls 242A, 242B but not inner spacers 138, such that epitaxial sub-layers 244A and epitaxial sub-layers 244B wrap epitaxial sidewalls 242A, 242B and physically contact inner spacers 138; and epitaxial layers 244C are separated from semiconductor layers 120A-120C by epitaxial sidewalls 242C, 242D but not inner spacers 138, such that epitaxial layers 244C wrap epitaxial sidewalls 242C, 242D and physically contact inner spacers 138. In some embodiments, epitaxial sidewalls 242A-242D extend at least partially over inner spacers 138, such that epitaxial sidewalls 242A-242D may separate a portion of epitaxial sub-layers 244A, epitaxial sub-layers 242B, and/or epitaxial layers 244C from inner spacers 138. Epitaxial sidewalls 242A-242D have a thickness t10 along the x-direction (i.e., a sidewall thickness). In some embodiments, thickness t10 is less than thickness t4. In some embodiments, thickness t10 is about equal or greater than thickness t4. In some embodiments, thickness t10 is about 2 nm to about 7 nm. In some embodiments, thickness t10 of epitaxial sidewalls 242A, 242B is about 3 nm to about 7 nm. In some embodiments, thickness t10 of epitaxial sidewalls 242C, 242D is about 2 nm to about 6 nm. In FIG. 2A and FIG. 2B, thickness t10 at a center region of epitaxial sidewalls 242A-242D is greater than thickness t10 at edge regions of epitaxial sidewalls 242A-242D. In some embodiments, thickness t10 is uniform along the z-direction. In some embodiments, thickness t10 may taper in an increasing or decreasing manner, such that thickness t10 increases or decreases along the z-direction. In some embodiments, bottommost epitaxial sidewalls 242A and/or epitaxial sidewalls 242C are discrete and separate from epitaxial sidewalls 242B and/or epitaxial sidewalls 242D, respectively, such that epitaxial sidewalls 242A are not connected to epitaxial sidewalls 242B and/or epitaxial sidewalls 242C are not connected to epitaxial sidewalls 242D. In some embodiments, bottommost epitaxial sidewalls 242A and/or epitaxial sidewalls 242C are connected to bottommost epitaxial sidewalls 242B and/or epitaxial sidewalls 242D, respectively. In FIG. 2A and FIG. 2B, epitaxial layers 244 have varying widths. For example, widths of epitaxial sub-layers 244A, epitaxial sub-layers 244B, and epitaxial layers 244C between epitaxial sidewalls 242A-242D are less than widths of epitaxial sub-layers 244A, epitaxial sub-layers 244B, and epitaxial layers 244C, respectively between inners spacers 138. The present disclosure contemplates other width configurations of epitaxial sub-layers 244A, epitaxial sub-layers 244B, and epitaxial layers 244C depending on a continuity configuration and/or thicknesses of epitaxial sidewalls 242A-242D.

Figure 3A:
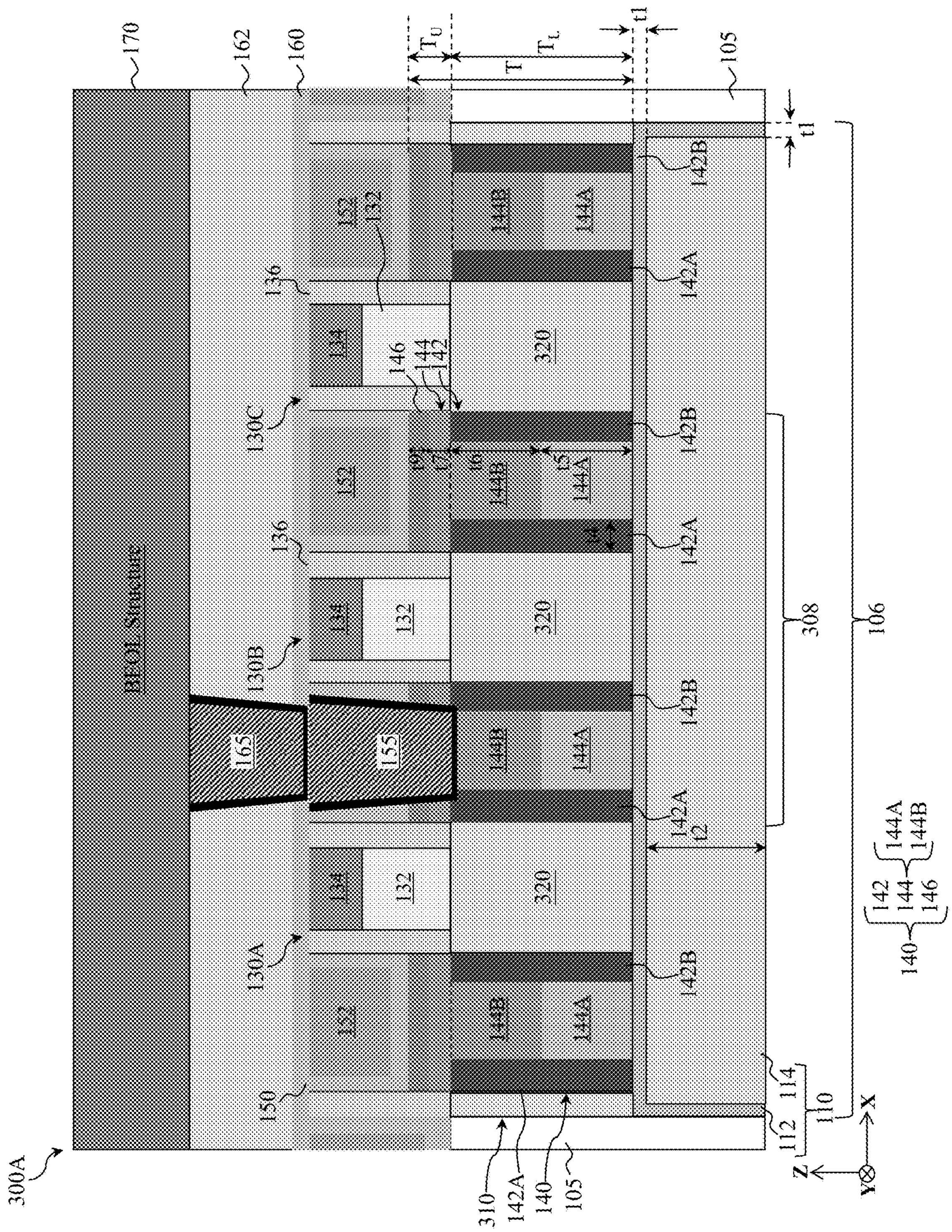
FIG. 3A and FIG. 3B are fragmentary cross-sectional view of multigate devices, in portion or entirety, according to various aspects of the present disclosure.
Figure 3B:
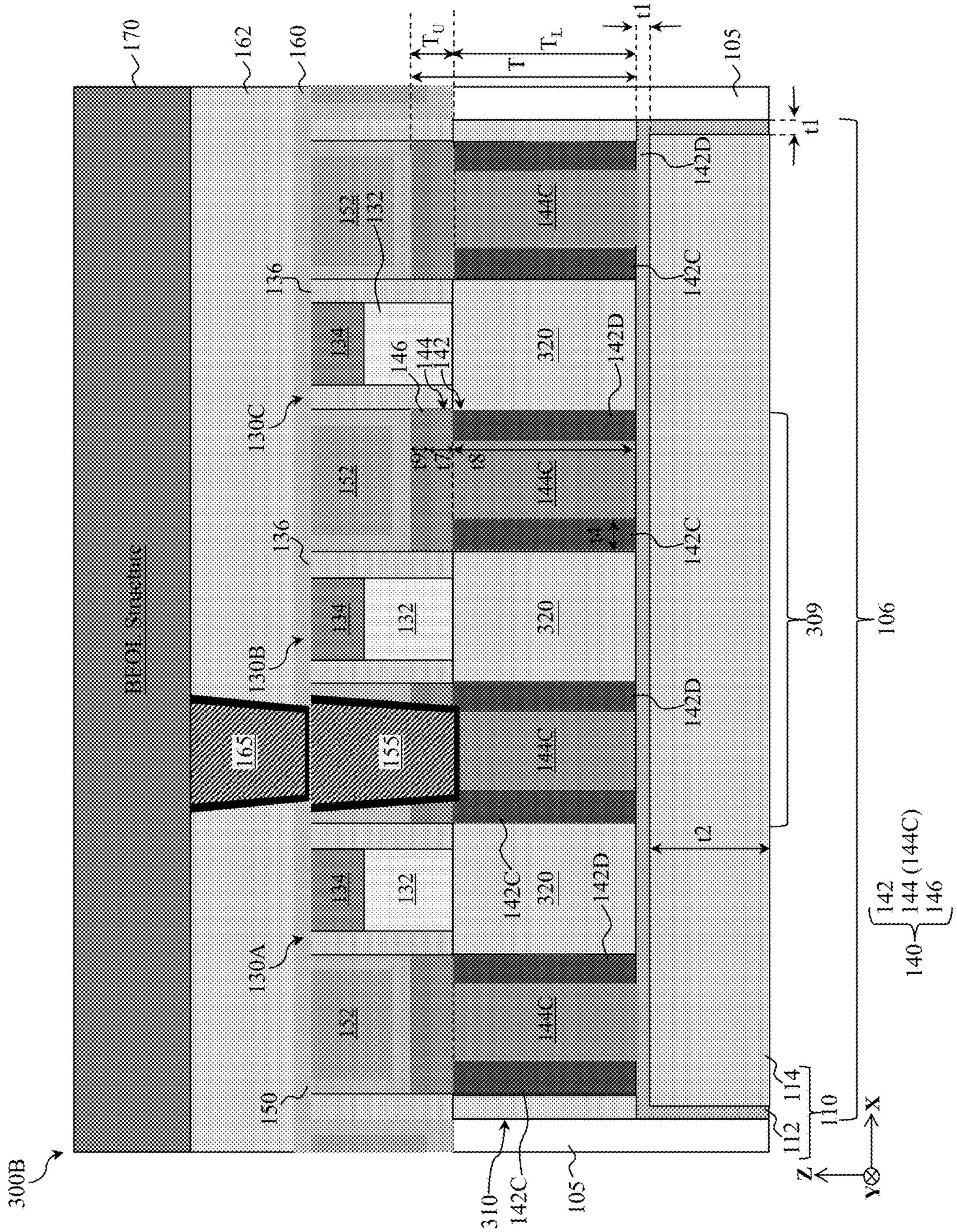

FIG. 3A is a fragmentary cross-sectional view of a multigate device 300A, in portion or entirety, according to various aspects of the present disclosure; and FIG. 3B is a fragmentary cross-sectional view of a multigate device 300B, in portion or entirety, according to various aspects of the present disclosure. For clarity and simplicity, similar features of multigate device 100A in FIG. 1A, multigate device 100B in FIG. 1B, multigate device 300A in FIG. 3A, and multigate device 300B in FIG. 3B are identified by the same reference numerals.

Multigate device 300A and/or multigate device 300B may be included in a microprocessor, a memory, and/or other IC device. In some embodiments, multigate device 300A and/or multigate device 300B is a portion of an IC chip, an SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 3A and FIG. 3B have been simplified for the sake of clarity to better understand the inventive concepts of the present disclosure. Additional features can be added in multigate device 300A and/or multigate device 300B, and some of the features described below can be replaced, modified, or eliminated in other embodiments of multigate device 300A and/or multigate device 300B.

Multigate device 300A and multigate device 300B are similar in many respects to multigate device 100A and multigate device 100B, respectively, except multigate device 300A is configured with one or more p-type FinFETs, such as a p-type FinFET 308, and multigate device 300B is configured with one or more n-type FinFETs, such as an n-type FinFET 309. For example, instead of having semiconductor layers 120A-120C (i.e., suspended channel layers), multigate device 300A and multigate device 300B each include a fin 310 (also referred to as a fin structure) extending lengthwise along the x-direction, where source/drain regions of fin 310 include epitaxial source/drain structures 140 and channel regions of fin 310 include semiconductor layers 320 (also referred to as channel layers 320). Semiconductor layers 320 are disposed between respective epitaxial source/drain structures 140 along the x-direction and between gate structures 130A-130C and dielectric substrate 110 along the z-direction. Semiconductor layers 320 physically contact dielectric substrate 110, such that channel regions of fin 310 are isolated from one another by dielectric substrate 110 (e.g., semiconductor layers 320 are not connected to one another). In some embodiments, semiconductor layers 320 include silicon, silicon germanium, and/or other suitable semiconductor material. In some embodiments, semiconductor layers 320 include more than one semiconductor layer. In some embodiments, semiconductor layers 320 include n-type dopants, p-type dopants, or combinations thereof. In FIG. 3A and FIG. 3B, gate structures 130A-130C are disposed over semiconductor layers 320 and wrap semiconductor layers 320 in the Y-Z plane, such that gate structures 130A-130C are disposed on tops and sidewalls of semiconductor layers 320. Epitaxial source/drain structures 140 of multigate device 300A and multigate device 300B are similar to epitaxial source/drain structures 140 of multigate device 100A and multigate device 100B, respectively. For example, epitaxial source/drain structures 140 of multigate device 300A and multigate device 300B physically contact dielectric substrate 110, instead of a semiconductor substrate. In the depicted embodiments, epitaxial sidewalls 142A-142D extend along and cover an entirety of sidewalls of semiconductor layers 320. In some embodiments, epitaxial sidewalls 142A-142D extend in a discontinuous manner, such that epitaxial sub-layers 144A, epitaxial sub-layers 144B, and/or epitaxial sub-layers 144C may physically contact semiconductor layers 320 and/or epitaxial sidewalls 142A-142D do not physically contact dielectric substrate 110.

Figure 5:
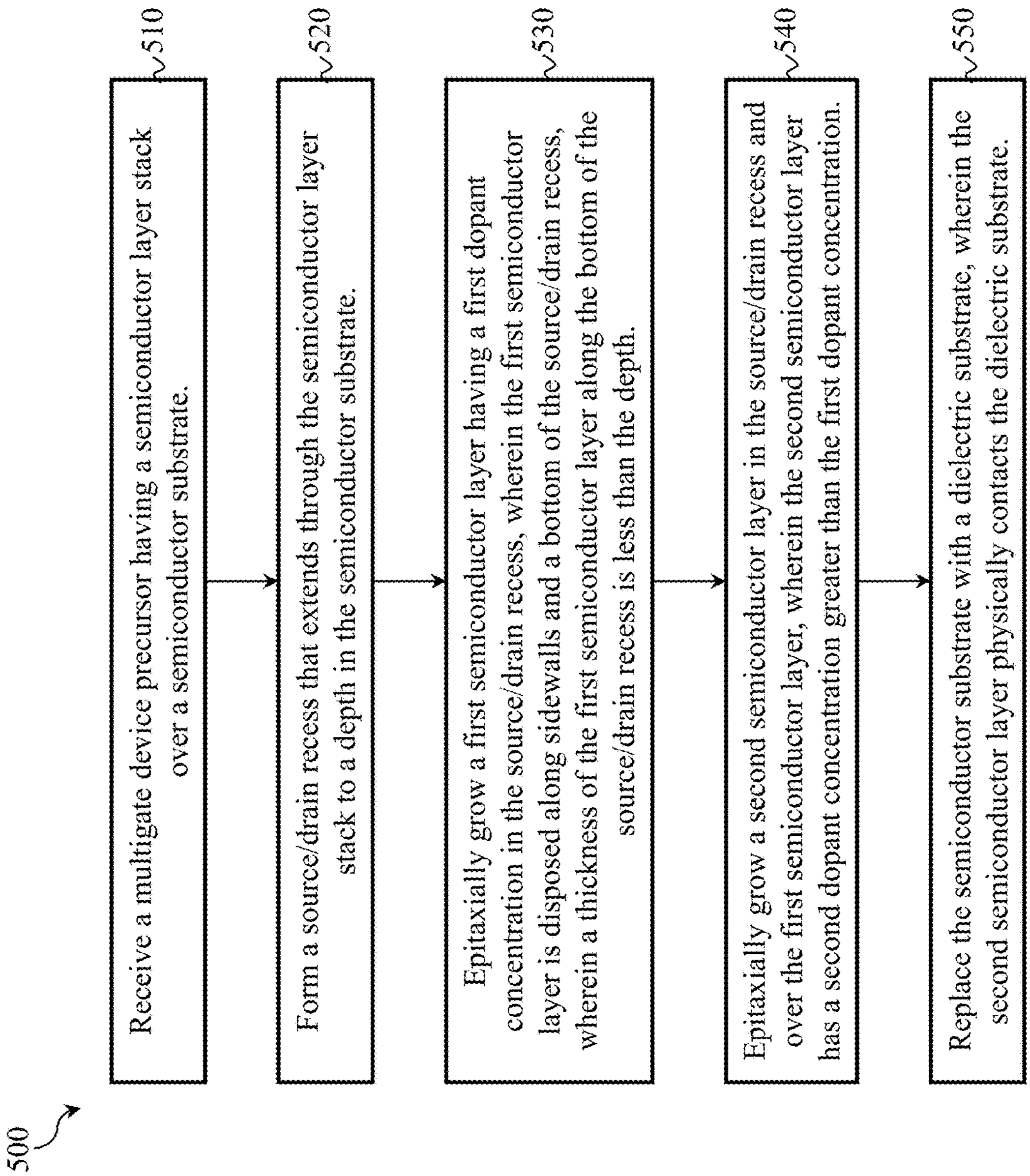
FIG. 5 is a flow chart of a method for fabricating a multigate device according to various aspects of the present disclosure.

FIG. 5 is a flow chart of a method 500 for fabricating a multigate device, such as a p-type multigate transistor and/or an n-type multigate transistor that exhibits enhanced performance according to various aspects of the present disclosure. FIGS. 6A-6M are fragmentary perspective views of a multigate device, in portion or entirety, such as multigate device 100A of FIG. 1A, at various fabrication stages associated with method 500 in FIG. 5 according to various aspects of the present disclosure. For ease of description and understanding, the following discussion of FIG. 5 and FIGS. 6A-6M is directed to fabricating multigate device 100A of FIG. 1A. However, the present disclosure contemplates embodiments where method 500 and processing associated with FIGS. 6A-6M are implemented to fabricate multigate device 100B of FIG. 1B. FIG. 5 and FIGS. 6A-6M have been simplified for the sake of clarity to better understand the inventive concepts of the present disclosure. Additional steps can be provided before, during, and after method 500, and some of the steps described can be moved, replaced, or eliminated for additional embodiments of method 500. Additional features can be added in multigate device 100A, and some of the features described below can be replaced, modified, or eliminated in other embodiments of multigate device 100A.

Figure 6A:
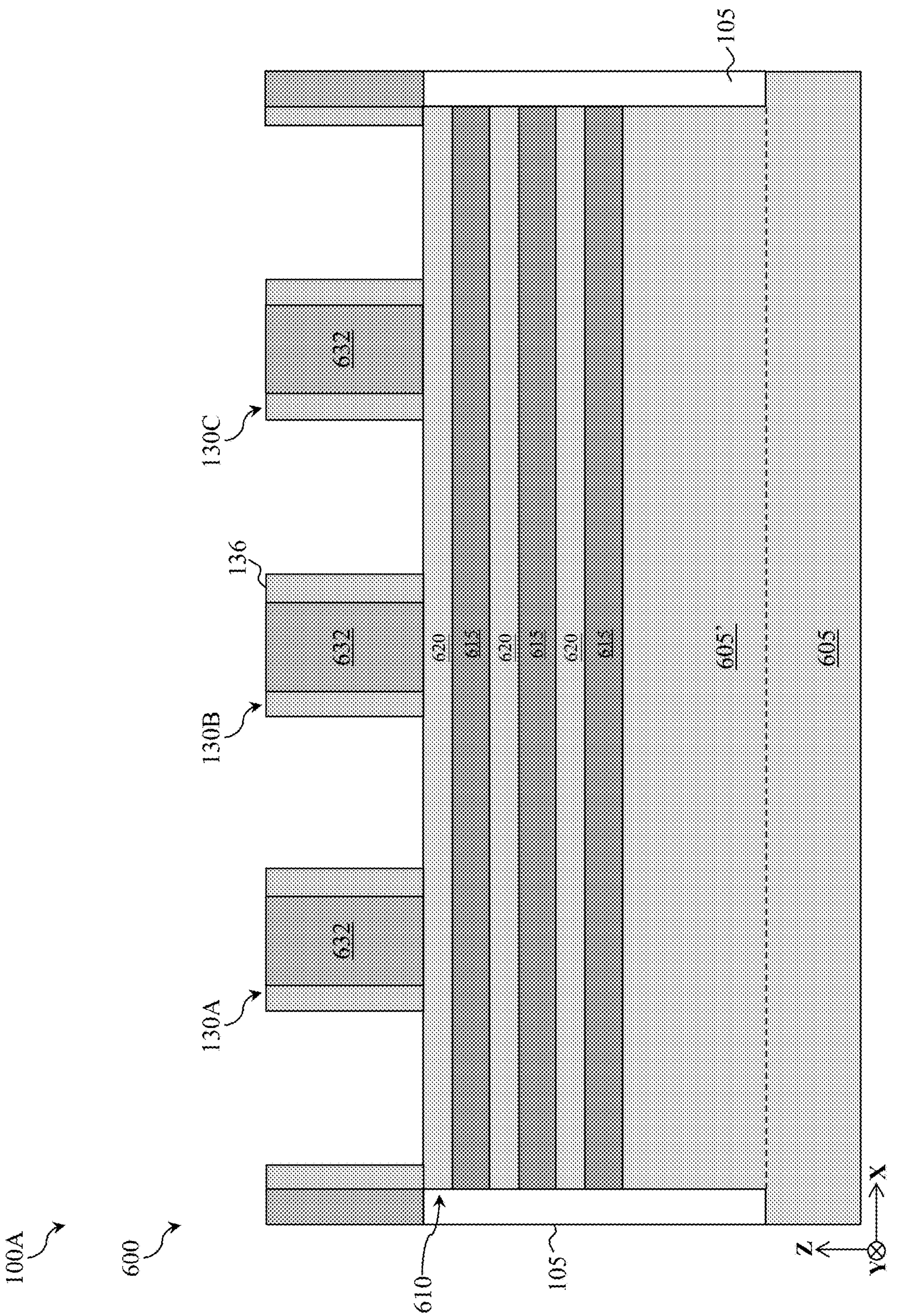
FIGS. 6A-6M are fragmentary perspective views of a multigate device, such as the multigate device depicted in FIG. 1A or FIG. 1B, at various fabrication stages, such as those associated with the method in FIG. 5, according to various aspects of the present disclosure.

Turning to FIG. 5 and FIG. 6A, method 500 begins with receiving a multigate device precursor 600 at block 510. Multigate device precursor 600 includes a semiconductor substrate (wafer) 605, a semiconductor layer stack 610 (having semiconductor layers 615 and semiconductor layers 620 disposed over a substrate portion 605'), gate structures 130A-130C (having gate spacers 136 disposed along sidewalls of dummy gate stacks 632), and isolation features 105.

Semiconductor substrate 605 includes an elementary semiconductor, such as silicon and/or germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In the depicted embodiment, semiconductor substrate 605 includes silicon. Because semiconductor substrate 605 is replaced with dielectric substrate 110, fabrication time and/or fabrication cost of multigate device 100A (and multigate device 100B) can be reduced compared to fabrication time and/or fabrication cost associated with fabricating multigate devices where semiconductor substrate 605 remains. For example, fabricating multigate device 100A omits processing associated with forming n-type doped regions and/or p-type doped regions, such as n-wells and/or p-wells, in semiconductor substrate 605. For example, an n-well (and/or a p-well) is not formed in semiconductor substrate 605 before processing semiconductor substrate 605 to form semiconductor layer stack 610, such that substrate portion 605' of multigate device 100A does not have an n-well (and/or p-well) disposed therein. Lithography, etching, implant, and/or anneal processes typically associated with forming the n-well (and/or the p-well) are thus eliminated from fabrication of multigate device 100A (and multigate device 100B). In such embodiments, semiconductor substrate 605 will not include sheet dislocation defects that typically result from processes (e.g., implantation processes) used to form the n-well (and/or the p-well), and thus, multigate device 100A (and multigate device 100B) will not include such sheet dislocation defects.

Semiconductor layer stack 610 is formed by depositing semiconductor layers 615 and semiconductor layers 620 over semiconductor substrate 605 and patterning semiconductor layers 615, semiconductor layers 620, and semiconductor substrate 605 to form semiconductor layer stack 610 extending from semiconductor substrate 605. Semiconductor layers 615 and semiconductor layers 620 are stacked vertically (e.g., along the z-direction) in an interleaving or alternating configuration from a top surface of semiconductor substrate 605. In some embodiments, the depositing includes epitaxially growing semiconductor layers 615 and semiconductor layers 620 in the depicted interleaving and alternating configuration. For example, a first one of semiconductor layers 615 is epitaxially grown on substrate 605, a first one of semiconductor layers 620 is epitaxially grown on the first one of semiconductor layers 620, a second one of semiconductor layers 615 is epitaxially grown on the first one of semiconductor layers 620, and so on until semiconductor layer stack 610 has a desired number of semiconductor layers 615 and semiconductor layers 620. In such embodiments, semiconductor layers 615 and semiconductor layers 620 can be referred to as epitaxial layers. In some embodiments, epitaxial growth of semiconductor layers 615 and semiconductor layers 620 is achieved by a molecular beam epitaxy (MBE) process, a chemical vapor deposition (CVD) process, a metalorganic (MOCVD) process, other suitable epitaxial growth process, or combinations thereof. A composition of semiconductor layers 615 is different than a composition of semiconductor layers 620 to achieve etching selectivity and/or different oxidation rates during subsequent processing. In FIG. 6A, semiconductor layers 615 and semiconductor layers 620 include different materials, constituent atomic percentages, constituent weight percentages, thicknesses, and/or characteristics to achieve desired etching selectivity during an etching process, such as an etching process implemented to form suspended channel layers in channel regions of a multigate device, such as multigate device 100A. For example, where semiconductor layers 615 include silicon germanium and semiconductor layers 620 include silicon, a silicon etch rate of semiconductor layers 620 is less than a silicon germanium etch rate of semiconductor layers 615. In some embodiments, semiconductor layers 615 and semiconductor layers 620 include the same material but with different constituent atomic percentages to achieve the etching selectivity and/or different oxidation rates. For example, semiconductor layers 615 and semiconductor layers 620 can include silicon germanium, where semiconductor layers 615 have a first silicon atomic percent and/or a first germanium atomic percent and semiconductor layers 620 have a second, different silicon atomic percent and/or a second, different germanium atomic percent. Semiconductor layers 615 and semiconductor layers 620 include any combination of semiconductor materials that provides desired etching selectivity, desired oxidation rate differences, and/or desired performance characteristics (e.g., materials that maximize current flow), including any of the semiconductor materials disclosed herein.

After patterning, semiconductor layer stack 610 includes substrate portion 605' of semiconductor substrate 605 (also referred to as a substrate extension, a substrate fin portion, a fin portion, an etched substrate portion, etc.) and a semiconductor layer stack portion (i.e., a portion of semiconductor layer stack 610 that includes semiconductor layers 615 and semiconductor layers 620) disposed over substrate portion 605'. Semiconductor layer stack 610 extends substantially along the x-direction, having a length defined in the x-direction, a width defined in a y-direction, and a height defined in a z-direction. In some embodiments, a lithography and/or etching process is performed to pattern semiconductor layers 615, semiconductor layers 620, and semiconductor substrate 605 to form semiconductor layer stack 610. The lithography process can include forming a resist layer (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layers 620, semiconductor layers 615, and semiconductor substrate 605 using the patterned resist layer as an etch mask. In some embodiments, the patterned resist layer is formed over a mask layer disposed over semiconductor layer stack 610, a first etching process removes portions of the mask layer to form a patterning layer (i.e., a patterned hard mask layer), and a second etching process removes portions of semiconductor layer stack 610 using the patterning layer as an etch mask. The etching process can include a dry etching process, a wet etching process, other suitable etching process, or combinations thereof. In some embodiments, the etching process is a reactive ion etching (RIE) process. After the etching process, the patterned resist layer is removed, for example, by a resist stripping process or other suitable process. Alternatively, semiconductor layer stack 610 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while forming semiconductor layer stack 610. Further, in some embodiments, the exposure process can implement maskless lithography, electron-beam (e-beam) writing, and/or ion-beam writing for patterning the resist layer. In some embodiments, semiconductor layer stack 610 is formed by a fin fabrication process and semiconductor layer stack 610 can be referred to as a fin, a fin structure, a fin element, an active fin region, etc.

In some embodiments, after patterning, a trench surrounds semiconductor layer stack 610, such that semiconductor layer stack 610 is separated from other active regions of multigate device precursor 600. In such embodiments, isolation features 105 can be formed in the trench by depositing an insulator material (e.g., using a CVD process or a spin-on glass process) over semiconductor substrate 605 that fills the trench and performing a chemical mechanical polishing (CMP) process to remove excessive insulator material and/or planarize top surfaces of isolation features 105. The deposition process may be a flowable CVD (FCVD) process, a high aspect ratio deposition (HARP) process, a high-density plasma CVD (HDPCVD) process, other suitable deposition process, or combinations thereof. In some embodiments, the CMP process removes insulator material over top surfaces of semiconductor layer stack 610. In some embodiments, the insulator material is etched back, such that a portion of semiconductor layer stack 610 extends from isolation features 105 (i.e., a top surface of semiconductor layer stack 610 is higher than top surfaces of isolation features 105). In some embodiments, isolation features 105 have a multi-layer structure, such as an oxide layer disposed over a silicon nitride liner. In some embodiments, isolation features 105 include a dielectric layer disposed over a doped liner (including, for example, boron silicate glass (BSG) or phosphosilicate glass (PSG)). In some embodiments, isolation features 105 include a bulk dielectric layer disposed over a dielectric liner. Isolation features 105 include silicon oxide, silicon nitride, silicon oxynitride, other suitable isolation material (for example, including silicon, oxygen, nitrogen, carbon, or other suitable isolation constituent), or combinations thereof. Isolation features 105 can be configured as shallow trench isolation (STI) structures, deep trench isolation (DTI) structures, local oxidation of silicon (LOCOS) structures, and/or other suitable isolation structures.

Gate structures 130A-130C, each of which includes a respective dummy gate stack 632 and respective gate spacers 136, are formed over channel regions of semiconductor layer stack 610. Dummy gate stacks 632 extend lengthwise in a direction that is different than (e.g., orthogonal to) the lengthwise direction of semiconductor layer stack 610. For example, dummy gate stacks 632 extend substantially parallel to one another along the y-direction, having a length defined in the y-direction, a width defined in the x-direction, and a height defined in the z-direction. Dummy gate stacks 632 are disposed over channel regions of semiconductor layer stack 610, such that dummy gate stacks 632 are disposed between source/drain of semiconductor layer stack 610. In the X-Z plane, dummy gate stacks 632 are disposed on a top surface of semiconductor layer stack 610. In the Y-Z plane, dummy gate stacks 632 may be disposed over the top surface and sidewall surfaces of semiconductor layer stack 610, such that dummy gate stacks 632 wrap semiconductor layer stack 610. Each dummy gate stack 632 can include a dummy gate dielectric, a dummy gate electrode, and a hard mask. The dummy gate dielectric includes a dielectric material, such as silicon oxide, a high-k dielectric material, other suitable dielectric material, or combinations thereof. In some embodiments, the dummy gate dielectric includes an interfacial layer (including, for example, silicon oxide) and a high-k dielectric layer disposed over the interfacial layer. The dummy gate electrode includes a suitable dummy gate material, such as polysilicon, and the hard mask includes any suitable hard mask material. In some embodiments, dummy gate stacks 632 include numerous other layers, for example, capping layers, interface layers, diffusion layers, barrier layers, or combinations thereof. Dummy gate stacks 632 are formed by deposition processes, lithography processes, etching processes, other suitable processes, or combinations thereof. For example, a first deposition process is performed to form a dummy gate dielectric layer over multigate device precursor 600, a second deposition process is performed to form a dummy gate electrode layer over the dummy gate dielectric layer, and a third deposition process is performed to form a hard mask layer over the dummy gate electrode layer. The deposition processes include CVD, physical vapor deposition (PVD), atomic layer deposition (ALD), MOCVD, remote plasma CVD (RPCVD), plasma enhanced CVD (PECVD), HDPCVD, FCVD, HARP, low-pressure CVD (LPCVD), atomic layer CVD (ALCVD), atmospheric pressure CVD (APCVD), sub-atmospheric CVD (SACVD), other suitable deposition processes, or combinations thereof. A lithography patterning and etching process is then performed to pattern the hard mask layer, the dummy gate electrode layer, and the dummy gate dielectric layer to form dummy gate stacks 632, which include the dummy gate dielectric, the dummy gate electrode, and the hard mask. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching processes, or combinations thereof.

Gate spacers 136 are formed adjacent to (i.e., along sidewalls of) dummy gate stacks 632. Gate spacers 136 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, a dielectric layer including silicon and nitrogen, such as a silicon nitride layer, can be deposited over multigate device precursor 600 and etched (e.g., anisotropically etched) to form gate spacers 136. In some embodiments, gate spacers 136 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stacks 632. In such embodiments, the various sets of spacers can include materials having different etch rates. For example, a first dielectric layer including silicon and oxygen (for example, silicon oxide) can be deposited and etched to form a first spacer set adjacent to dummy gate stacks 632, and a second dielectric layer including silicon and nitrogen (for example, silicon nitride) can be deposited and etched to form a second spacer set adjacent to the first spacer set. Implantation, diffusion, and/or annealing processes may be performed to form lightly doped source and drain (LDD) features and/or heavily doped source and drain (HDD) features in source/drain regions of semiconductor layer stack 610 before and/or after forming gate spacers 136, depending on design requirements of multigate device 100A.

Figure 6B:
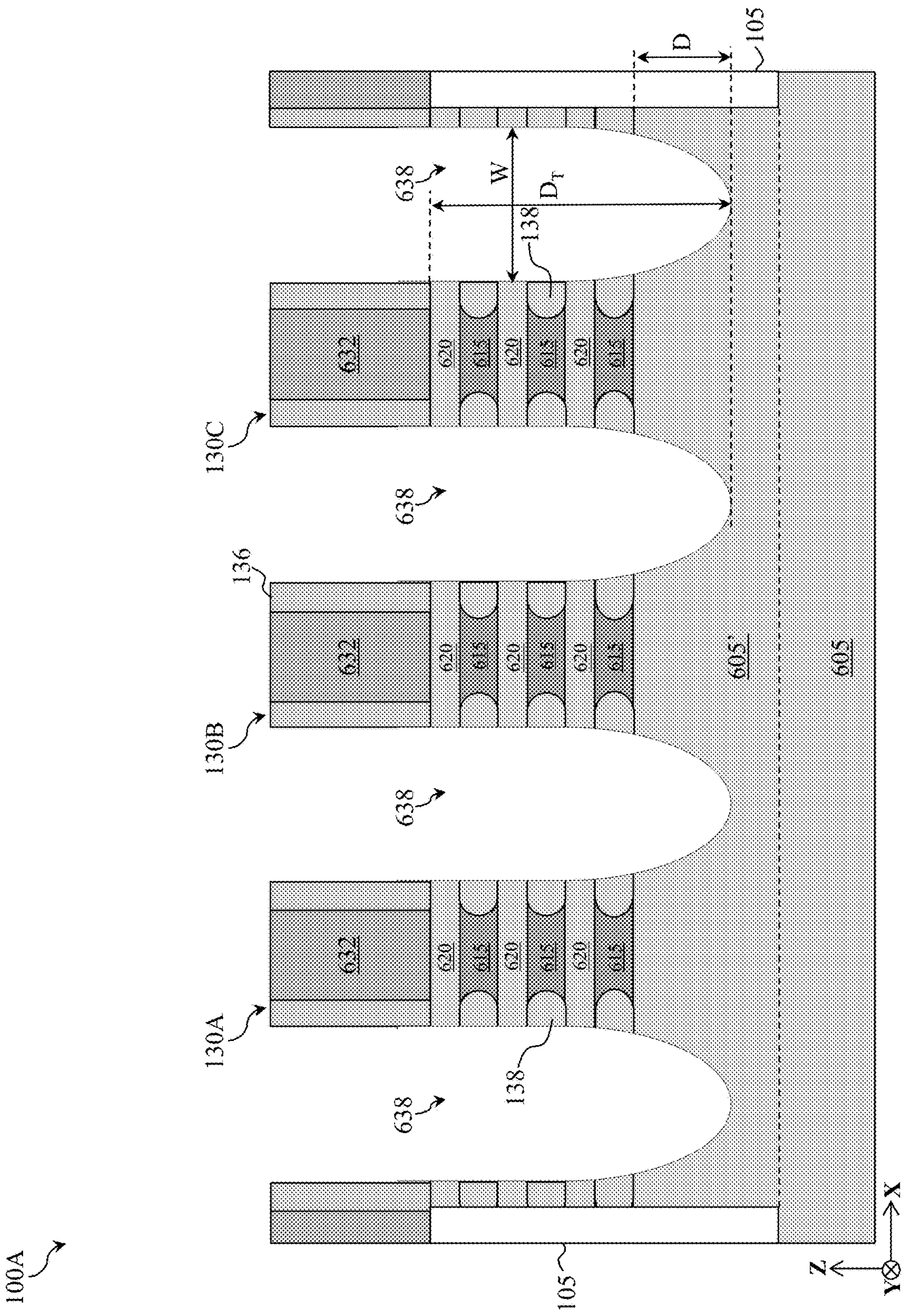

Turning to FIG. 5 and FIG. 6B, method 500 proceeds to block 520 with forming source/drain recesses (trenches) 638 in semiconductor layer stack 610, where source/drain recesses 638 extend through semiconductor layer stack 610 to a depth in semiconductor substrate 605 (e.g., a depth in substrate portion 605'). For example, exposed portions of semiconductor layer stack 610 (i.e., source/drain regions of semiconductor layer stack 610 that are not covered by gate structures 130A-130C) are removed to form source/drain recesses 638. In FIG. 6B, an etching process completely removes semiconductor layers 615 and semiconductor layers 620 in source/drain regions of semiconductor layer stack 610 and some, but not all, of substrate portion 605' in source/drain regions of semiconductor layer stack 610, such that source/drain recesses 638 extend below a topmost surface of substrate portion 605'. Source/drain trenches 638 thus have sidewalls formed by remaining portions (e.g., channel regions) of semiconductor layer stack 610 under gate structures 130A-130C and bottoms formed by substrate portion 605'. Source/drain recesses 638 have a width W, a total depth $D_T$ between a top surface of semiconductor layer stack 610 and a bottom of source/drain recesses 638, and a depth D into substrate portion 605' between topmost surface of substrate portion 605' and bottom of source/drain recesses 638. Depth D is greater than a minimum depth needed to ensure that epitaxial layers of subsequently formed epitaxial source/drain structures 140 extend into semiconductor substrate 605 (here, into substrate portion 605' and below a topmost surface of semiconductor substrate 605 (e.g., topmost surface of substrate portion 605')). For example, depth D is at least 20 nm. In some embodiments, depth D is about 20 nm to about 30 nm. In some embodiments, total depth $D_T$ is about 53 nm to about 87 nm. In some embodiments, the etching process removes all of substrate portion 605' in source/drain regions of semiconductor layer stack 610, such that source/drain recesses 638 extend to or below bottom surfaces of isolation features 105. The etching process can include a dry etching process, a wet etching process, other suitable etching process, or combinations thereof. In some embodiments, the etching process is a multi-step etch process. For example, the etching process may alternate etchants to separately and alternately remove semiconductor layers 615 and semiconductor layers 620. In some embodiments, parameters of the etching process are configured to selectively etch semiconductor layer stack 610 with minimal (to no) etching of gate structures 130A-130C (i.e., dummy gate stacks 632 and gate spacers 136) and/or isolation features 105. In some embodiments, a lithography process, such as those described herein, is performed to form a patterned mask layer that covers gate structures 130A-130C and/or isolation features 105, and the etching process uses the patterned mask layer as an etch mask.

After forming source/drain recesses 638, inner spacers 138 are formed under gate structures 130A-130C between semiconductor layers 620 and along sidewalls of semiconductor layers 615. Inner spacers 138 separate semiconductor layers 620 from one another and bottommost semiconductor layers 620 from substrate portion 605'. Inner spacers 138 include a dielectric material that includes silicon, oxygen, carbon, nitrogen, other suitable material, or combinations thereof (e.g., silicon oxide, silicon nitride, silicon oxynitride, silicon carbide, or silicon oxycarbonitride). In some embodiments, inner spacers 138 include a low-k dielectric material, such as those described herein. In some embodiments, dopants (e.g., p-type dopants, n-type dopants, or combinations thereof) are introduced into the dielectric material, such that inner spacers 138 include a doped dielectric material. Inner spacers 138 are formed by any suitable process. In some embodiments, a first etching process is performed that selectively etches semiconductor layers 615 exposed by source/drain recesses 638 with minimal (to no) etching of semiconductor layers 620, substrate portion 605', isolation features 105, and gate structures 130A-130C, such that gaps are formed between semiconductor layers 620 and between substrate portion 605' and semiconductor layers 620. The gaps are disposed under gate spacers 136, such that semiconductor layers 620 are suspended under gate spacers 136 and separated from one another by the gaps. In some embodiments, the gaps extend at least partially under dummy gate stacks 632. The first etching process is configured to laterally etch (e.g., along the x-direction and/or the y-direction) semiconductor layers 615. In the depicted embodiment, the first etching process reduces a length of semiconductor layers 615 along the x-direction. The first etching process is a dry etching process, a wet etching process, other suitable etching process, or combinations thereof. A deposition process then forms a spacer layer over gate structures 130A-130C and over features forming source/drain recesses 638, such as CVD, PVD, ALD, RPCVD, PECVD, HDPCVD, FCVD, HARP, LPCVD, ALCVD, APCVD, SACVD, MOCVD, plating, other suitable methods, or combinations thereof. The spacer layer partially (and, in some embodiments, completely) fills source/drain recesses 638. The deposition process is configured to ensure that the spacer layer at least partially fills the gaps. A second etching process is then performed that selectively etches the spacer layer to form inner spacers 138, which fill the gaps as depicted in FIG. 6B, with minimal (to no) etching of semiconductor layers 620, substrate portion 605', isolation features 105, and gate structures 130A-130C. The spacer layer (and thus inner spacers 138) includes a material that is different than a material of semiconductor layers 620 and fin portions 605', a material of isolation features 105, and/or materials of gate structures 130A-130C to achieve desired etching selectivity during the second etching process.

Figure 6C:
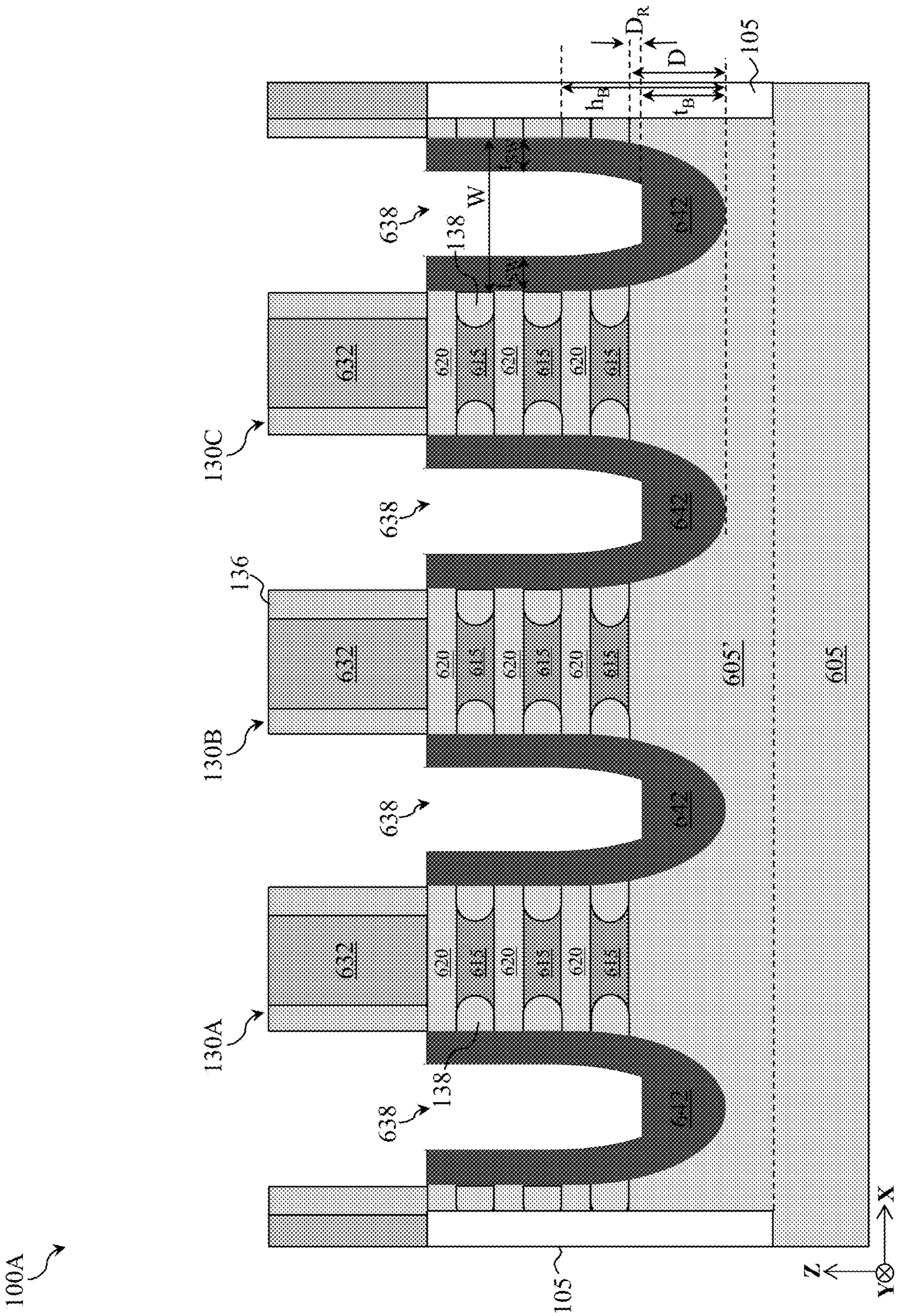
Figure 6D:
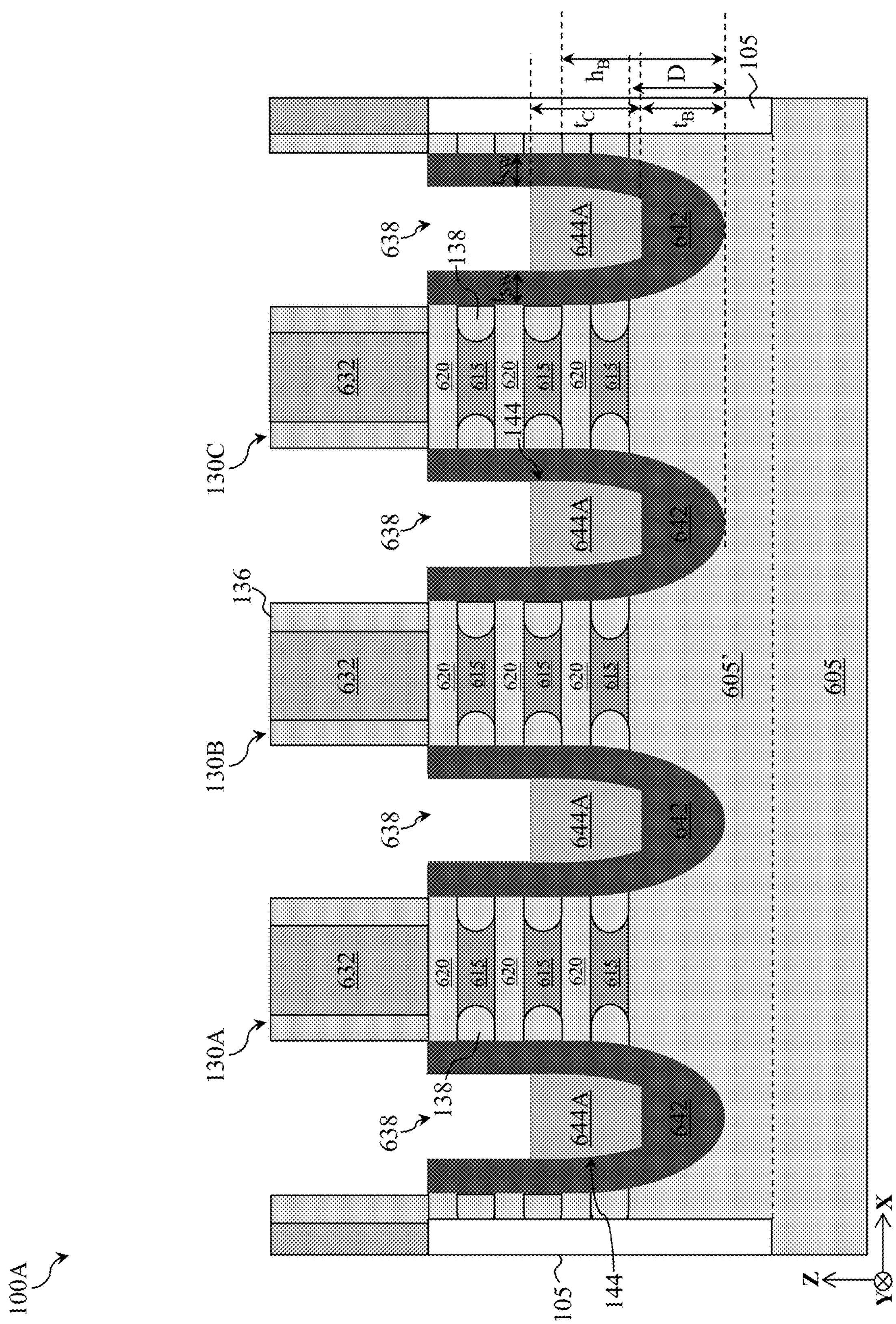
Figure 6E:
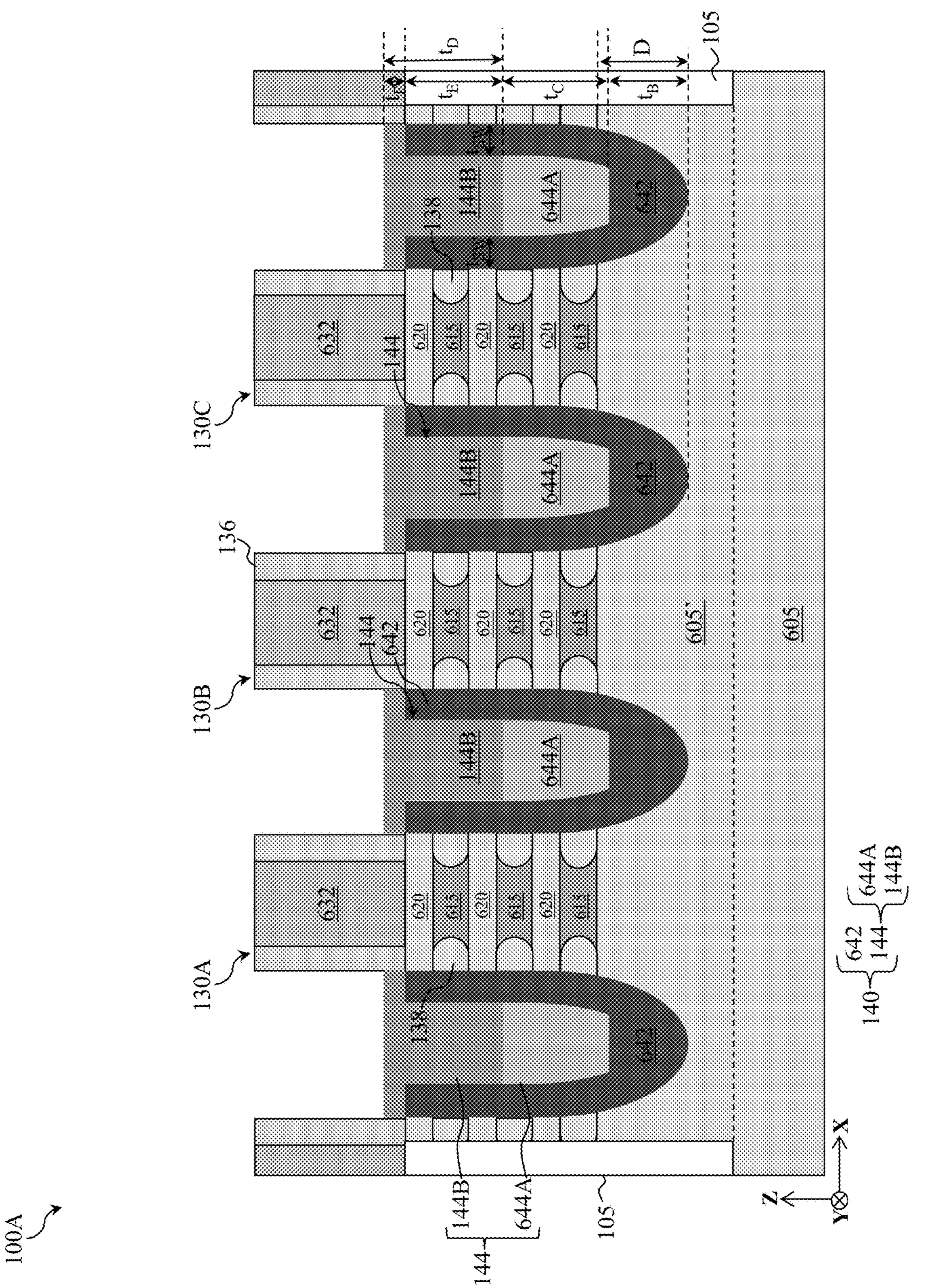
Figure 6F:
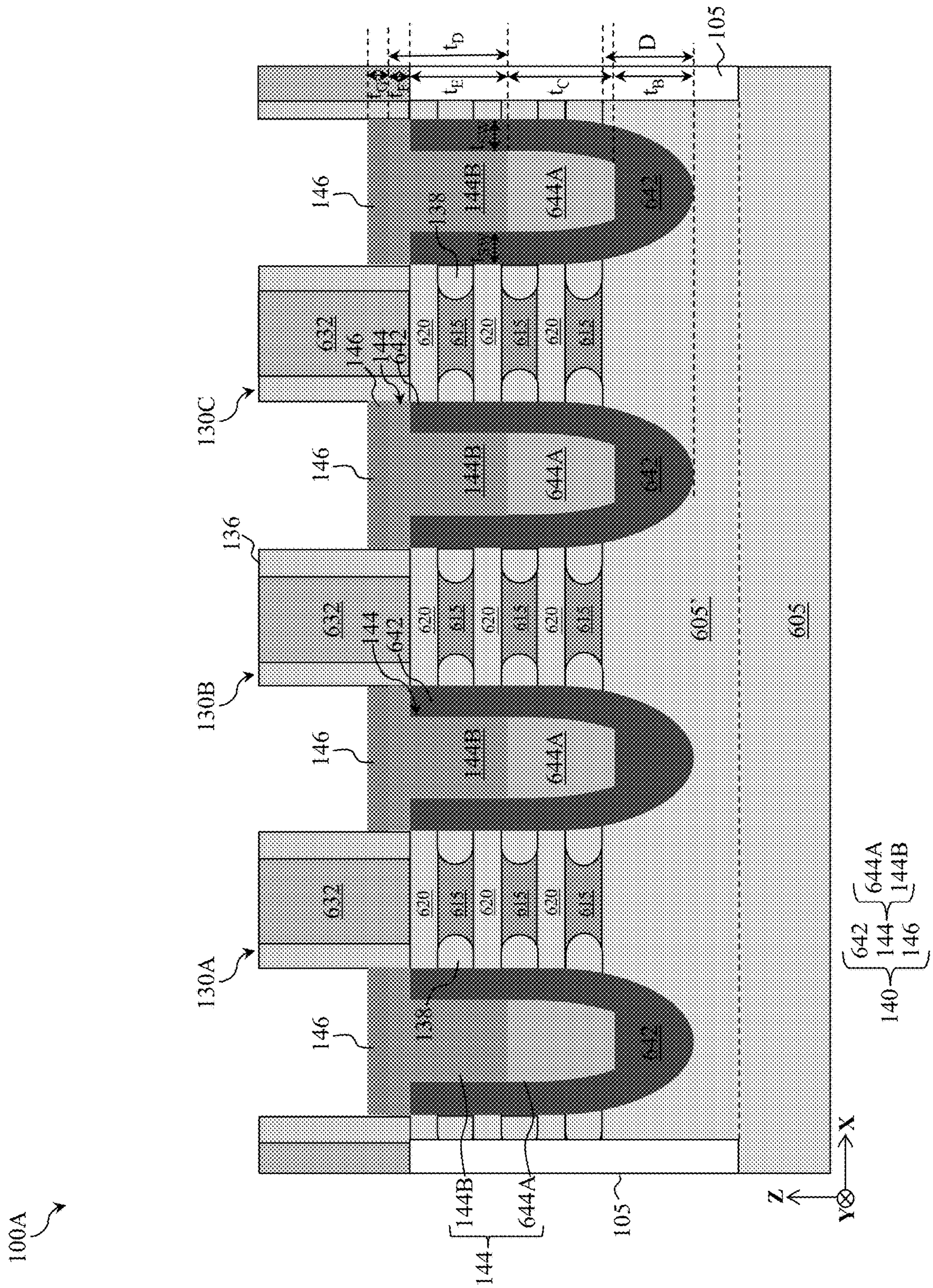

Turning to FIG. 5 and FIGS. 6C-6F, method 500 proceeds with forming an epitaxial source/drain structure in the source/drain recess, such as epitaxial source/drain structures 140. For example, method 500 includes epitaxially growing a first semiconductor layer in a source/drain recess at block 530, such as epitaxial layers 642 in source/drain recesses 638 (FIG. 6C), and epitaxially growing a second semiconductor layer over the first semiconductor layer in the source/drain recess at block 540, such as epitaxial layers 144 (including epitaxial sub-layers 644A and epitaxial sub-layers 144B) over epitaxial layers 642 in source/drain recesses 638 (FIG. 6D and FIG. 6E). The first semiconductor layer, such as epitaxial layers 642, has a first dopant concentration, and the second semiconductor layer, such as epitaxial layers 144, has a second dopant concentration that is greater than the first dopant concentration. Method 500 can further include epitaxially growing a third semiconductor layer over the second semiconductor layer, such as epitaxial layers 146 over epitaxial layers 144 (FIG. 6F). Epitaxial layers 642 can grow from semiconductor layers 620 and substrate portion 605', epitaxial sub-layers 644A can grow from epitaxial layers 642, epitaxial sub-layers 144B can grow from epitaxial sub-layers 644A and/or epitaxial layers 642, and epitaxial layers 146 can grow from epitaxial sub-layers 144B. Epitaxial layers 642, epitaxial sub-layers 644A, epitaxial sub-layers 144B, and/or epitaxial layers 146 can be formed by epitaxy processes that implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy processes can use gaseous and/or liquid precursors that interact with the composition of semiconductor layers 620, substrate portion 605', epitaxial layers 642, epitaxial sub-layers 644A, and/or epitaxial sub-layers 144B. In some embodiments, epitaxial layers 642, epitaxial sub-layers 644A, epitaxial sub-layers 144B, and/or epitaxial layers 146 are doped during deposition by adding dopants to a source material of the epitaxy process. In some embodiments, epitaxial layers 642, epitaxial sub-layers 644A, epitaxial sub-layers 144B, and/or epitaxial layers 146 are doped by an ion implantation process after a deposition process. In some embodiments, annealing processes are performed to activate dopants in epitaxial layers 642, epitaxial sub-layers 644A, epitaxial sub-layers 144B, and/or epitaxial layers 146, and/or other source/drain regions of multigate device 100A, such as HDD regions and/or LDD regions.

Epitaxial growth of epitaxial layers 642, epitaxial sub-layers 644A, epitaxial sub-layers 144B, and/or epitaxial layers 146 is controlled (tuned) to enhance performance of multigate device 100A (and multigate device 100B). In some embodiments, epitaxial growth of the various layers of epitaxial source/drain structures 140 is controlled to maximize strain imparted to channel regions of multigate device 100A (here, semiconductor layers 620) by epitaxial source/drain structures 140. In some embodiments, maximizing a volume of epitaxial layers 144 (i.e., epitaxial sub-layers 644A and epitaxial sub-layers 144B) in epitaxial source/drain structures 140 increases strain imparted to channel regions of multigate device 100A. In some embodiments, epitaxial growth of the various layers of epitaxial source/drain structures 140 is controlled to maximize a depth of epitaxial layers 144 (i.e., epitaxial sub-layers 644A and epitaxial sub-layers 144B) in epitaxial source/drain structures 140, such that current flowing between epitaxial source/drain structures 140 and channel regions of multigate device 100A is flowing between epitaxial layers 144 (having greater dopant concentrations than epitaxial layers 642) and more channel regions of multigate device 100A, thereby improving operation of multigate device 100A. In some embodiments, epitaxial layers 144 extend at least to a depth of bottommost channel of multigate device 100A, such as bottommost semiconductor layers 620. In some embodiments, maximizing a volume of epitaxial layers 144 in epitaxial source/drain structures 140 has been observed to reduce overall epi sheet resistance, thereby improving operation of multigate device 100A. Different embodiments may have different advantages, and no particular advantage is necessarily required of any embodiment.

In FIG. 6C, epitaxial layers 642 are formed along sidewalls and bottoms of source/drain recesses 638 and partially fill source/drain recesses 638. Epitaxial layers 642 physically contact substrate portion 605', semiconductor layers 620, and inner spacers 138. Epitaxial layers 642 have a bottom thickness $t_B$ and a sidewall thickness $t_{SW}$. In the depicted embodiment, bottom thickness $t_b$ is less than depth D (i.e., bottom thickness $t_b$<depth D), such that a remaining depth $D_R$ of source/drain recesses 638 below top surface of substrate portion 605' is greater than zero (i.e., remaining depth $D_R$>0), and a sum of sidewall thicknesses of epitaxial layers 642 is less than width W of source/drain recesses 638 (i.e., sidewall thickness $t_{SW}$+sidewall thickness $t_{SW}$<width W). In some embodiments, bottom thickness $t_B$ is about 12 nm to about 28 nm. In some embodiments, sidewall thickness $t_{SW}$ is about 3 nm to about 7 nm. Bottom thickness $t_B$ and sidewall thickness $t_{SW}$ are controlled to maximize a volume of subsequently formed epitaxial layers 144 (i.e., epitaxial sub-layers 644A and epitaxial sub-layers 144B) in epitaxial source/drain structures 140. If bottom thickness $t_B$ and/or sidewall thickness $t_{SW}$ are too thick (e.g., greater than about 28 nm and/or greater than about 7 nm, respectively), a volume of subsequently formed epitaxial layers 144 in epitaxial source/drain structures 140 may be too small and provide insufficient strain to channel regions of multigate device 100A. If bottom thickness $t_B$ and/or sidewall thickness $t_{SW}$ are too thin (e.g., less than about 12 nm and/or less than about 3 nm, respectively), epitaxial layers 642 may provide an insufficient growth surfaces from which to form epitaxial layers 144. In some embodiments, a ratio of sidewall thickness $t_{SW}$ and bottom thickness $t_B$ is about 1:4 to enhance strain characteristics of epitaxial source/drain structures 140, for example, by maximizing a volume of subsequently formed epitaxial layers 144 in epitaxial source/drain structure 140. In some embodiments, such as where multigate device 100B (i.e., an n-type transistor) is fabricated by method 500, a ratio of sidewall thickness $t_{SW}$ and bottom thickness $t_B$ is about 1:3 to enhance strain characteristics of epitaxial source/drain structures 140, for example, by maximizing a volume of subsequently formed epitaxial layers 144 in epitaxial source/drain structure 140. In some embodiments, bottom thickness $t_B$ and sidewall thickness $t_{SW}$ are controlled to ensure that remaining source/drain recesses 638 extend at least to bottommost semiconductor layers 620. In such embodiments, bottom thickness $t_B$ is less than a height $h_B$ of a top surface of bottommost semiconductor layers 620 and a sum of sidewall thicknesses of epitaxial layers 642 is less than width W of source/drain recesses 638, such that source/drain recesses 638 still extend to bottommost semiconductor layers 620 after forming epitaxial layers 642 and subsequently formed epitaxial layers 144 will extend at least to a depth of bottommost semiconductor layers 620 in multigate device 100A. In some embodiments, bottom thickness $t_B$ is about equal to a height of a bottom surface of bottommost semiconductor layers 620. In some embodiments, bottom thickness $t_B$ is less than the height of bottom surface of bottommost semiconductor layers 620. In some embodiments, bottom thickness $t_B$ is less than height $h_B$ and greater than the height of bottom surface of bottommost semiconductor layers 620.

Epitaxial layers 642 include silicon, germanium, silicon germanium, other suitable semiconductor material, or combinations thereof. In the depicted embodiment, where multigate device 100A is a p-type transistor, epitaxial layers 642 include p-doped silicon germanium and the p-type dopant is boron, indium, other suitable p-type dopant, or combinations thereof. In some embodiments, epitaxial layers 642 have a germanium concentration of about 15 at % to about 30 at %. In some embodiments, epitaxial layers 642 have a boron dopant concentration of about $1\times10^{20}$ $cm^{-3}$ to about $5\times10^{20}$ $cm^{3}$. Epitaxial layers 642 have any suitable germanium concentration profile and any suitable dopant profile, such as any suitable boron dopant profile. In some embodiments, epitaxial layers 642 have a substantially uniform (constant) germanium profile and/or substantially uniform boron dopant profile along sidewall thickness $t_{SW}$, such as a germanium concentration and/or a boron concentration that is substantially the same from inner sidewalls of epitaxial layers 642 that interface with semiconductor layers 620 and inner spacers 638 to outer sidewalls of epitaxial layers 642 (which form sidewalls of remaining source/drain recesses 638). In some embodiments, epitaxial layers 642 have a gradient germanium profile and/or a gradient boron profile along sidewall thickness $t_{SW}$, such as a germanium concentration and/or a boron concentration that increases or decreases from the inner sidewalls to the outer sidewalls (e.g., from about 15 at % to about 30 at % or vice versa and/or from about $1\times10^{20}$ $cm^{-3}$ to about $5\times10^{20}$ $cm^{-3}$ or vice versa, respectively). In some embodiments, epitaxial layers 642 have a substantially uniform germanium profile and/or a substantially uniform boron profile along depth $D_T$, such as a germanium concentration and/or a boron concentration that is substantially the same from a bottom portion of epitaxial layers 642 that interfaces with substrate portion 605' to a top portion of epitaxial layers 642 that interfaces with top semiconductor layers 620. In some embodiments, epitaxial layers 642 have a gradient germanium profile and/or a gradient boron concentration along depth $D_T$, such as a germanium concentration and/or a boron concentration that increases or decreases from the bottom portion to the top portion (e.g., from about 15 at % to about 30 at % or vice versa and/or from about $1\times10^{20}$ $cm^{-3}$ to about $5\times10^{20}$ $cm^{-3}$ or vice versa, respectively). In some embodiments, the epitaxial layers 642 have a banded germanium concentration profile and/or a banded boron concentration profile along sidewall thickness $t_{SW}$ and/or depth $D_T$, where epitaxial layers 642 have distinct bands (or layers) of germanium concentrations and/or boron concentrations and the germanium concentrations and/or the boron concentrations increase, decrease, alternate, and/or are different along sidewall thickness $t_{SW}$ and/or depth $D_T$. In some embodiments, the epitaxial layers 642 have a step germanium concentration profile, a step boron concentration profile, other suitable germanium concentration profile, and/or other suitable boron concentration profile. In some embodiments, epitaxial layers 642 can function as buffer layers between semiconductor layers 620 (which become channel layers of multigate device 100A) and epitaxial layers 144, which have different lattice constants and/or different lattice structures.

In FIG. 6D, and FIG. 6E, epitaxial layers 144 are formed over epitaxial layers 642, where epitaxial layers 144 include epitaxial sub-layers 644A and epitaxial sub-layers 144B. For example, epitaxial sub-layers 644A are formed over epitaxial layers 642 to partially fill source/drain recesses 638 (FIG. 6D), and epitaxial sub-layers 144B are formed over epitaxial layers 644A and epitaxial layers 642 to fill remainders of source/drain recesses 638. Epitaxial sub-layers 644A have bottoms and sidewalls that physically contact epitaxial layers 642, such that epitaxial layers 642 wrap epitaxial sub-layers 644A. Epitaxial sub-layers 644A have a thickness $t_C$, which in some embodiments, is greater than height $h_B$. In some embodiments, thickness $t_C$ is about 22 nm to about 38 nm. Epitaxial sub-layers 144B have lower portions disposed below top surfaces of top semiconductor layers 620 and upper portions disposed above top surfaces of top semiconductor layers 620. The lower portions of epitaxial sub-layers 144B fill remainders of source/drain recesses 638 and have sidewalls that physically contact epitaxial layers 642 and bottoms that physically contact epitaxial sub-layers 644A. The upper portions of epitaxial sub-layers 144B have sidewalls that physically contact gate spacers 136 of adjacent gate structures 130A-130C and bottoms that physically contact epitaxial layers 642. Epitaxial sub-layers 144B have a thickness $t_D$, where the lower portions of epitaxial sub-layers 144B have a thickness $t_E$ and the upper portions of epitaxial sub-layers 144B have a thickness $t_F$ In some embodiments, thickness $t_D$ is about 17 nm to about 33 nm. In some embodiments, thickness $t_D$ is greater than thickness $t_C$ to maximize a volume of a heaviest doped portion of epitaxial source/drain structures 140. In some embodiments, thickness $t_E$ is about 12 nm to about 28 nm, and thickness $t_F$ is about 3 nm to about 7 nm. It is noted that, to ensure that epitaxial sub-layers 644A extend below top surface of substrate portion 605', depth D is at least 20 nm and bottom thickness $t_B$ of epitaxial layers 642 is less than depth D.

Epitaxial sub-layers 644A and epitaxial sub-layers 144B include the same semiconductor material but with different constituent concentrations. The semiconductor material can include silicon, germanium, silicon germanium, other suitable semiconductor material, or combinations thereof. In the depicted embodiment, where multigate device 100A is a p-type transistor, epitaxial sub-layers 644A and epitaxial sub-layers 144B include p-doped silicon germanium but with different germanium concentrations. For example, a germanium concentration of epitaxial sub-layers 144B is greater than a germanium concentration of epitaxial sub-layers 644A. A germanium concentration of epitaxial sub-layers 144B is also greater than a germanium concentration of epitaxial layers 642. In some embodiments, epitaxial sub-layers 644A have a germanium concentration of about 15 at % to about 65 at %, and epitaxial sub-layers 144B have a germanium concentration of about 50 at % to about 65 at %. The p-type dopant concentration of epitaxial layers 144 (and thus epitaxial sub-layers 644A and epitaxial sub-layers 144B) is greater than the p-type dopant concentration of epitaxial layers 642. The p-type dopant concentration of epitaxial sub-layers 644A is the same as, greater than, or less than the p-type dopant concentration of epitaxial sub-layers 144B depending on design requirements of multigate device 100A. In some embodiments, epitaxial sub-layers 644A and epitaxial sub-layers 144B have a boron dopant concentration of about $5\times10^{20}$ $cm^{-3}$ to about $1.5\times10^{21}$ $cm^{-3}$. Epitaxial sub-layers 644A have a gradient germanium profile along thickness $t_C$, such as a germanium concentration that increases or decreases from bottom (e.g., where epitaxial sub-layers 644A interface with epitaxial layers 642) to top (e.g., where epitaxial sub-layers 644A interface with epitaxial sub-layers 144B). In the depicted embodiment, the germanium concentration increases from bottom to top, for example, from about 15 at % to about 65 at %. In some embodiments, the graded germanium profile is configured in bands of different germanium concentrations that increase or decrease along thickness $t_C$. In some embodiments, epitaxial sub-layers 644A can function as buffer layers between epitaxial layers 642 and epitaxial sub-layers 144B, which have different lattice constants and/or different lattice structures. In such embodiments, a lattice constant and/or a lattice structure of epitaxial sub-layers 644A can gradually change from a lattice constant and/or a lattice structure similar to that of epitaxial layers 642 to a lattice constant and/or a lattice structure similar to that of epitaxial sub-layers 144B. Epitaxial sub-layers 644A have any suitable dopant profile along thickness $t_C$, such as a substantially uniform boron dopant profile, a gradient boron dopant profile, a banded boron dopant profile, a stair boron dopant profile, and/or other suitable boron dopant profile. Epitaxial sub-layers 144B have any suitable germanium concentration profile and any suitable dopant profile, such as any suitable boron dopant profile. In some embodiments, epitaxial sub-layers 144B have a substantially uniform germanium profile and/or substantially uniform boron dopant profile along thickness $t_D$, such as a germanium concentration and/or a boron concentration that is substantially the same from bottom (e.g., where epitaxial sub-layers 144B interface with epitaxial sub-layers 644A) to top (e.g., top surfaces of epitaxial sub-layers 144B). In some embodiments, epitaxial sub-layers 144B have a gradient germanium profile and/or a gradient boron profile along thickness $t_D$, such as a germanium concentration and/or a boron concentration that increases or decreases from bottom to top (e.g., from about 50 at % to about 65 at % or vice versa and/or from $5\times10^{20}$ $cm^{-3}$ to about $1.5\times10^{21}$ $cm^{-3}$ or vice versa, respectively). In some embodiments, epitaxial sub-layers 144B have a banded germanium concentration profile, a banded boron concentration profile, a step germanium concentration profile, a step boron concentration profile, other suitable germanium concentration profile, and/or other suitable boron concentration profile along thickness $t_D$.

In FIG. 6F, epitaxial layers 146 are formed over epitaxial layers 144. Because epitaxial layers 144 and epitaxial layer 642 fill source/drain recesses 638, epitaxial layers 146 are disposed above top semiconductor layers 620. Epitaxial layer 146 physically contact epitaxial layers 144 (in particular, top surfaces of epitaxial sub-layers 144B) and extend between and physically contact gate spaces 136 of adjacent gate structures 130A-130C. Epitaxial layers 146 can be referred to as capping layers. In some embodiments, epitaxial layers 146 function as capping layers that protect epitaxial layers 144 (i.e., heavily doped portions of epitaxial source/drain structures 140) during subsequent processing, such as processing associated with fabricating source/drain contacts. Epitaxial layers 146 have a thickness $t_G$, which in some embodiments, is about 1 nm to about 5 nm. Thickness $t_G$ is less than, greater than, or the same as thickness $t_G$ depending on design requirements of multigate device 100A. Epitaxial layers 146 include silicon, germanium, silicon germanium, other suitable semiconductor material, or combinations thereof. In some embodiments, epitaxial layers 146 are undoped or unintentionally doped (UID). In such embodiments, epitaxial layers 146 are substantially free of dopants. In the depicted embodiment, epitaxial layers 146 include silicon that is substantially free of boron dopants. In some embodiments, epitaxial layers 146 are lightly doped, for example, with a dopant concentration that is less than or equal to about $1\times10^{20}$ $cm^{-3}$.

Figure 4:
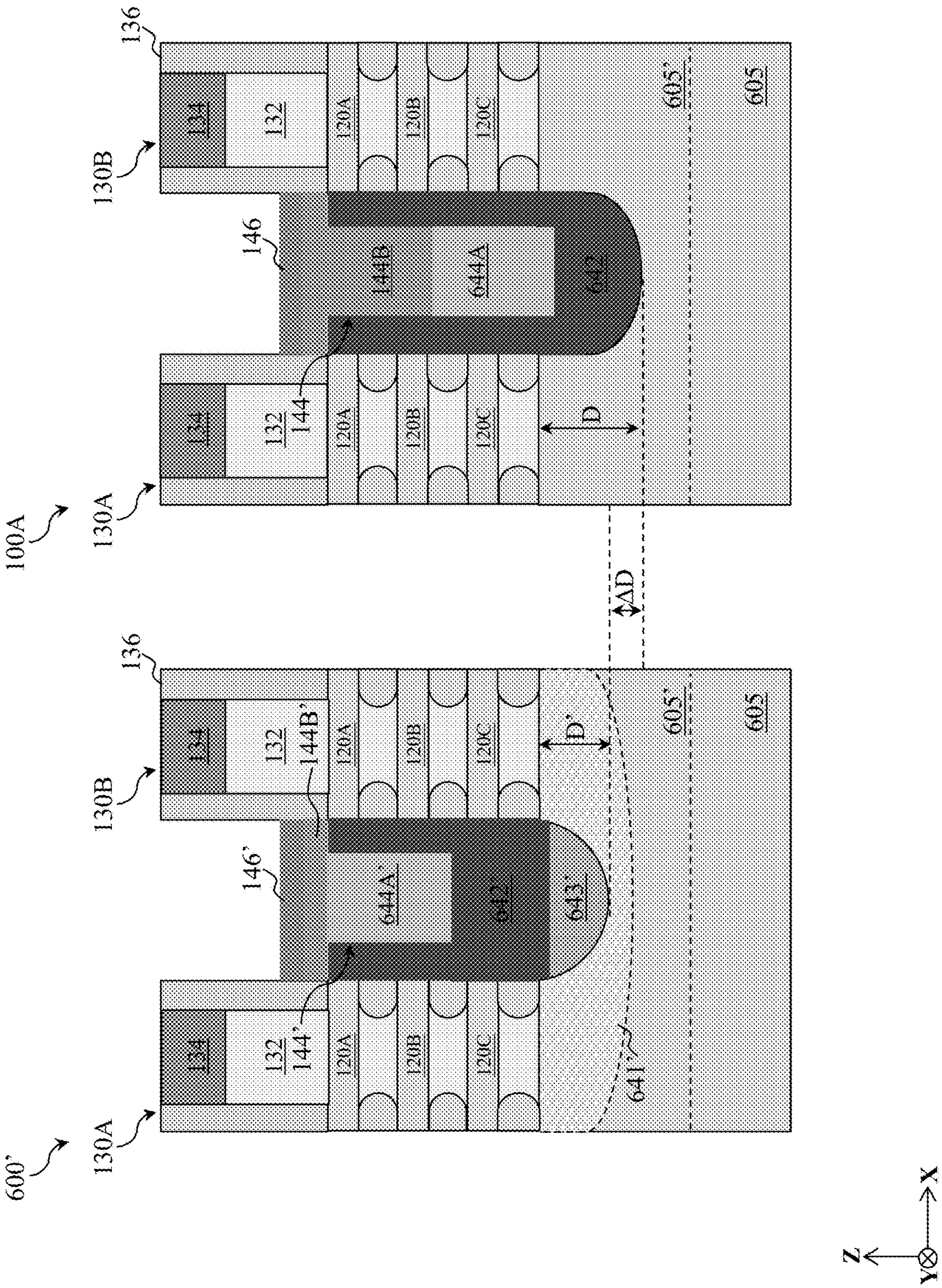
FIG. 4 are fragmentary cross-sectional views of multigate devices, in portion or entirety, according to various aspects of the present disclosure.

As noted above, a parasitic transistor can form from a semiconductor substrate, epitaxial source/drain structures, and a metal gate in a multigate device. In FIG. 4, a multigate device 600' that may exhibit such parasitic transistor and multigate device 100A are depicted at an intermediate stage of fabrication, such as after forming epitaxial source/drain structures. One epitaxial source/drain structure fabrication technique for suppressing the parasitic transistor and/or reducing short channel effects arising therefrom of multigate device 600' is to form a doped well 641' in semiconductor substrate 605 (in particular, substrate portion 605'), form an undoped epitaxial layer 643' on semiconductor substrate 605 (and thus at a bottom of a source/drain recess and eventual epitaxial source/drain structure), and then form doped epitaxial layers over the undoped epitaxial layer, such as an epitaxial layer 642' (which can be similar to epitaxial layer 642), an epitaxial layer 144' (which can be similar to epitaxial layer 144 and have an epitaxial sub-layer 644A' and epitaxial sub-layer 144B' similar to epitaxial sub-layer 644A and epitaxial sub-layer 144B, respectively), and an epitaxial layer 146' (which can be similar to epitaxial layer 146). However, the present disclosure has recognized that epitaxial layer 643' (the undoped epitaxial layer) combined with epitaxial layer 642' (the doped layer having the lower dopant concentration and/or lower strain-inducing constituent (e.g., germanium) of the doped layers) consume a larger than desirable volume of the epitaxial source/drain structure of multigate device 600' and undesirably shrink a volume of epitaxial layer 144 (the doped layer having the higher dopant concentration and/or higher strain-inducing constituent (e.g., germanium) of the doped layers) in the epitaxial source/drain structure of multigate device 600', thereby reducing strain characteristics of the epitaxial source/drain structure, increasing epi sheet resistance of the epitaxial source/drain structure, and/or degrading performance of multigate device 600'. For example, because undoped epitaxial layer 643' fills a bottom portion of a source/drain recess, epitaxial layer 642' fills a larger than desirable volume of the source/drain recess adjacent to semiconductor layers 120A-120C, which results in epitaxial sub-layer 144B' being disposed entirely above top surfaces of semiconductor layers 120A and epitaxial sub-layer 644A' extending to a depth above bottom semiconductor layers 120C.

The present disclosure addresses such disadvantages by replacing semiconductor substrate 605 with dielectric substrate 110 as described further below, which eliminates the need for an undoped epitaxial layer, such as undoped epitaxial layer 643', in epitaxial source/drain structures 140, and thus increases a volume of epitaxial layers 642 and/or epitaxial layers 144 in epitaxial source/drain structures 140. The present disclosure further addresses such disadvantages by increasing a depth of epitaxial source/drain structures 140 into semiconductor substrate 605 compared to multigate device 600'. For example, a depth D of epitaxial source/drain structures 140 of multigate device 100A into substrate portion 605' is greater than a depth D' of the epitaxial source/drain structure of multigate device 600' into substrate portion 605'. Increasing the depth of epitaxial source/drain structures 140 enlarges a volume of epitaxial layers 144 (i.e., the doped layer having the higher dopant concentration and/or higher strain-inducing constituent (e.g., germanium or carbon)), such that epitaxial source/drain structures 140 can provide more strain and less epi resistance than the epitaxial source/drain structure of multigate device 600'. In contrast to multigate device 600', epitaxial layers 144 extend below top surface of substrate portion 605' and epitaxial layers 144B are disposed above and below top surfaces of semiconductor layers 120A-120C. Current can thus also flow between bottommost semiconductor layers 120C and the doped layer having the higher dopant concentration and/or higher strain-inducing constituent (e.g., germanium or carbon) (i.e., epitaxial layers 144). Depth D is at least 10 nm greater than depth D'. In the depicted embodiment, a depth difference (ΔD) between depth D and depth D' is about 10 nm to about 20 nm, which combined with eliminating undoped epitaxial layer 643', results in bottom surfaces of epitaxial layers 644A being lower than top surface of substrate portion 605'. It is noted that, in the depicted embodiment, method 500 is configured to ensure that depth D is at least 20 nm. If depth D is less than 20 nm, bottom surfaces of epitaxial layers 644A may be higher than top surface of substrate portion 605' (e.g., because epitaxial layers 642 will fill portions of source/drain recesses 638 below top surface of substrate portion 605'). Different embodiments may have different advantages, and no particular advantage is necessarily required of any embodiment.

Figure 6G:
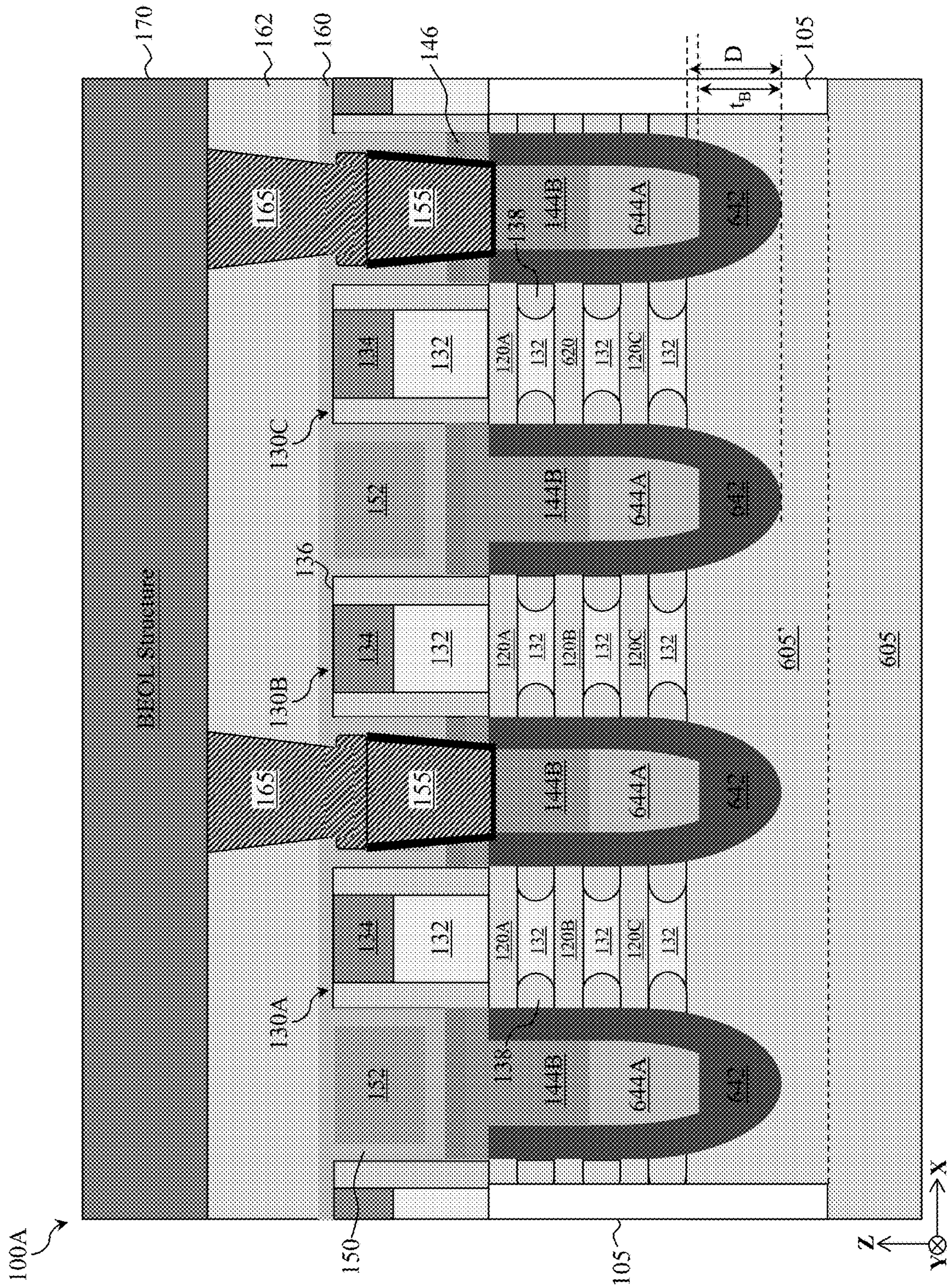

Turning to FIG. 6G, multigate device 100A can undergo further processing. For example, CESL 150 is formed over multigate device 100A, ILD layer 152 is formed over CESL 150, and a CMP process and/or other planarization process is performed until reaching (exposing) top portions (or top surfaces) of dummy gate stacks 632. CESL 150 and ILD layer 152 are disposed over epitaxial source/drain structures 140 and between adjacent gate structures 130A-130C. CESL 150 and/or ILD layer 152 are formed by CVD, PVD, ALD, RPCVD, PECVD, HDPCVD, FCVD, HARP, LPCVD, ALCVD, APCVD, SACVD, MOCVD, other suitable methods, or combinations thereof. In some embodiments, ILD layer 152 is formed by FCVD, HARP, HDPCVD, or combinations thereof. In some embodiments, the planarization process removes hard masks of dummy gate stacks 632 to expose underlying dummy gate electrodes of dummy gate stacks 632, such as polysilicon gate electrodes. ILD layer 152 includes a dielectric material including, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. In some embodiments, ILD layer 152 includes a dielectric material having a dielectric constant that is less than a dielectric constant of silicon dioxide (e.g., $k<3.9$). In some embodiments, ILD layer 152 includes a dielectric material having a dielectric constant that is less than about 2.5 (i.e., an extreme low-k (ELK) dielectric material), such as $SiO_2$ (for example, porous silicon dioxide), silicon carbide (SiC), and/or carbon-doped oxide (for example, a SiCOH-based material (having, for example, Si—$CH_3$ bonds)), each of which is tuned/configured to exhibit a dielectric constant less than about 2.5. ILD layer 152 can include a multilayer structure having multiple dielectric materials. CESL 150 includes a material different than ILD layer 152, such as a dielectric material that is different than the dielectric material of ILD layer 152. For example, where ILD layer 152 includes a dielectric material that includes silicon and oxygen and having a dielectric constant that is less than about the dielectric constant of silicon dioxide, CESL 150 can include silicon and nitrogen, such as silicon nitride or silicon oxynitride.

A gate replacement process is then performed to replace dummy gate stacks 632 with metal gate stacks, each metal gate stack having a respective metal gate 132 and a respective hard mask 134. For example, dummy gate stacks 632 are removed to form gate openings in gate structures 130A-130C that expose channel regions of semiconductor layer stacks 610 (e.g., semiconductor layers 620 and semiconductor layers 615). In some embodiments, an etching process is performed that selectively removes dummy gate stacks 632 with respect to ILD layer 152, CESL 150, gate spacers 136, inner spacers 138, semiconductor layers 615, and/or semiconductor layers 620. In other words, the etching process substantially removes dummy gate stacks 632 but does not remove, or does not substantially remove, ILD layer 152, CESL 150, gate spacers 136, inner spacers 138, semiconductor layers 615, and/or semiconductor layers 620. The etching process is a dry etching process, a wet etching process, other suitable etching process, or combinations thereof. In some embodiments, the etching process uses a patterned mask layer as an etch mask, where the patterned mask layer covers ILD layer 152, CESL 150, and/or gate spacers 136 but has openings therein that expose dummy gate stacks 632.

During the gate replacement process, before forming the metal gate stacks in the gate openings, a channel release process is performed to form suspended channel layers in channel regions of multigate device 100A. For example, semiconductor layers 615 exposed by the gate openings are selectively removed to form air gaps between semiconductor layers 620 and between semiconductor layers 620 and substrate portion 605', thereby suspending semiconductor layers 620 in channel regions of multigate device 100A. In the depicted embodiment, each transistor region of multigate device 100A has three suspended semiconductor layers 620, which are referred to hereafter as semiconductor layers 120A-120C, vertically stacked along the z-direction for providing three channels through which current can flow between respective epitaxial source/drain structures 140 during operation of transistors corresponding with the transistor regions. In some embodiments, an etching process is performed to selectively etch semiconductor layers 615 with minimal (to no) etching of semiconductor layers 620, substrate portion 605', gate spacers 136, inner spacers 138, CESL 150, and/or ILD layer 152. In some embodiments, an etchant is selected for the etch process that etches silicon germanium (i.e., semiconductor layers 615) at a higher rate than silicon (i.e., semiconductor layers 620 and substrate portion 605') and dielectric materials (i.e., gate spacers 136, inner spacers 138, CESL 150, and/or ILD layer 152) (i.e., the etchant has a high etch selectivity with respect to silicon germanium). The etching process is a dry etching process, a wet etching process, other suitable etching process, or combinations thereof. In some embodiments, before performing the etching process, an oxidation process can be implemented to convert semiconductor layers 615 into silicon germanium oxide features, where the etching process then removes the silicon germanium oxide features. In some embodiments, during and/or after removing semiconductor layers 615, an etching process is performed to modify a profile of semiconductor layers 620 to achieve target dimensions and/or target shapes for semiconductor layers 120A-120C.

Metal gates 132 (also referred to as high-k/metal gates) and hard masks 134 are then formed in the gate openings. Metal gates 132 and hard masks 134 are disposed between respective gate spacers 136. Metal gates 132 are disposed between respective inner spacers 138. Metal gates 132 are further disposed between semiconductor layers 120A and semiconductor layers 120B, between semiconductor layers 120B and semiconductor layers 120C, and between semiconductor layers 120C and substrate portion 605'. In the depicted embodiment, where multigate device 100A is a GAA transistor, metal gates 132 surround semiconductor layers 120A-120C, for example, in the Y-Z plane. In some embodiments, forming the metal gate stacks includes depositing a gate dielectric layer over multigate device 100A that partially fills the gate openings, depositing a gate electrode layer over the gate dielectric layer that partially fills the gate openings, depositing a hard mask layer over the gate electrode layer that fills a remainder of the gate openings, and performing a planarization process, such as CMP, on the hard mask layer, the gate electrode layer, and/or the hard mask layer, thereby forming metal gates 132 and hard masks 134 as depicted in FIG. 6G. The deposition processes can include CVD, PVD, ALD, RPCVD, PECVD, HDPCVD, FCVD, HARP, LPCVD, ALCVD, APCVD, SACVD, MOCVD, plating, other suitable methods, or combinations thereof. Though the depicted embodiment fabricates the metal gates stacks according to a gate last process, the present disclosure contemplates embodiments where the metal gate stacks are fabricated according to a gate first process or a hybrid gate last/gate first process.

Metal gates 132 are configured to achieve desired functionality according to design requirements of multigate device 100A, such that metal gates 132 of gate structures 130A-130C may include the same or different layers and/or materials. In some embodiments, metal gates 132 include a gate dielectric (for example, a gate dielectric layer) and a gate electrode (for example, a work function layer and a bulk (or fill) conductive layer). Metal gates 132 may include numerous other layers, for example, capping layers, interface layers, diffusion layers, barrier layers, hard mask layers, or combinations thereof. In some embodiments, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant (k value) relative to a dielectric constant of silicon dioxide ($k \approx 3.9$). For example, high-k dielectric material has a dielectric constant greater than about 3.9. In some embodiments, the gate dielectric layer is a high-k dielectric layer. The gate electrode includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (such as an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, ZrSi2, MoSi2, TaSi2, NiSi2, WN, other suitable p-type work function materials, or combinations thereof. The bulk conductive layer includes a suitable conductive material, such as Al, W, Cu, Ti, Ta, polysilicon, metal alloys, other suitable materials, or combinations thereof. Hard masks 134 include any suitable hard mask material, such as any material (e.g., silicon nitride or silicon carbonitride) that can protect metal gates 132 during subsequent processing, such as that associated with forming device-level contacts to metal gates 132 and/or epitaxial source/drain structures 140.

Processing can then continue with forming device-level contacts, such as metal-to-poly (MP) contacts, which generally refer to contacts to a gate structure (e.g., gate structures 130A-130C), and metal-to-device (MD) contacts, which generally refer to contacts to an electrically active region of multigate device 100A (e.g., epitaxial source/drain structures 140). Device-level contacts electrically and physically connect IC device features to local contacts (interconnects), which are further described below. For example, source/drain contacts 155 are formed by performing a lithography and etching process (such as described herein) to form contact openings that extend through ILD layer 152 and/or CESL 150 to expose epitaxial source/drain structures 140; performing a first deposition process to form a contact barrier material over ILD layer 152 that partially fills the contact openings; and performing a second deposition process to form a contact bulk material over the contact barrier material, where the contact bulk material fills a remainder of the contact openings. In such embodiments, the contact barrier material and the contact bulk material are disposed in the contact opening and over a top surface of ILD layer 152. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition methods, or combinations thereof. In some embodiments, a silicide layer is formed over epitaxial source/drain structures 140 before forming the contact barrier material (e.g., by depositing a metal layer over epitaxial source/drain structures 140 and heating multigate device 100A to cause constituents of epitaxial source/drain structures 140 to react with metal constituents of the metal layer). In some embodiments, the silicide layer includes a metal constituent (e.g., nickel, platinum, palladium, vanadium, titanium, cobalt, tantalum, ytterbium, zirconium, other suitable metal, or combinations thereof) and a constituent of epitaxial source/drain structures 140 (e.g., silicon and/or germanium). A CMP process and/or other planarization process is performed to remove excess contact bulk material and contact barrier material, for example, from over the top surface of ILD layer 152, resulting in source/drain contacts 155 (in other words, the contact barrier layer and the contact bulk layer filling the contact openings). The CMP process planarizes a top surface of source/drain contact 155, such that in some embodiments, a top surface of ILD layer 152 and top surfaces of source/drain contacts 160 form a substantially planar surface.

Source/drain contacts 155 extend through ILD layer 152 and/or CESL 150 to physically contact epitaxial source/drain structures 140. The contact barrier layer includes a material that promotes adhesion between a surrounding dielectric material (e.g., ILD layer 152 and/or CESL 150) and the contact bulk layer. The material of the contact barrier layer may further prevent diffusion of metal constituents from source/drain contacts 155 into the surrounding dielectric material. In some embodiments, the contact barrier layer includes titanium, titanium alloy, tantalum, tantalum alloy, cobalt, cobalt alloy, ruthenium, ruthenium alloy, molybdenum, molybdenum alloy, palladium, palladium alloy, other suitable constituent configured to promote and/or enhance adhesion between a metal material and a dielectric material and/or prevent diffusion of metal constituents from the metal material to the dielectric material, or combinations thereof. For example, the contact barrier layer includes tantalum, tantalum nitride, tantalum aluminum nitride, tantalum silicon nitride, tantalum carbide, titanium, titanium nitride, titanium silicon nitride, titanium aluminum nitride, titanium carbide, tungsten, tungsten nitride, tungsten carbide, molybdenum nitride, cobalt, cobalt nitride, ruthenium, palladium, or combinations thereof. In some embodiments, the contact barrier layer includes multiple layers. For example, the contact barrier layer may include a first sub-layer that includes titanium or tantalum and a second sub-layer that includes titanium nitride or tantalum nitride. The contact bulk layer includes tungsten, ruthenium, cobalt, copper, aluminum, iridium, palladium, platinum, nickel, low resistivity metal constituent, alloys thereof, or combinations thereof. In some embodiments, source/drain contacts 155 do not include a contact barrier layer (i.e., source/drain contacts 155 are barrier-free) or source/drain contacts 155 are partially barrier-free, where the contact barrier layer is disposed between a portion of the contact bulk layer and the dielectric layer. In some embodiments, the contact bulk layer includes multiple layers.

Processing can continue with forming additional features of the MLI feature, such as a middle-of-line layer (e.g., CESL 160, ILD layer 162, vias, and/or source/drain contacts 165) and BEOL structure 170. CESL 160 and/or ILD layer 162 can be configured and formed as described with reference to CESL 150 and ILD layer 152, respectively, above. Source/drain contacts 165 can be configured and formed as described with reference to source/drain contacts 155. BEOL structure 170 can include additional metallization layers (levels) of the MLI feature, such as a first metallization layer (i.e., a metal one (M1) layer and a via zero (V0) layer), a second metallization layer (i.e., a metal two (M2) layer and a via one (V1) layer) . . . to a topmost metallization layer (i.e., a metal X (MX) layer and a via Y (VY) layer, where X is a total number of patterned metal line layers of the MLI feature and Y is a total number of patterned via layers of the MLI feature) over the first metallization layer. Each of the metallization layers includes a patterned metal line layer and a patterned via layer configured to provide at least one BEOL interconnect structure disposed in an insulator layer, which includes at least one ILD layer and at least one CESL similar to the ILD layers and the CESLs described herein. The patterned metal line layer and the patterned metal via layer can be formed by any suitable process, including by various dual damascene processes, and include any suitable materials and/or layers.

Figure 6H:
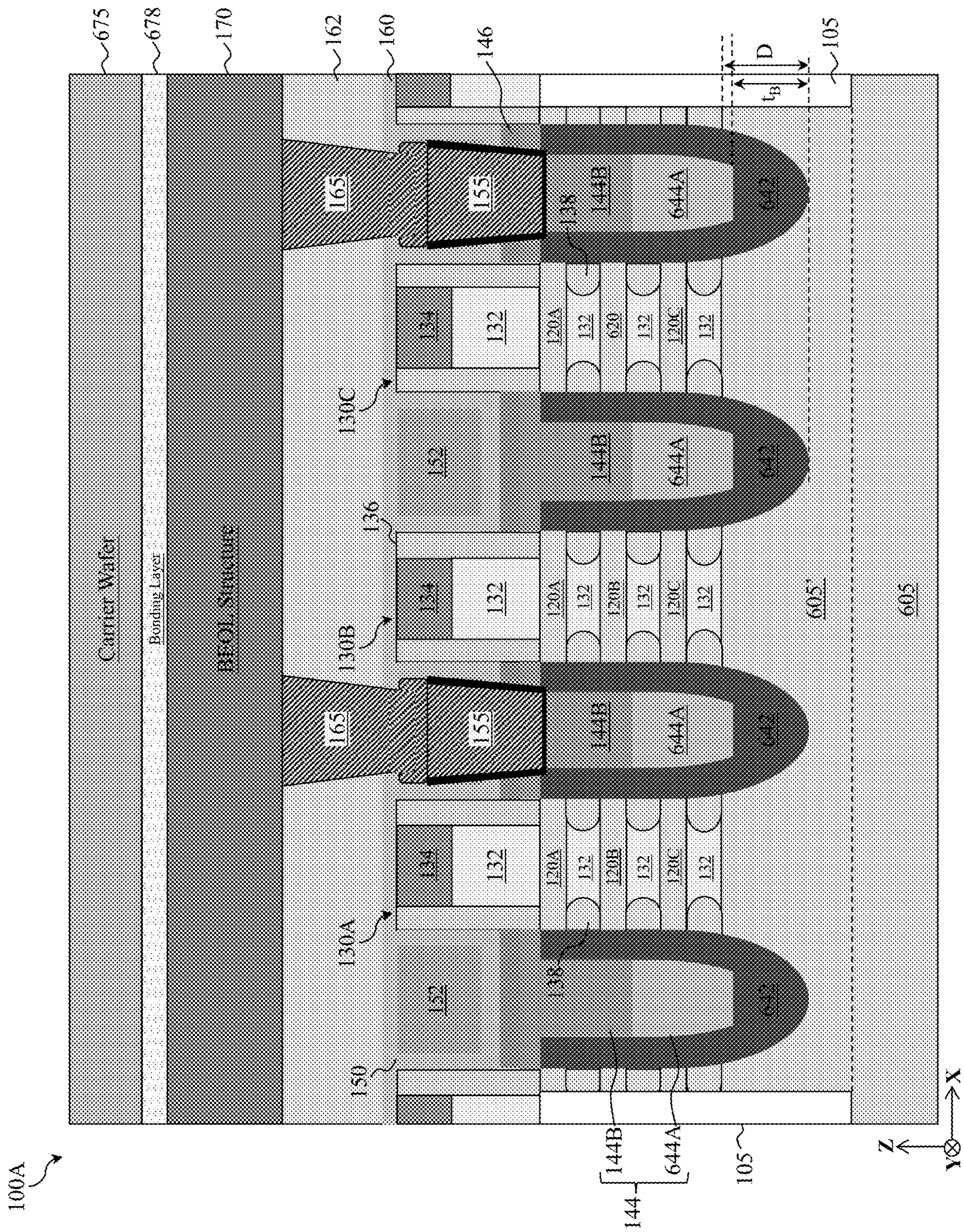

Turning to FIG. 5 and FIGS. 6H-6M, method 500 proceeds at block 550 with replacing a semiconductor substrate (e.g., substrate portion 605' and semiconductor substrate 605) with a dielectric substrate, such as dielectric substrate 110. In FIG. 6H, a carrier wafer 675 (also referred to as a carrier substrate) is bonded and/or attached to a frontside of a device wafer (e.g., a wafer including multigate device 100A) by a bonding layer 678. In some embodiments, the device wafer is bonded to carrier wafer 675 using dielectric-to-dielectric bonding. For example, bonding carrier wafer 675 to the device wafer can include forming a first dielectric layer over BEOL structure 170 of multigate device 100A, forming a second dielectric layer over carrier wafer 675, flipping over and placing carrier wafer 675 over the device wafer, such that the second dielectric layer of carrier wafer 675 contacts the first dielectric layer of the device wafer, and performing an anneal or other suitable process to bond the first dielectric layer and the second dielectric layer. In some embodiments, bonding layer 678 represents the first dielectric layer, the second dielectric layer, a portion of the first dielectric layer, a portion of the second dielectric layer, a bonded portion of the first dielectric layer and the second dielectric layer, or combinations thereof. In some embodiments, bonding layer 678 is an oxide layer that attaches carrier wafer 675 to BEOL structure 170 of the device wafer. In some embodiments, the dielectric-to-dielectric bonding process is an oxide-to-oxide bonding process that includes bonding an oxide layer of carrier wafer 675 with an oxide layer of the device wafer (e.g., an ILD layer of BEOL structure 170). In the depicted embodiment, carrier wafer 678 is a silicon wafer. In some embodiments, carrier wafer 678 includes silicon, soda-lime glass, fused silica, fused quartz, calcium fluoride, and/or other suitable carrier wafer materials.

Figure 6I:
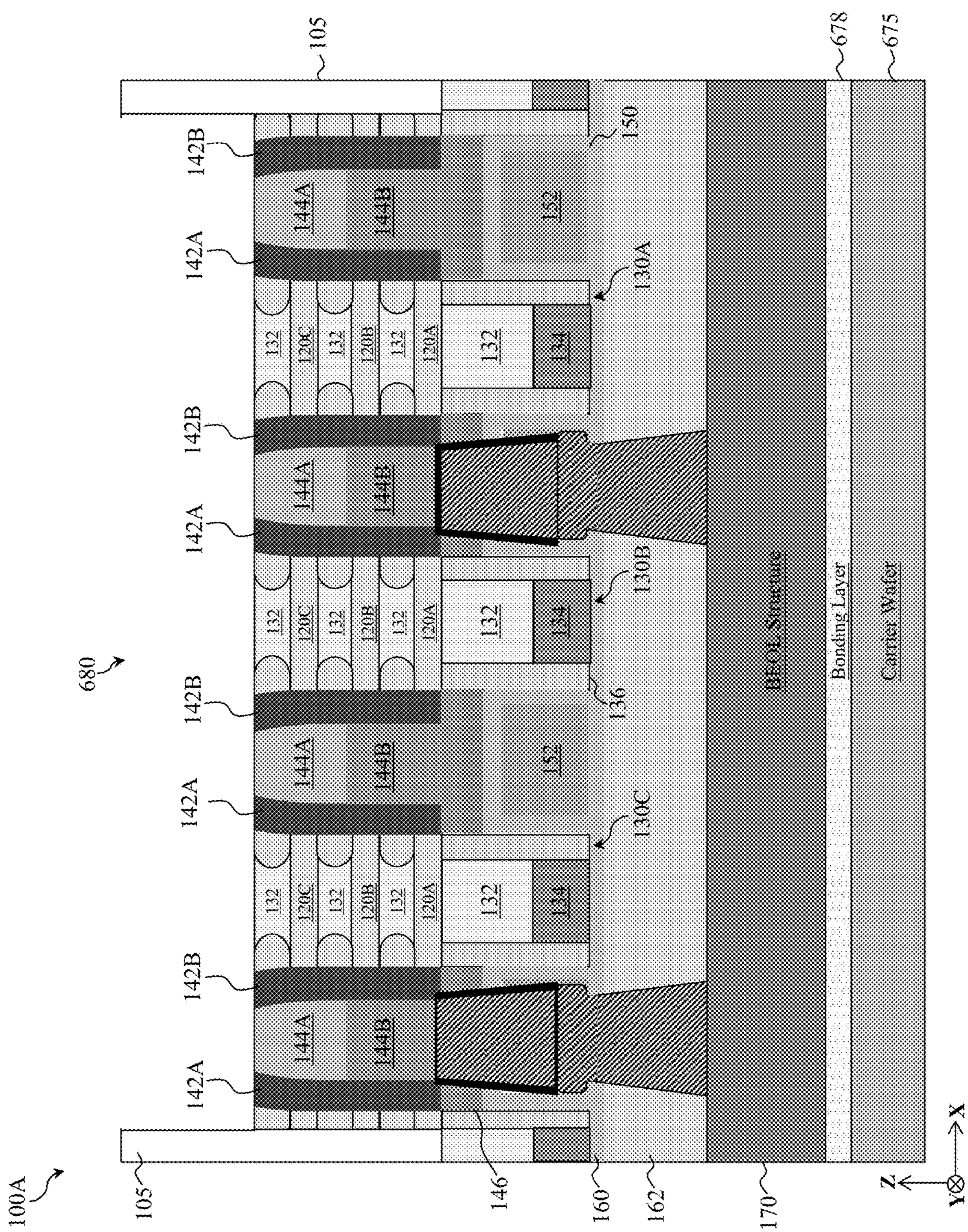

In FIG. 6I, the device wafer is flipped over and semiconductor substrate 605 (including substrate portion 605') is removed from multigate device 100A by an etching process, thereby forming a trench (recess) 680 that exposes epitaxial source/drain structures 140, inner spacers 138, and metal gates 132. The etching process completely removes semiconductor substrate 605, substrate portion 605', and portions of epitaxial source/drain structures 140 disposed in substrate portion 605' and/or semiconductor substrate 605. In the depicted embodiment, the etching process removes portions of epitaxial layers 642 disposed in substrate portion 605', thereby forming epitaxial sidewalls 142A, 142B of epitaxial source/drain structures 140. Removing a bottom portion of epitaxial layers 642 exposes epitaxial sub-layers 644A, such that in furtherance of the depicted embodiment, the etching process can remove portions of epitaxial sub-layers 644A disposed in substrate portion 605', thereby forming epitaxial sub-layers 144A of epitaxial source/drain structures 140. Accordingly, trench 680 has sidewalls formed by isolation features 105 and bottoms formed by epitaxial sub-layers 144A, epitaxial sidewalls 142A, 142B, inner spacers 138, and metal gates 132. The etching process is a dry etching process, a wet etching process, other suitable etching process, or combinations thereof. In some embodiments, a dry etching process is performed to selectively etch semiconductor substrate 605, substrate portion 605', and epitaxial source/drain structures 140 with minimal (to no) etching of isolation features 105, inner spacers 138, and metal gates 138. In some embodiments, an etchant is selected for the dry etch process that etches semiconductor materials (e.g., silicon (i.e., semiconductor substrate 605 and substrate portion 605') and silicon germanium (i.e., epitaxial layers 642 and epitaxial sub-layers 644A)) at a higher rate than dielectric materials (i.e., isolation features 105 and inner spacers 138) and metal materials (i.e., metal gates 132) (i.e., the etchant has a high etch selectivity with respect to silicon and silicon germanium). In some embodiments, the etching process is a multi-step etch process. For example, the etching process may alternate etchants to separately and alternately remove semiconductor substrate 605 (including substrate portion 605') and epitaxial source/drain structures 140. In some embodiments, a lithography process, such as those described herein, is performed to form a patterned mask layer that covers isolation features 105, and the etching process uses the patterned mask layer as an etch mask.

Figure 6J:
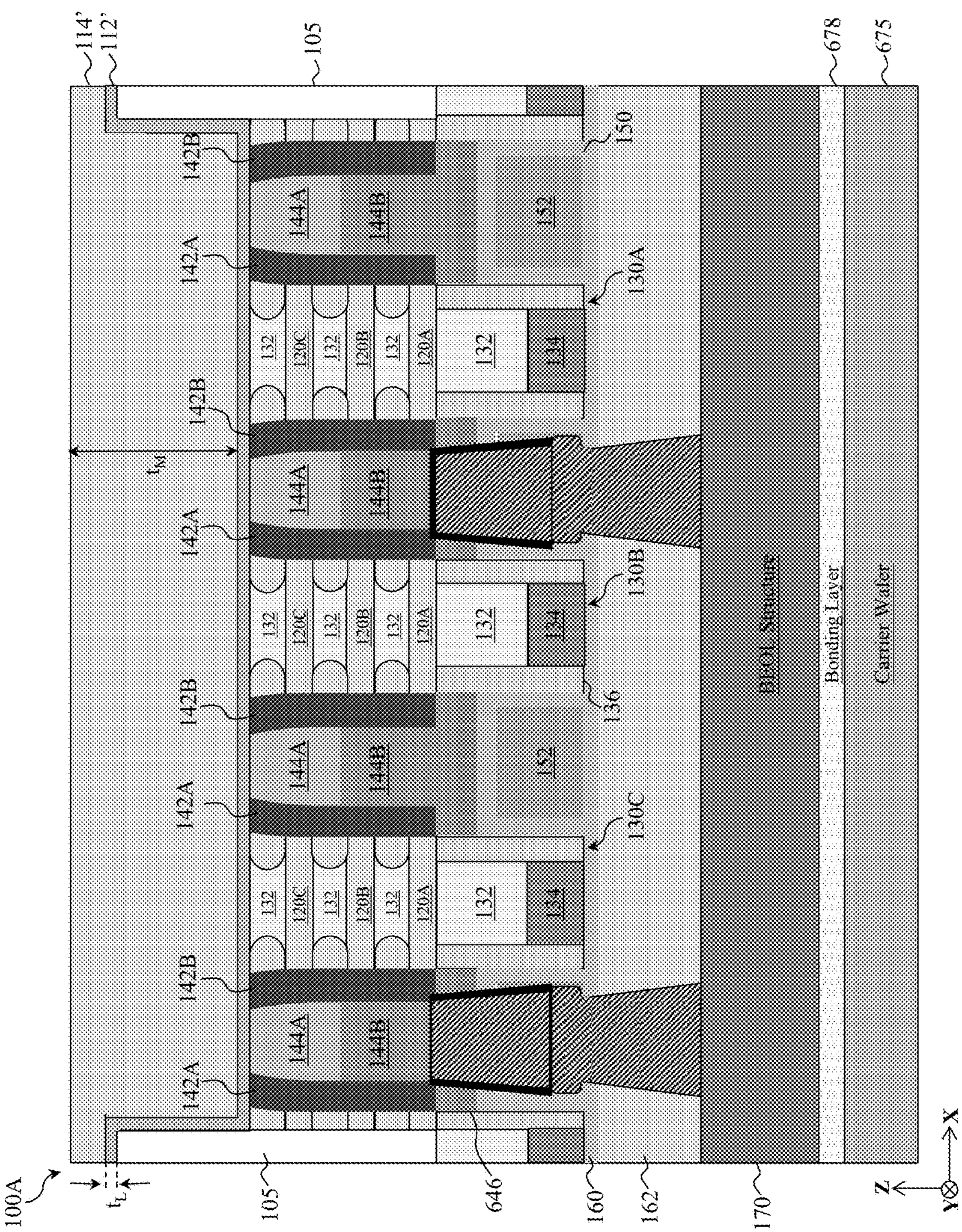
Figure 6K:
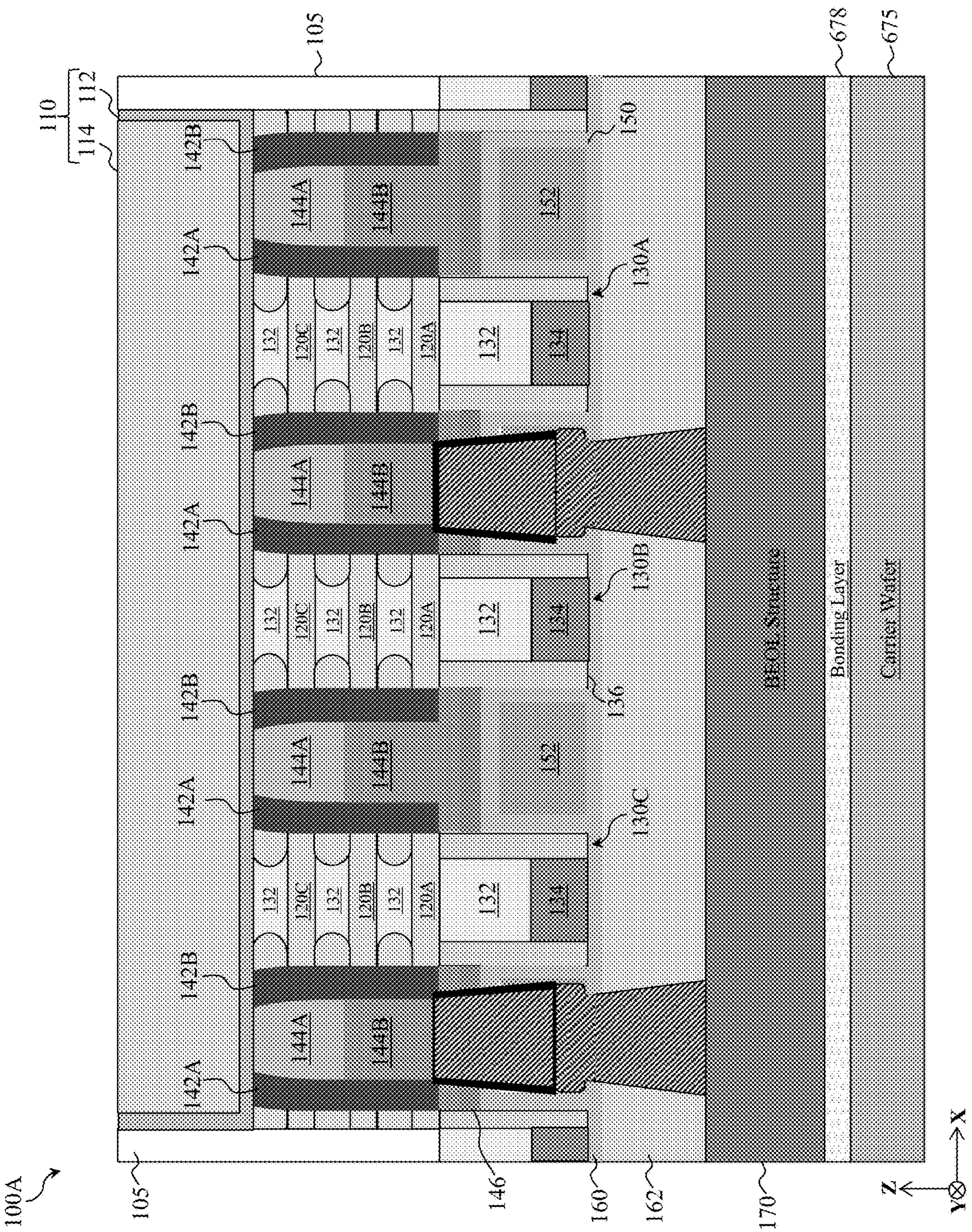

In FIG. 6J and FIG. 6K, dielectric substrate 110 is formed over a backside of multigate device 100A, and in the depicted embodiment, fills trench 680. In FIG. 6J, a dielectric liner 112' is deposited over the backside of multigate device 100A to partially fill trench 680, and a dielectric layer 114' is deposited over dielectric liner 112' to fill a remainder of trench 680. Dielectric liner 112' physically contacts epitaxial source/drain structures 140 (in particular, epitaxial layers 144A and epitaxial sidewalls 142A, 142B), inner spacers 138, and metal gates 132. Dielectric liner 112' and dielectric layer 114 are deposited by any suitable deposition process, such as CVD, PVD, ALD, HDPCVD, FCVD, HARP, MOCVD, RPCVD, PECVD, LPCVD, ALCVD, APCVD, SACVD, or combinations thereof. In some embodiments, dielectric liner 112' is formed by ALD and dielectric layer 114' is formed by CVD. Dielectric liner 112' has a thickness $t_L$, and dielectric layer 114' has a thickness $t_M$. In some embodiments, $t_L$ is about 1 nm to about 5 nm.

In some embodiments, thickness $t_M$ is greater than a depth of trench 680, such that dielectric layer 114' overfills trench 680 and is disposed over bottom surfaces of isolation features 105. In some embodiments, thickness $t_L$ is substantially uniform over various surfaces of multigate device 100A. For example, thickness $t_L$ is substantially the same along bottom surfaces of isolation features 105, sidewalls of isolation features 105, surfaces of multigate device 100A forming the bottom of trench 680 (e.g., surfaces of epitaxial layers 144A, surfaces of epitaxial sidewalls 142A, 142B, surfaces of metal gate stacks 132, and surfaces of inner spacers 138). Dielectric liner 112' and dielectric layer 114' each include a dielectric material including, for example, silicon, oxygen, nitrogen, carbon, other suitable dielectric constituent, or combinations thereof. The dielectric material of dielectric liner 112' is different than the dielectric material of dielectric layer 114'. In some embodiments, dielectric liner 112' includes a nitrogen-comprising dielectric material, such as a dielectric material that includes nitrogen in combination with silicon, carbon, and/or oxygen. In such embodiments, dielectric liner 112' can be referred to as a nitride liner or a silicon nitride liner. For example, dielectric liner 112' includes silicon nitride, silicon carbon nitride, silicon oxycarbonitride, or combinations thereof. In some embodiments, dielectric liner 112' includes n-type dopants and/or p-type dopants. For example, dielectric liner 112' can be a boron-doped nitride liner. In some embodiments, dielectric liner 112' includes a low-k dielectric material. In some embodiments, dielectric liner 112' includes BSG, PSG, and/or BPSG. In some embodiments, dielectric layer 114' includes an oxygen-comprising dielectric material, such as a dielectric material that includes oxygen in combination with another chemical element, such as silicon. For example, dielectric layer 114' is an oxide layer, such as a silicon oxide layer. In some embodiments, dielectric layer 114' and dielectric liner 112' include different low-k dielectric materials.

In FIG. 6K, a CMP process and/or other planarization process is then performed on dielectric layer 114' and dielectric liner 112'. A remainder of dielectric layer 114' and a remainder of dielectric liner 112' after the CMP process form dielectric layer 114 and dielectric layer 112, respectively, of dielectric substrate 110. Isolation features 105 can function as a CMP stop layer, such that the CMP process is performed until reaching and exposing isolation features 105. The CMP process removes portions of dielectric layer 114' and portions of dielectric liner 112' that are disposed over bottom surfaces of isolation features 105. The CMP process can planarize surfaces of dielectric layer 114, surfaces of dielectric layer 112, and bottom surfaces of isolation features 105, such that these surfaces are substantially planar.

Figure 6L:
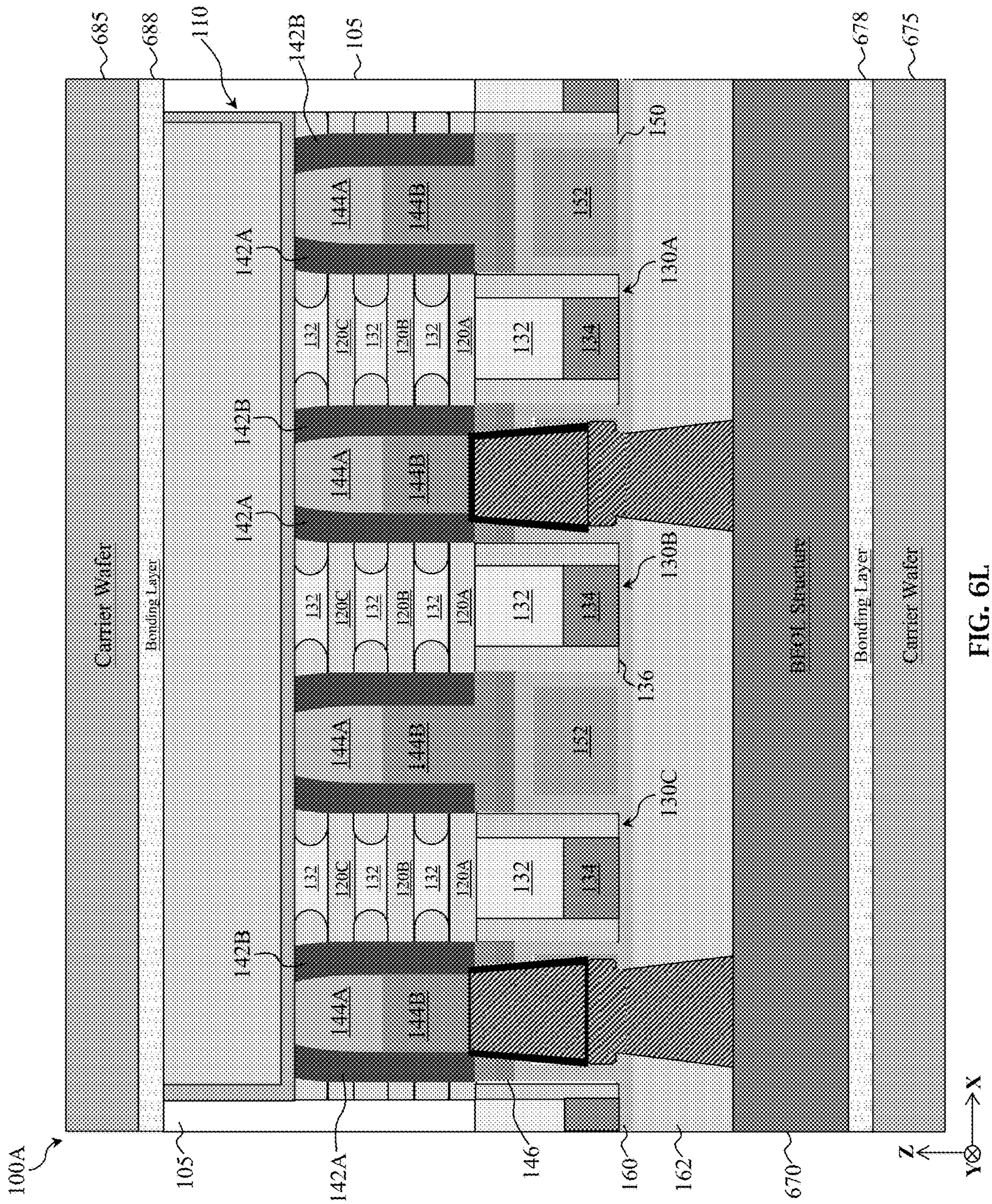
Figure 6M:
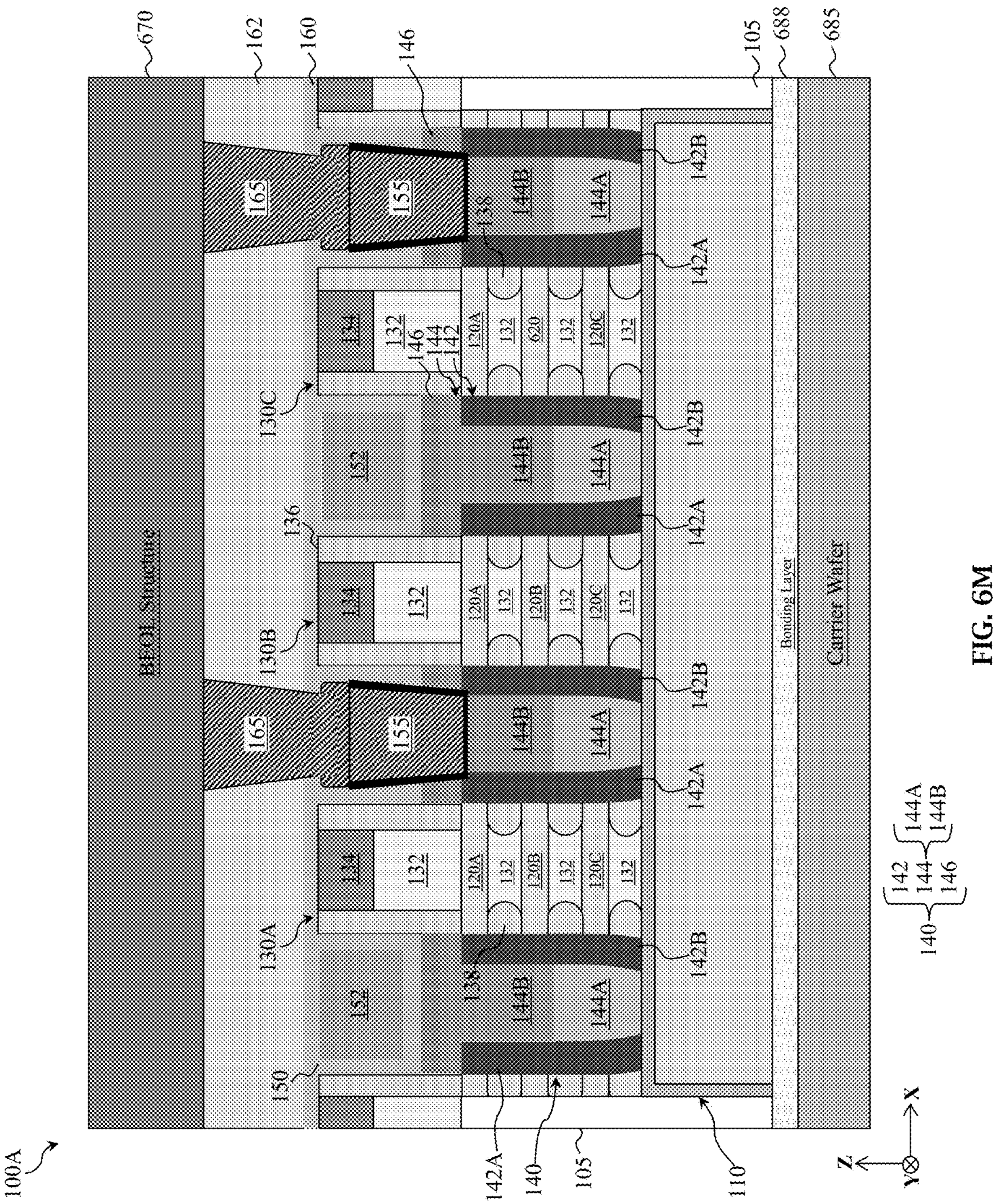

In FIG. 6L, a carrier wafer 685 is bonded and/or attached to a backside of the device wafer by a bonding layer 688. In some embodiments, the device wafer is bonded to carrier wafer 685 using dielectric-to-dielectric bonding. For example, bonding carrier wafer 685 to the device wafer can include forming a first dielectric layer over dielectric substrate 110 and/or isolation features 105, forming a second dielectric layer over carrier wafer 685, flipping over and placing carrier wafer 685 over the device wafer, such that the second dielectric layer of carrier wafer 685 contacts the first dielectric layer of the device wafer, and performing an anneal or other suitable process to bond the first dielectric layer and the second dielectric layer. In some embodiments, bonding layer 688 represents the first dielectric layer, the second dielectric layer, a portion of the first dielectric layer, a portion of the second dielectric layer, a bonded portion of the first dielectric layer and the second dielectric layer, or combinations thereof. In some embodiments, bonding layer 688 is an oxide layer that attaches carrier wafer 685 to dielectric substrate 110 and/or isolation features 105 of the device wafer. In some embodiments, the dielectric-to-dielectric bonding process is an oxide-to-oxide bonding process that includes bonding an oxide layer of carrier wafer 685 with an oxide layer of the device wafer (e.g., dielectric layer 114 of dielectric substrate 110 and/or isolation features 105). In the depicted embodiment, carrier wafer 688 is a silicon wafer. In some embodiments, carrier wafer 688 includes silicon, soda-lime glass, fused silica, fused quartz, calcium fluoride, and/or other suitable carrier wafer materials.

Thereafter, in FIG. 6K, carrier wafer 675 is removed from the frontside of the device wafer, such as from the frontside of multigate device 100A. In some embodiments, such as depicted, bonding layer 678 is also removed from the frontside of the device wafer. In some embodiments, a planarization technique, such as CMP, is used to remove carrier wafer 675 and/or bonding layer 678 from the device wafer. The present disclosure contemplates other methods and/or techniques for removing carrier wafer 675 and/or bonding layer 678 from the device wafer. In some embodiments, carrier wafer 685 and/or bonding layer 688 are removed from the backside of multigate device 100A.

Figure 7A:
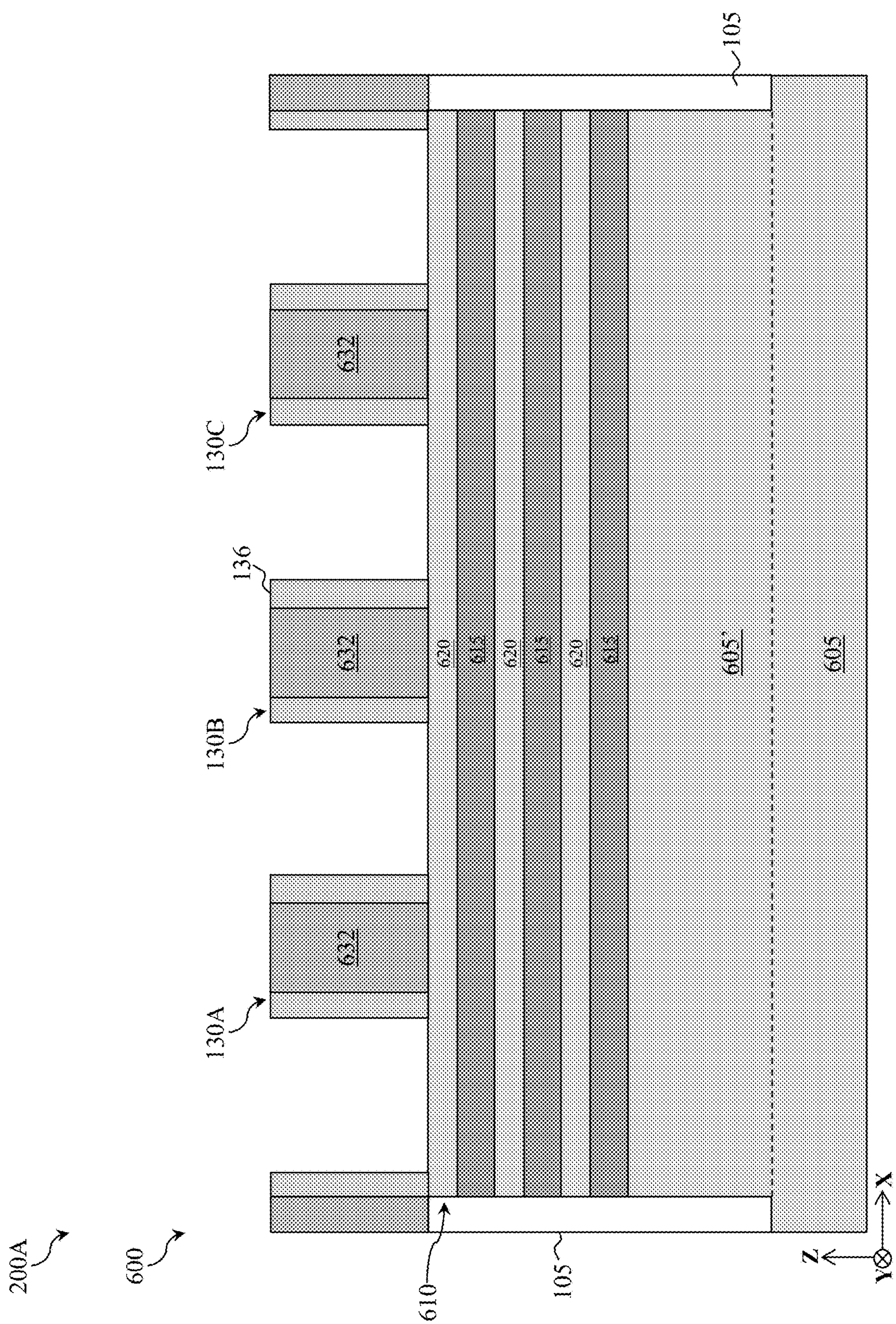
FIGS. 7A-7M are fragmentary perspective views of a multigate device, such as the multigate device depicted in FIG. 2A or FIG. 2B, at various fabrication stages, such as those associated with the method in FIG. 5, according to various aspects of the present disclosure.
Figure 7B:
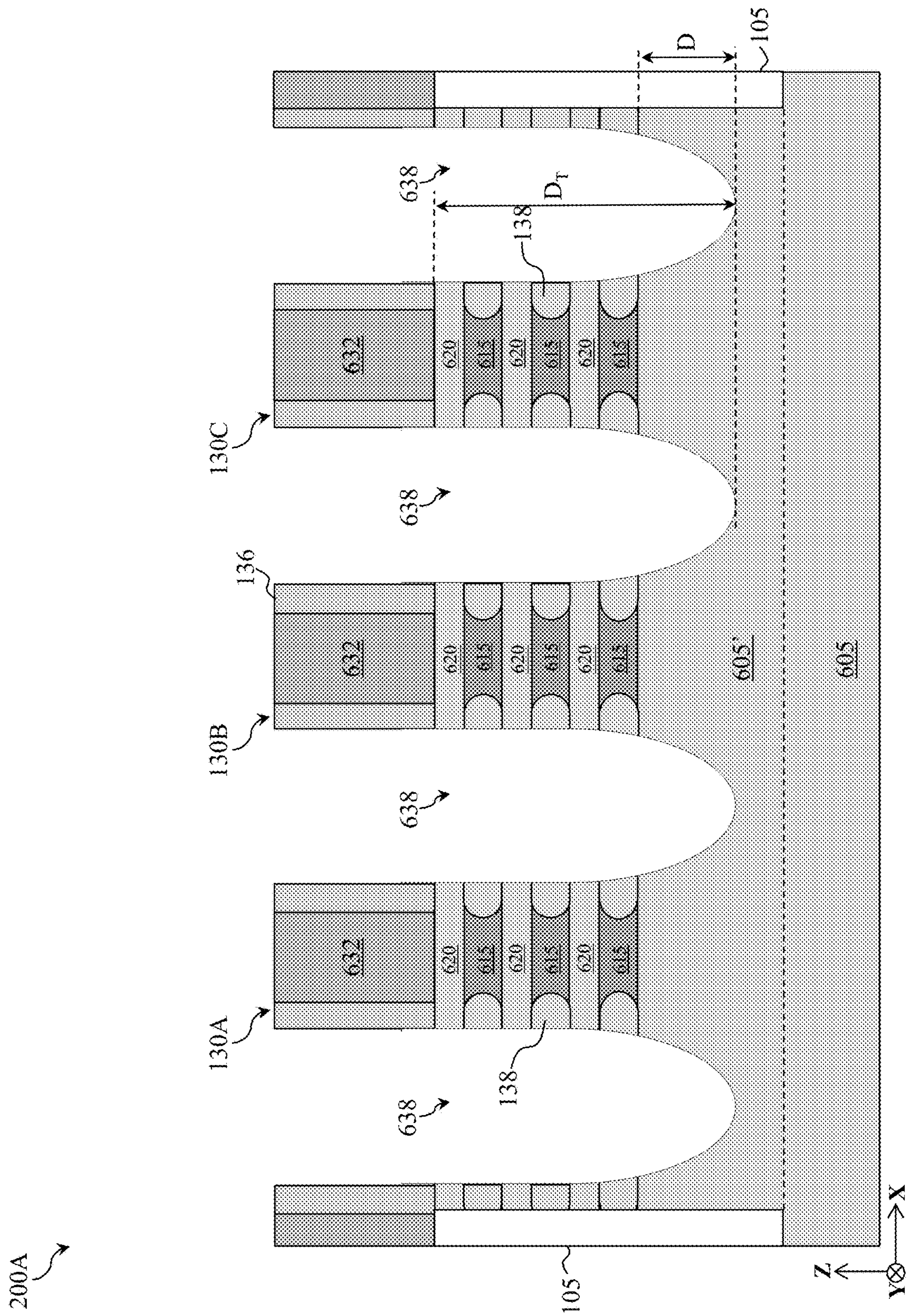
Figure 7C:
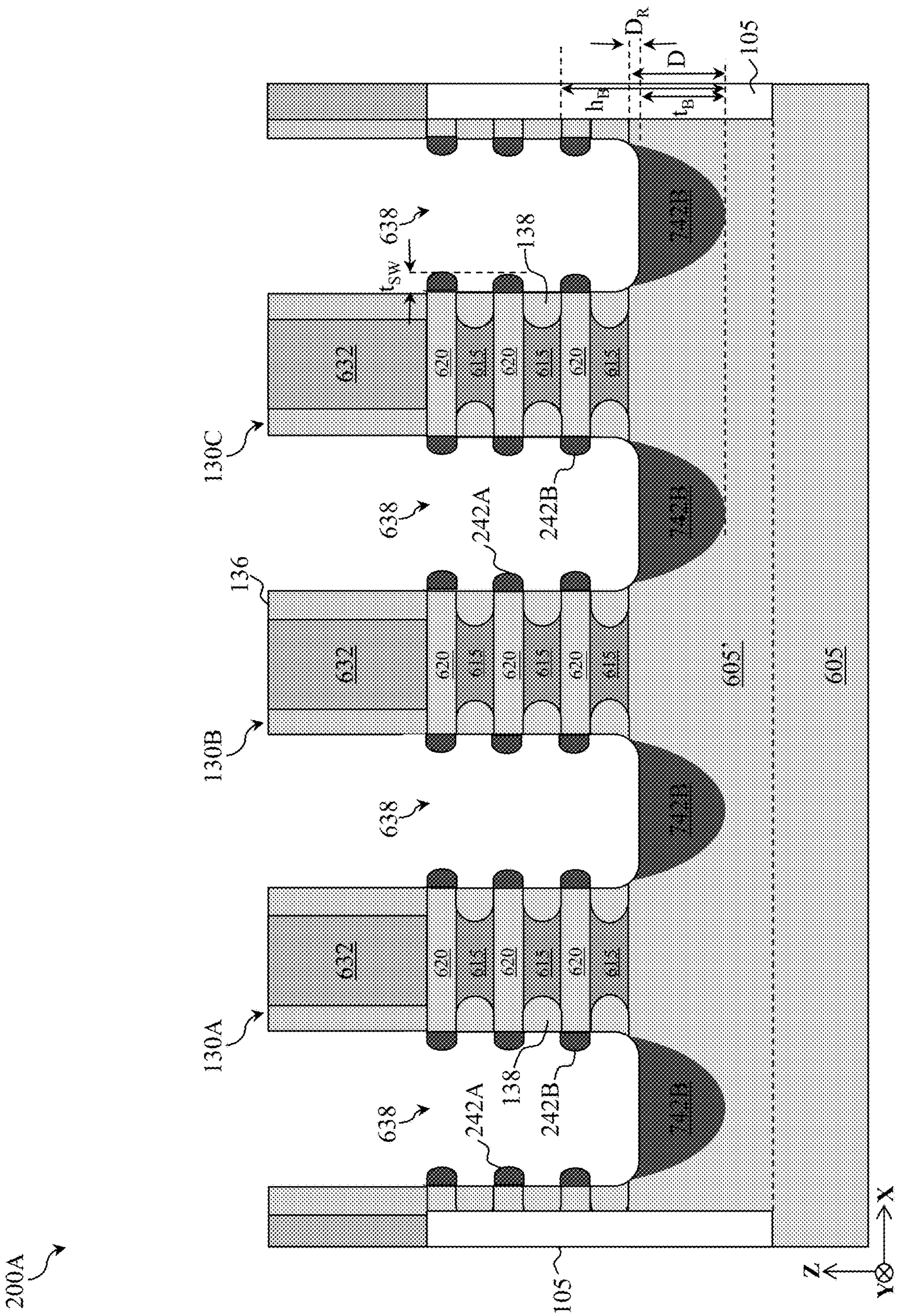
Figure 7D:
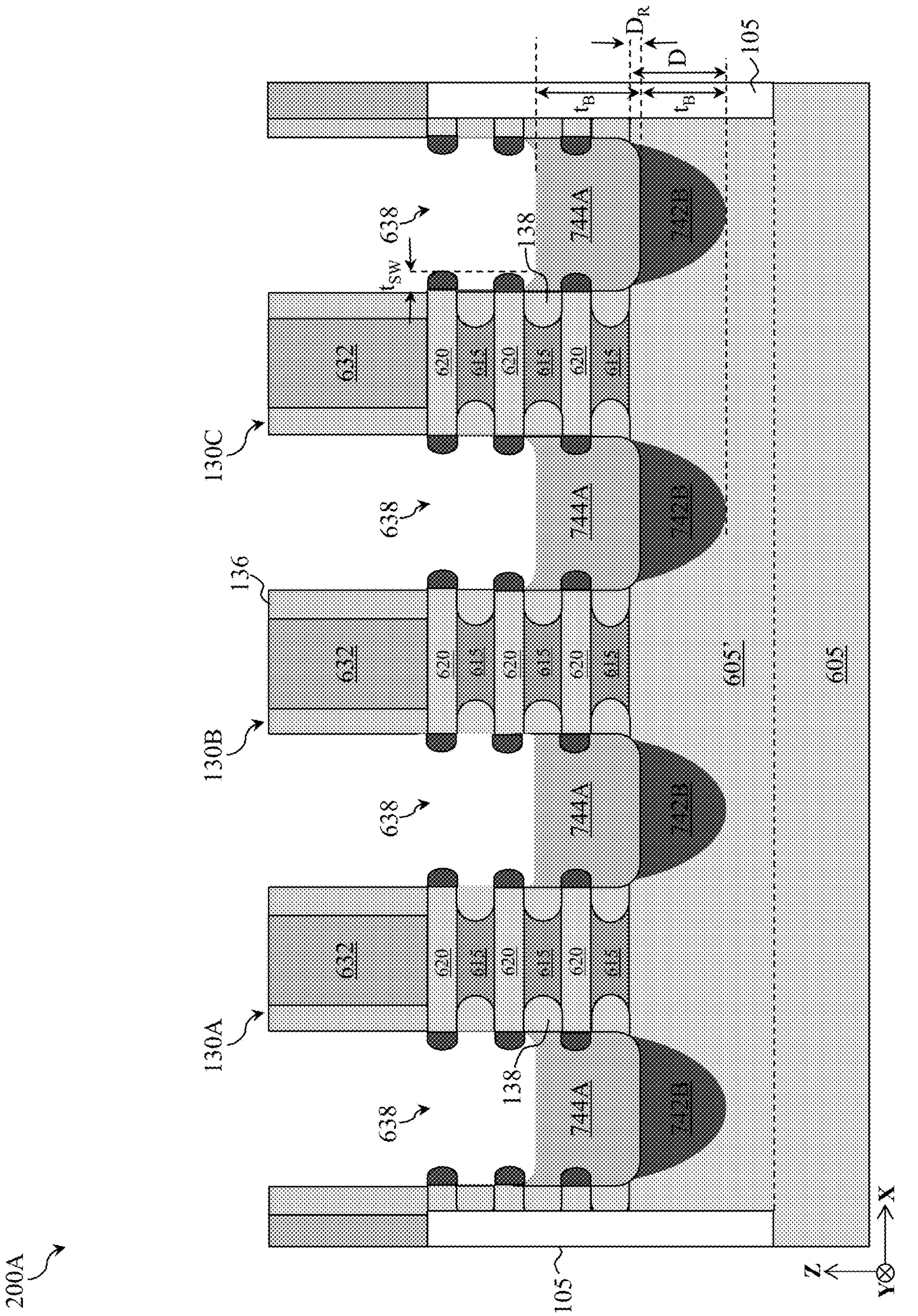
Figure 7E:
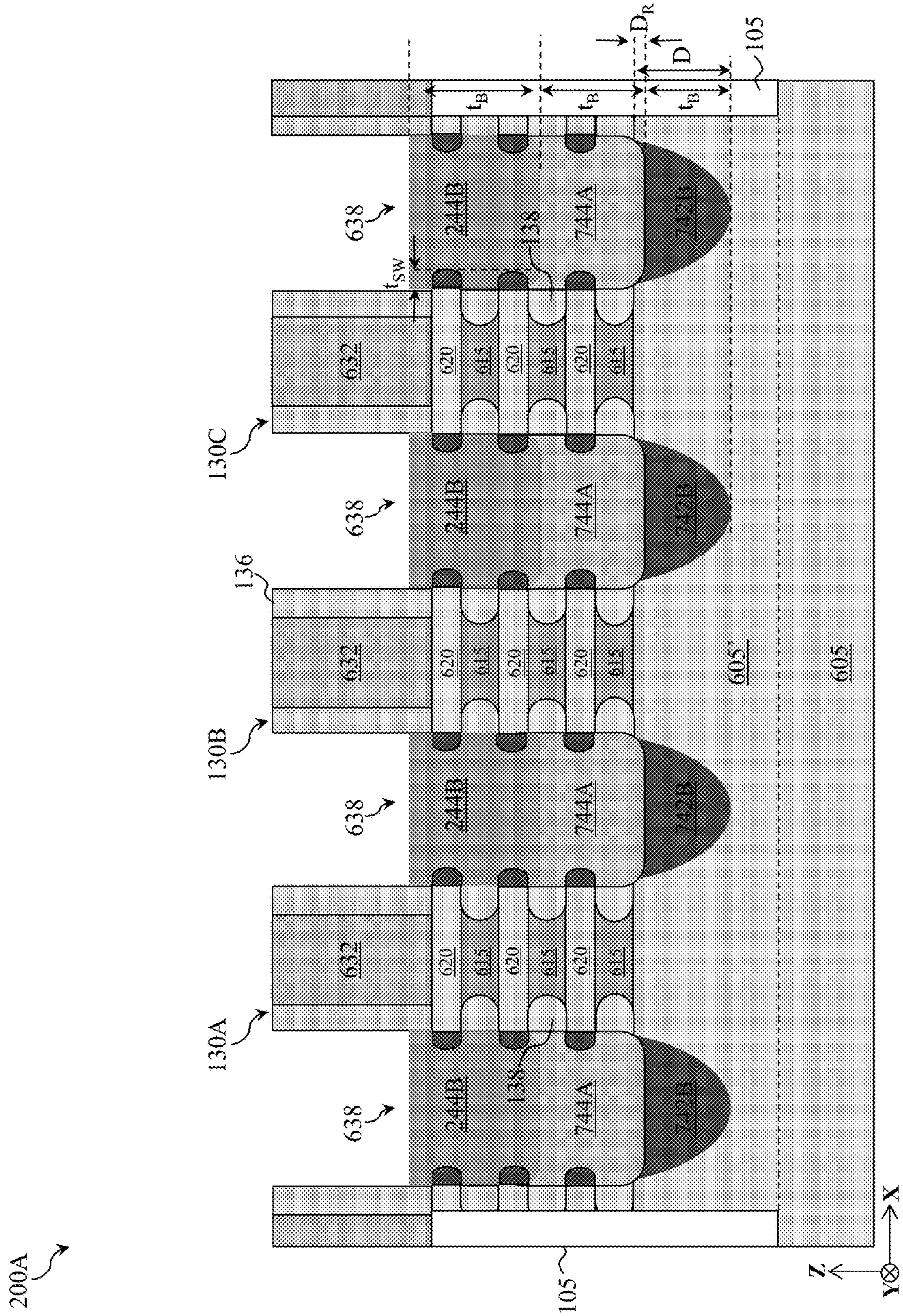
Figure 7F:
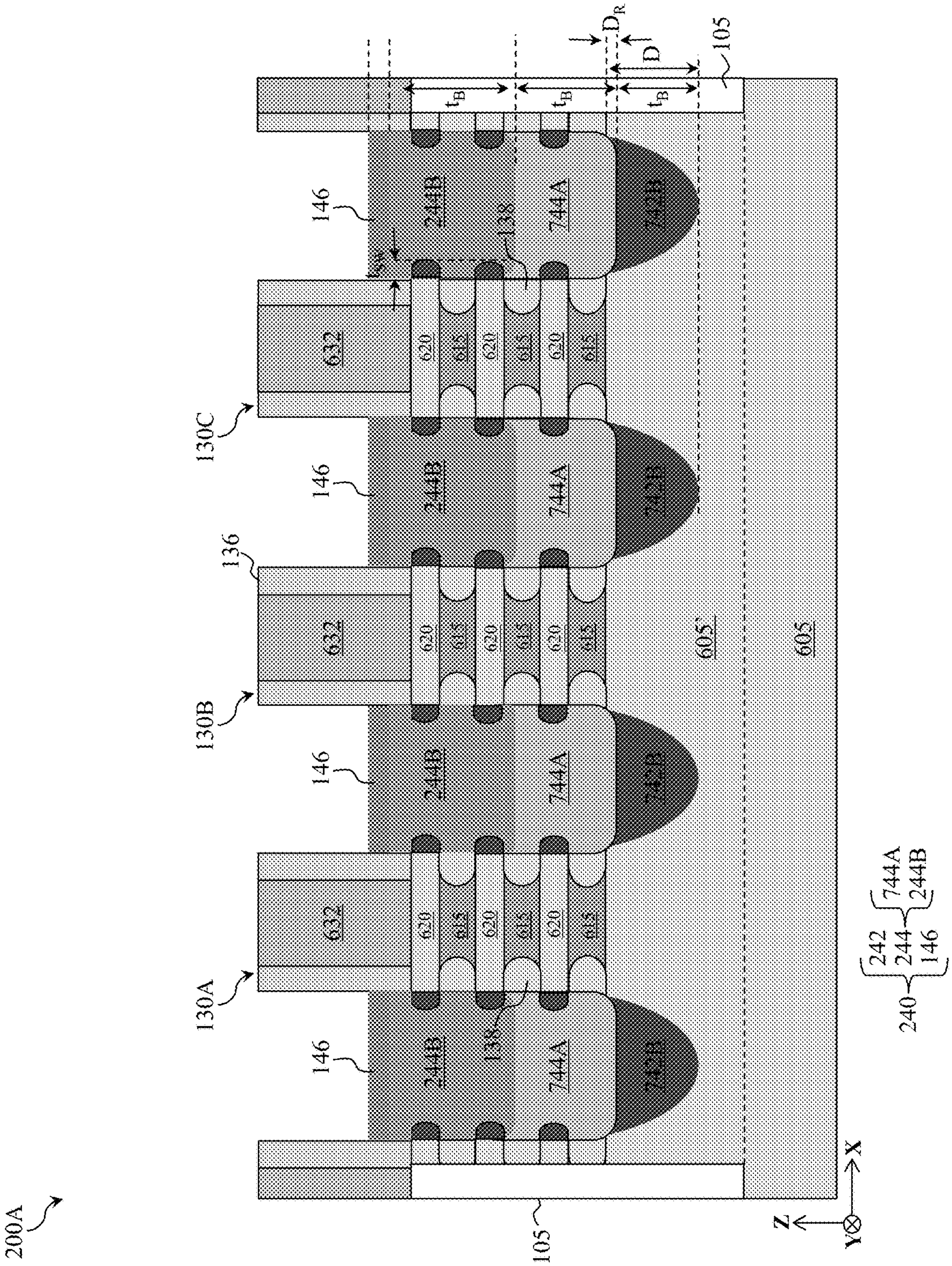
Figure 7G:
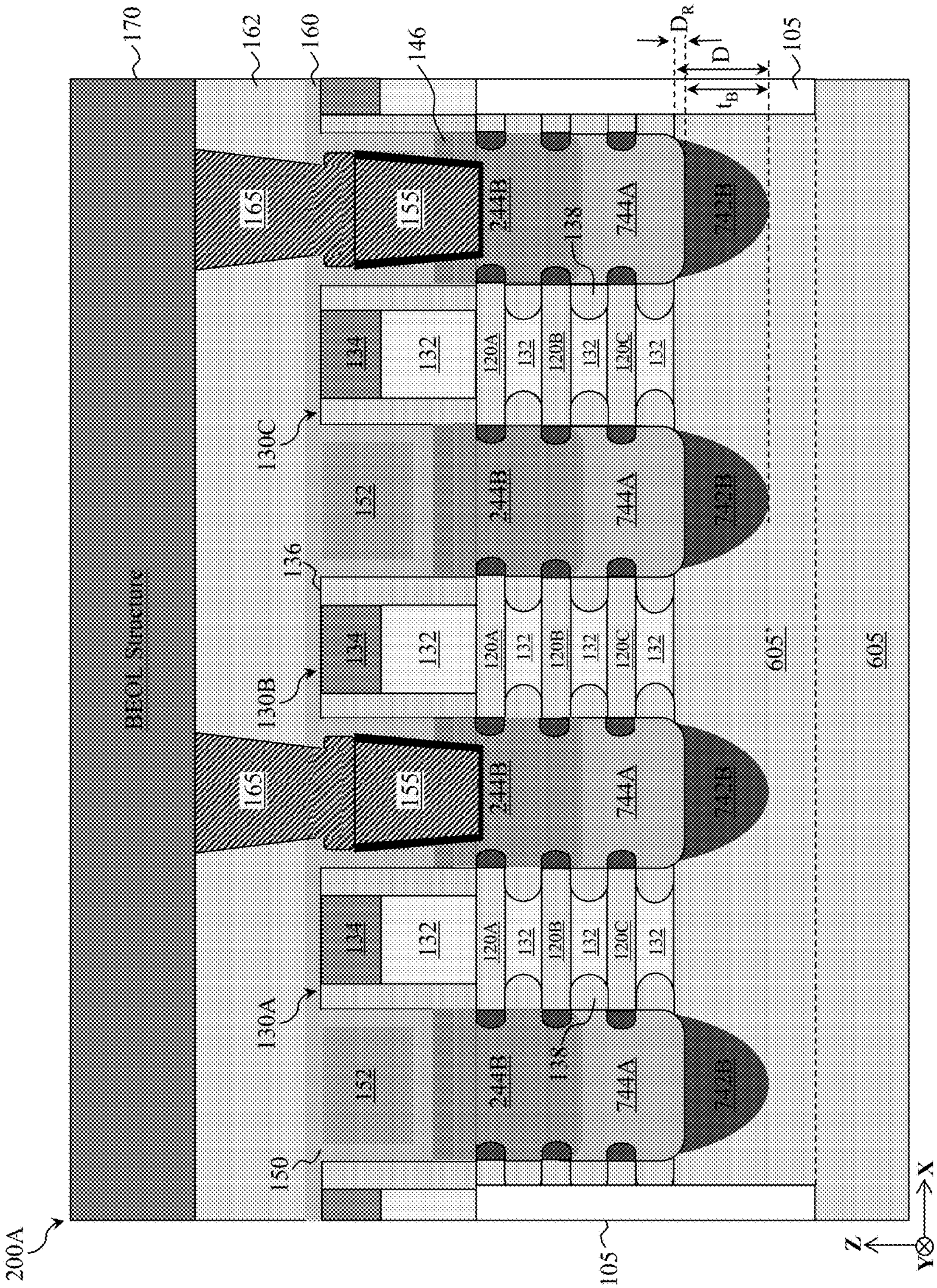
Figure 7H:
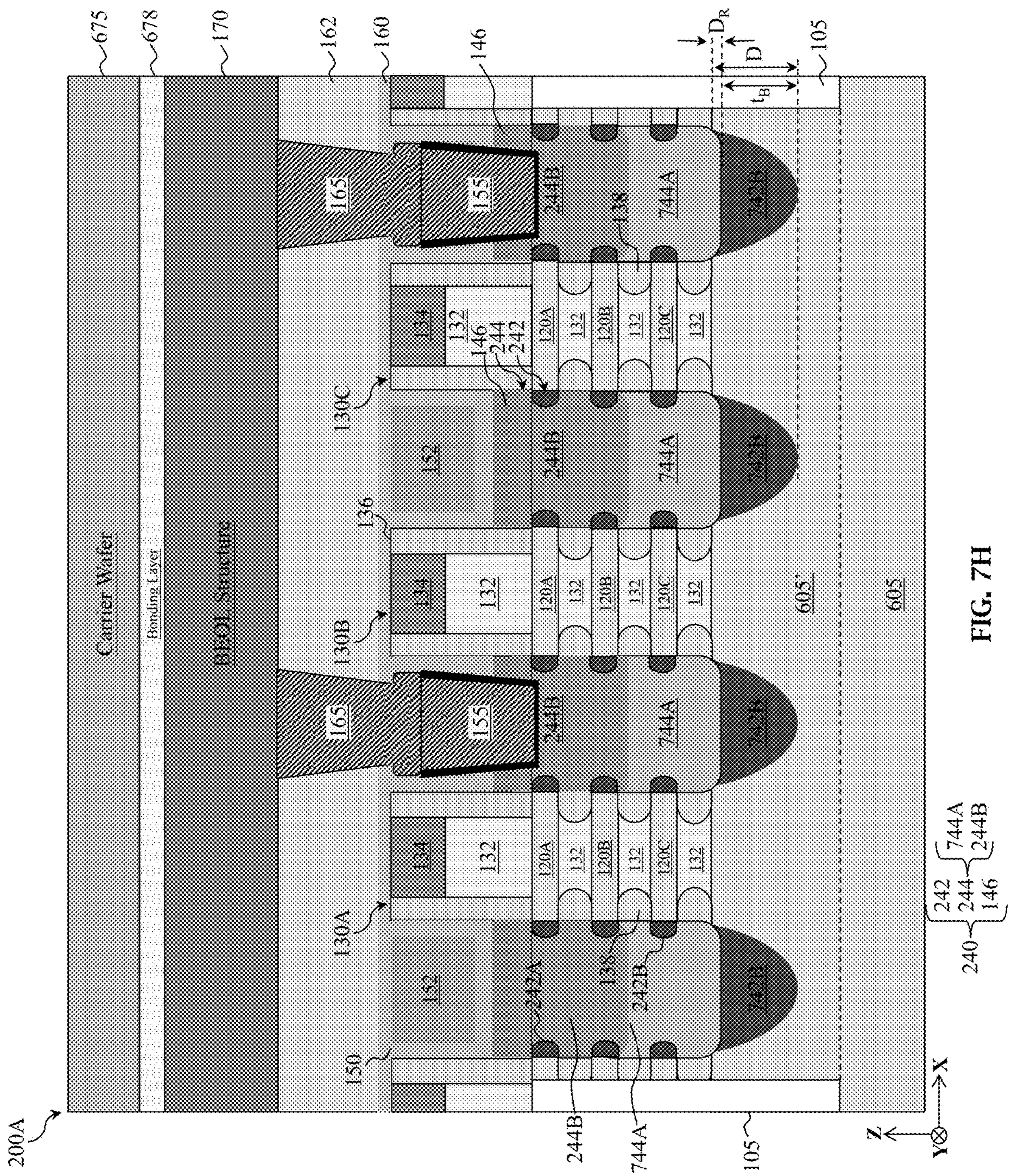
Figure 7I:
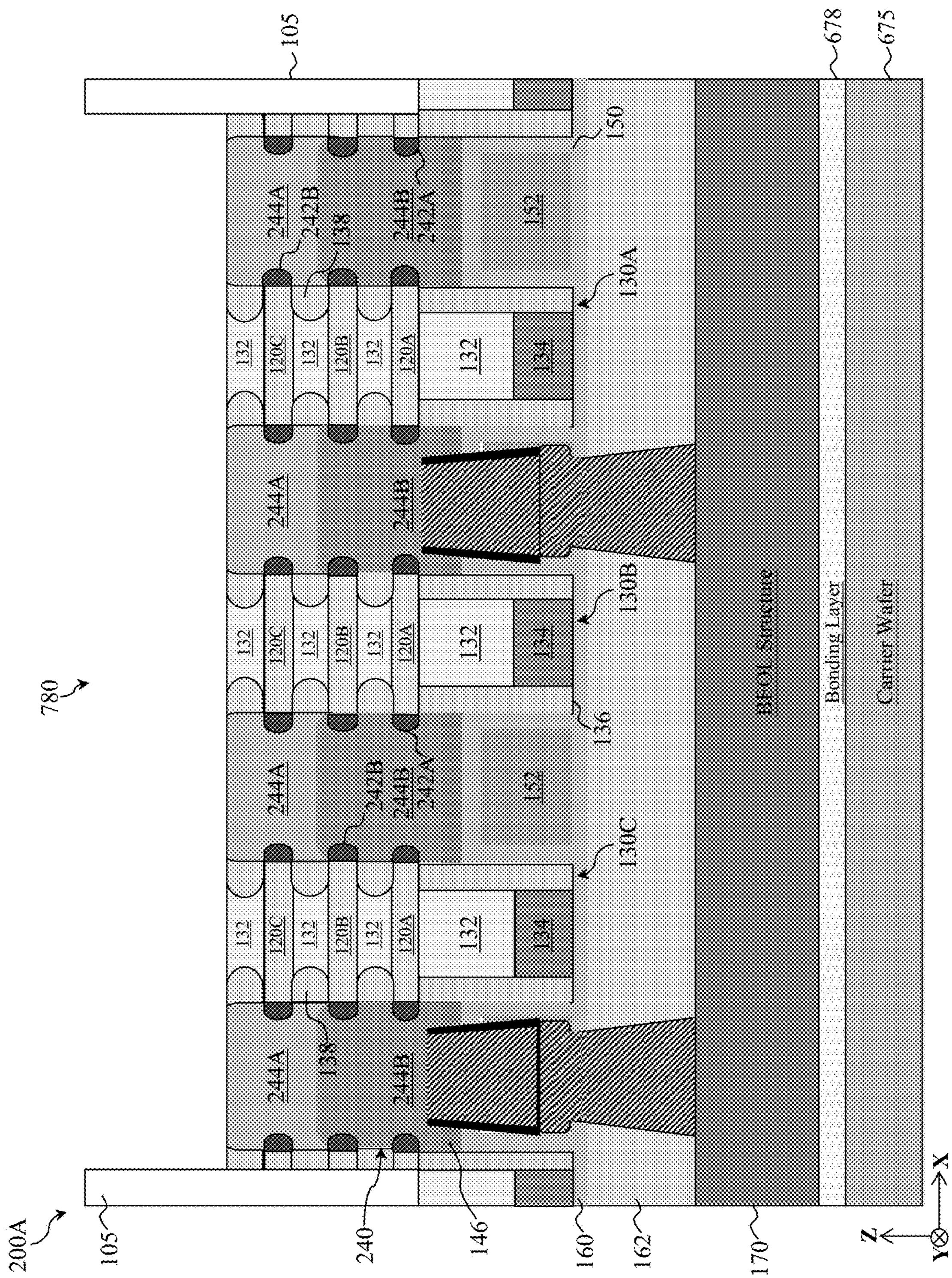
Figure 7J:
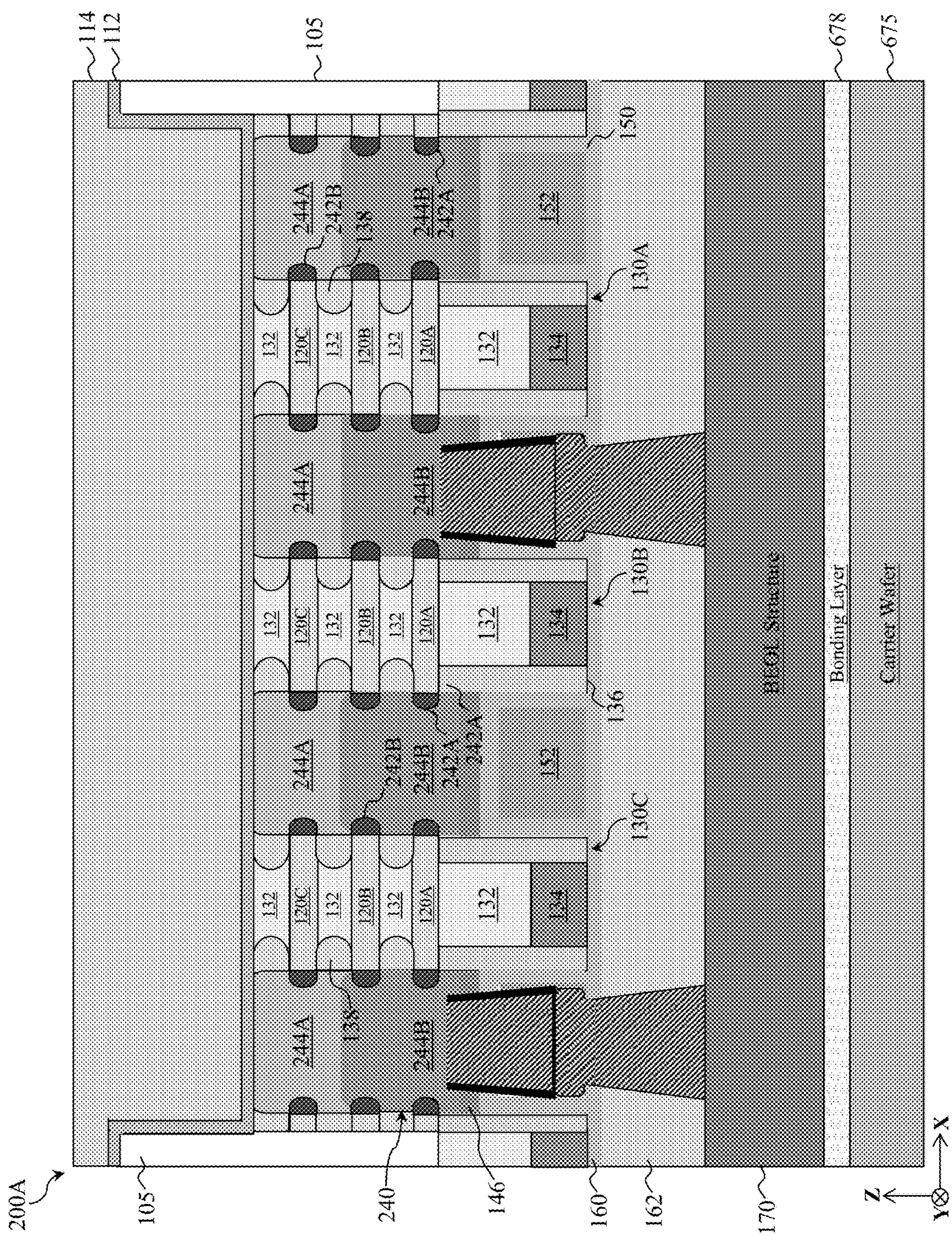
Figure 7K:
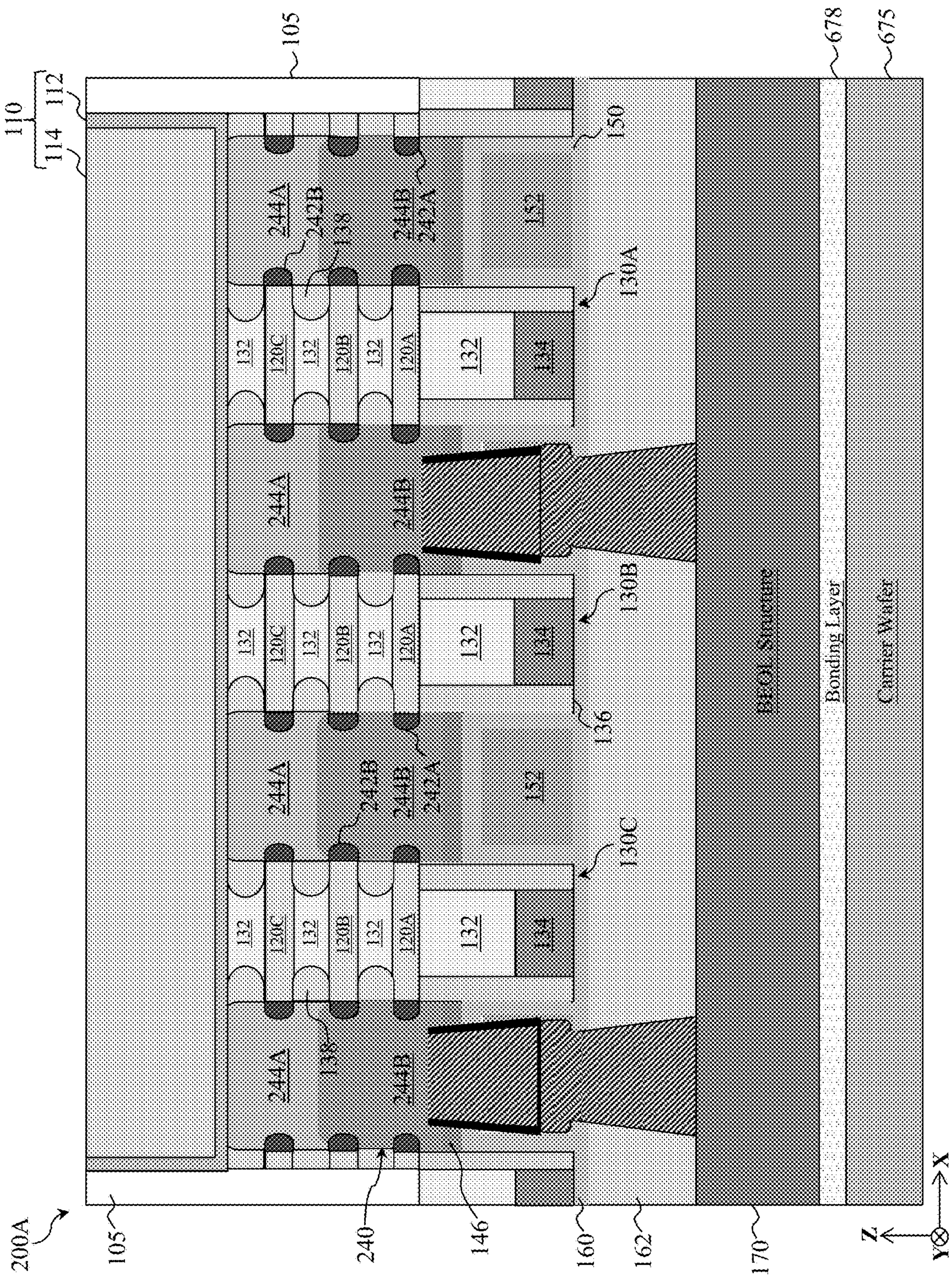
Figure 7L:
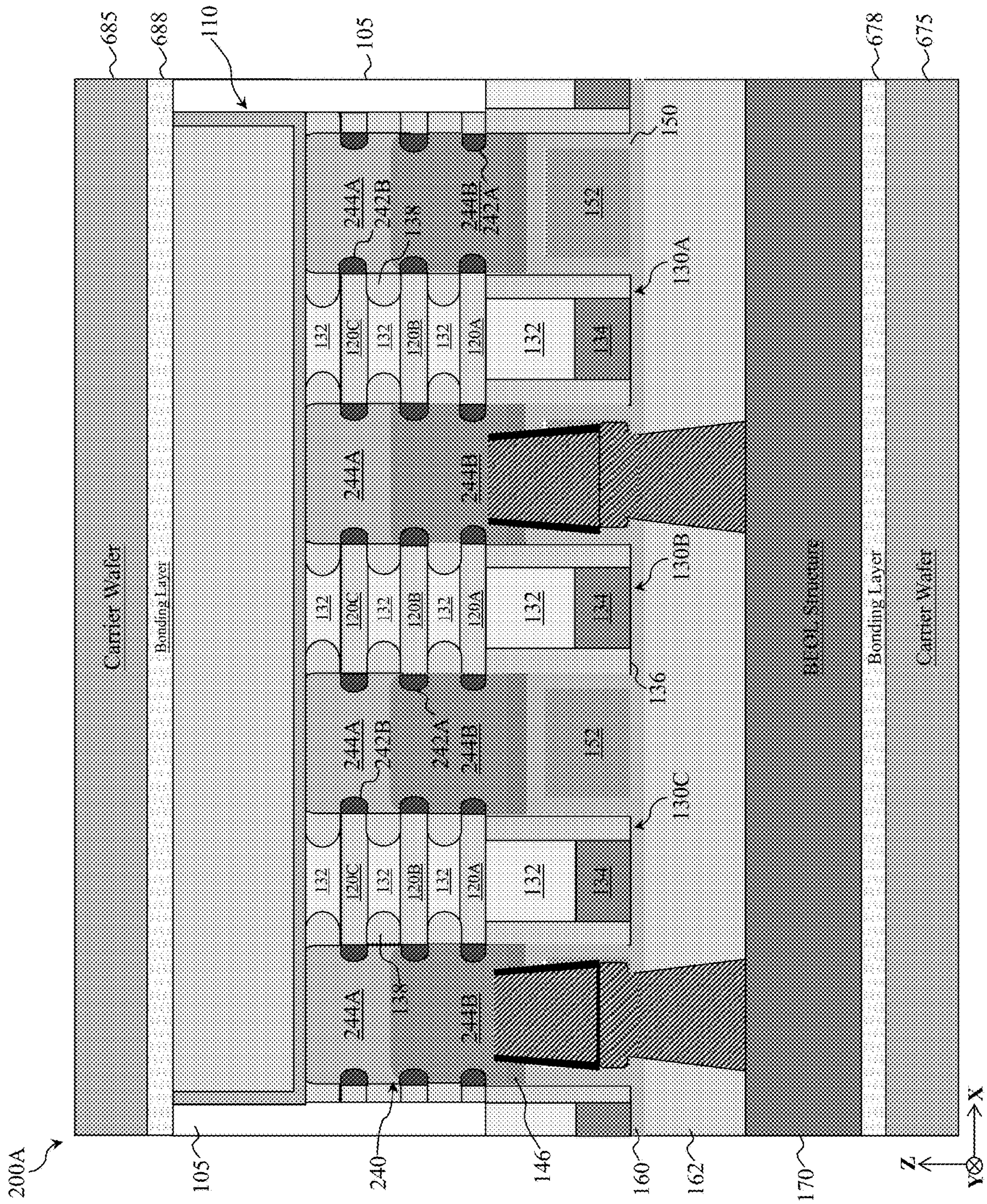
Figure 7M:
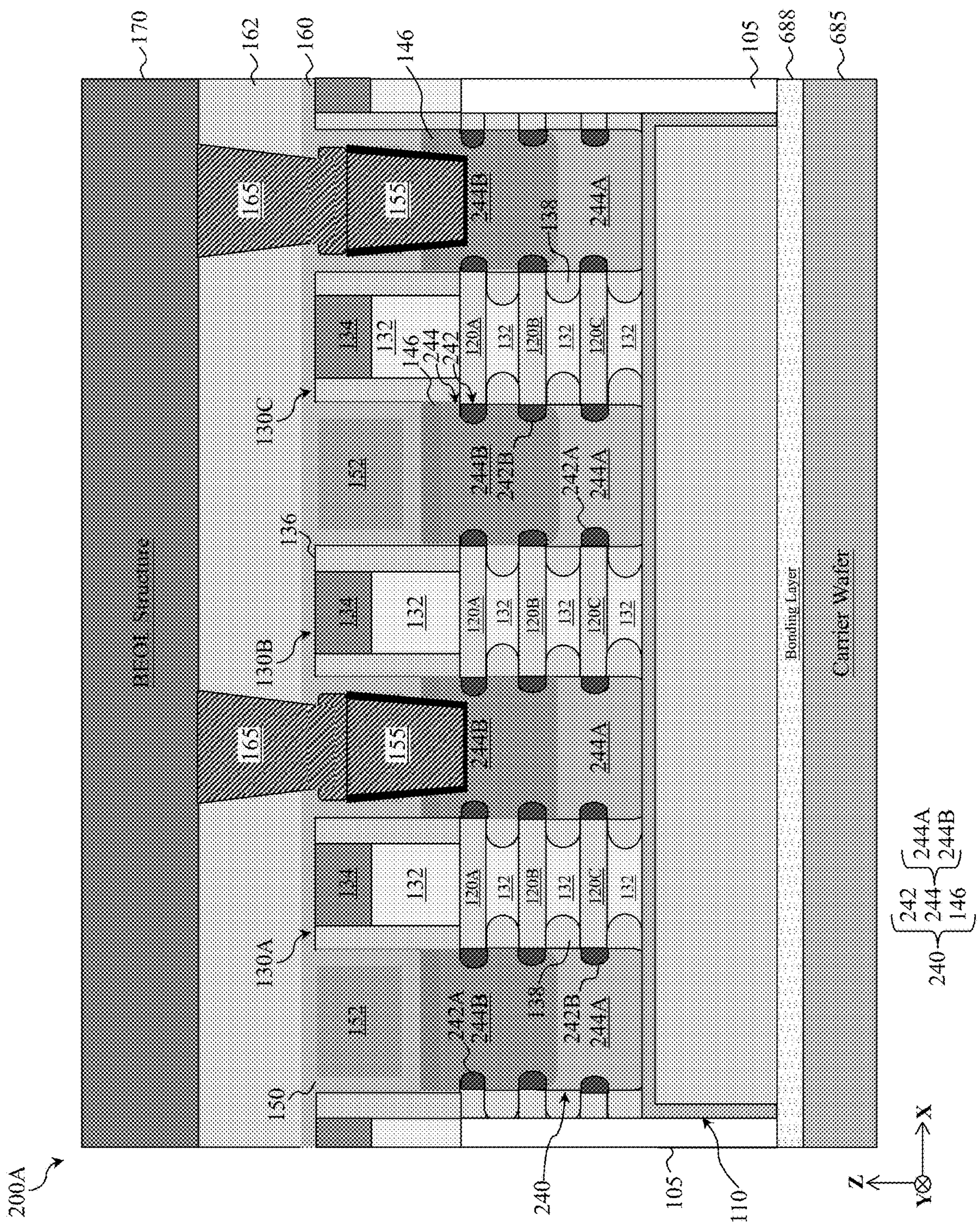

In some embodiments, method 500 is implemented to fabricate multigate device 200A of FIG. 2A and/or multigate device 200B of FIG. 2B. For example, FIGS. 7A-7M are fragmentary perspective views of a multigate device, such as multigate device 200A depicted in FIG. 2A, at various fabrication stages, such as those associated with the method in FIG. 5, according to various aspects of the present disclosure. Fabrication of multigate device 200A in FIGS. 7A-7M is similar in many respects to fabrication of multigate device 100A in FIGS. 6A-6M, except fabrication of multigate device 200A (and multigate device 200B) includes forming epitaxial source/drain structures 240 instead of epitaxial source/drain structures 140. For example, fabrication begins with receiving a multigate device precursor 600 at block 510 (FIG. 7A) and forming source/drain recesses 638 in source/drain regions of semiconductor layer stack 610 at block 520 (FIG. 7B) in a manner similar to that described above with reference to FIG. 6A and FIG. 6B. Instead of forming epitaxial layers 642 and epitaxial layers 144, fabrication of multigate device 200A proceeds with epitaxially growing epitaxial layers 742 (i.e., first semiconductor layers) in source/drain recesses 638 at block 530 (FIG. 7C) and epitaxially growing epitaxial layers 244 (i.e., second semiconductor layers), such as epitaxial sub-layers 744A and epitaxial sub-layers 244B, over the first semiconductor layers in source/drain recesses 638 at block 540 (FIG. 7D and FIG. 7E). In FIG. 7C, epitaxial layers 742 do not (or minimally) form and/or grow) on dielectric surfaces (e.g., inner spacers 138 and/or gate spacers 136), such that epitaxial layers 742 have bottom epitaxial portions 742B having thickness $t_B$, epitaxial sidewalls 242A having thickness $t_{SW}$, and epitaxial sidewalls 242B having thickness $t_{SW}$. In such embodiments, epitaxial growth conditions, such as epitaxial growth precursors, epitaxial growth temperature, epitaxial growth time, epitaxial growth pressure, and/or other suitable epitaxial growth parameter, can be tuned to achieve epitaxial growth on semiconductor surfaces with minimal (to no) growth on dielectric surfaces. In FIG. 7D and FIG. 7E, epitaxial sub-layers 744A and/or epitaxial layers 244B form around epitaxial sidewalls 242A and/or epitaxial sidewalls 242B, such that epitaxial sub-layers 744A and/or epitaxial layers 244B fill in gaps (spaces)

between epitaxial sidewalls 242A, gaps between epitaxial sidewalls 242B, and/or gaps between epitaxial sidewalls 242A and epitaxial sidewalls 242B. Fabrication proceeds with epitaxially growing epitaxial layers 146 over epitaxial layers 244 (FIG. 7F) and forming an MLI feature of multigate device 200A (FIG. 7G) in a manner similar to that described above with reference to FIG. 6F and FIG. 6G. Then, fabrication proceeds with replacing semiconductor substrate 605 with dielectric substrate 110 at block 550 in FIGS. 7H-7M in a manner similar to that described above with reference to FIGS. 6H-6M. For example, fabrication proceeds with forming carrier layer 675 and bonding layer 678 over a frontside of multigate device 200A (FIG. 7H) and removing semiconductor substrate 605, substrate portion 605', and portions of epitaxial source/drain structures 240 disposed in substrate portion 605' (e.g., bottom epitaxial portions 742B and portions of epitaxial sub-layers 744A), thereby forming epitaxial sub-layers 244A of epitaxial source/drain structures 240 and forming a trench 780 having sidewalls formed by isolation features 105 and bottoms formed by metal gates 132, inner spacers 138, and epitaxial sub-layers 244A (FIG. 7I). Fabrication can then proceed with forming dielectric substrate 110 in trench 780 (FIG. 7J and FIG. 7K), forming carrier layer 685 and bonding layer 688 over a backside of multigate device 200A (FIG. 7L), and removing carrier layer 675 and bonding layer 678 from the frontside of multigate device 200A (FIG. 7M). FIGS. 7A-7M have been simplified for the sake of clarity to better understand the inventive concepts of the present disclosure.

Figure 8A:
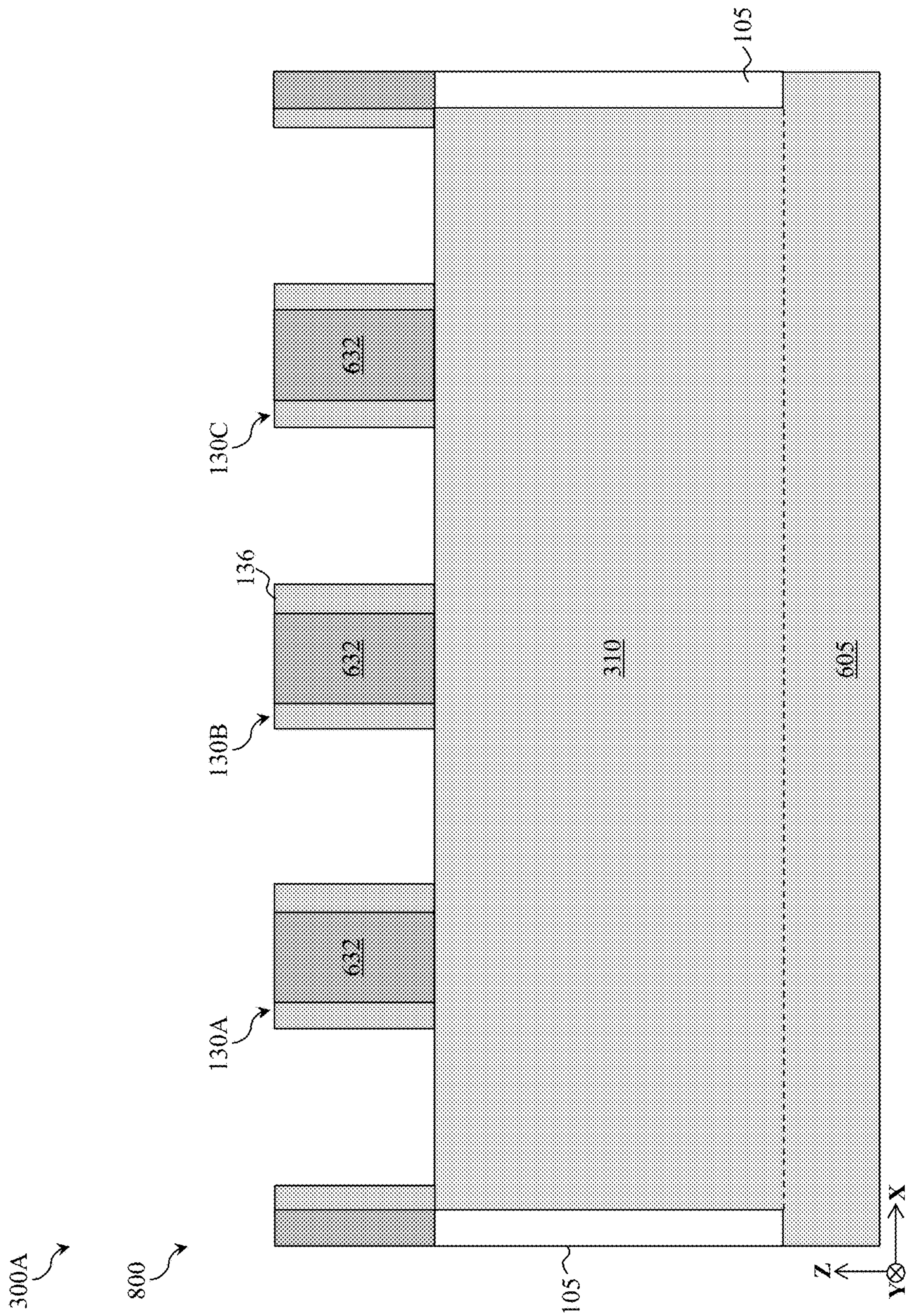
FIGS. 8A-8M are fragmentary perspective views of a multigate device, such as the multigate device depicted in FIG. 3A or FIG. 3B, at various fabrication stages, such as those associated with the method in FIG. 5, according to various aspects of the present disclosure.
Figure 8B:
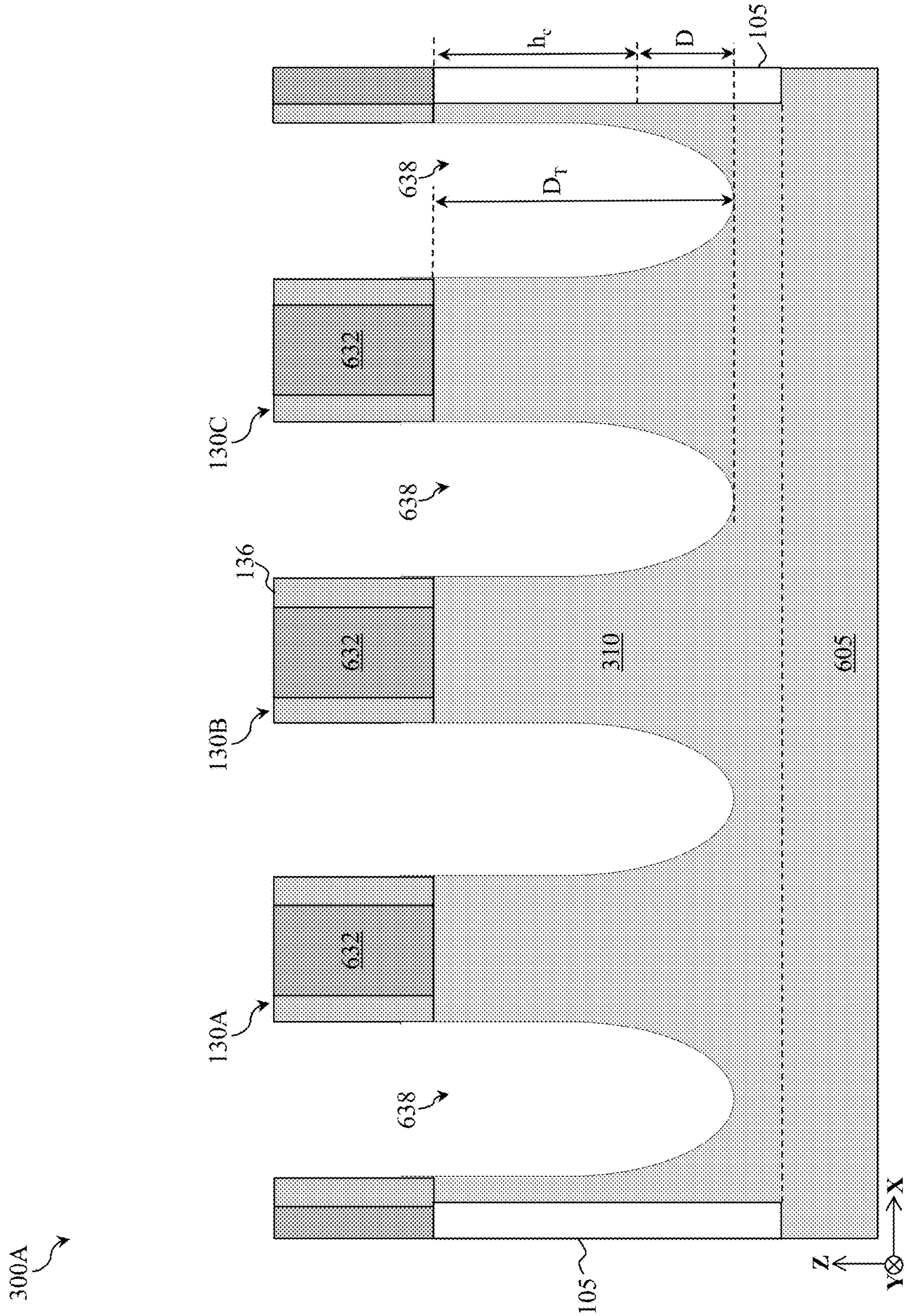
Figure 8C:
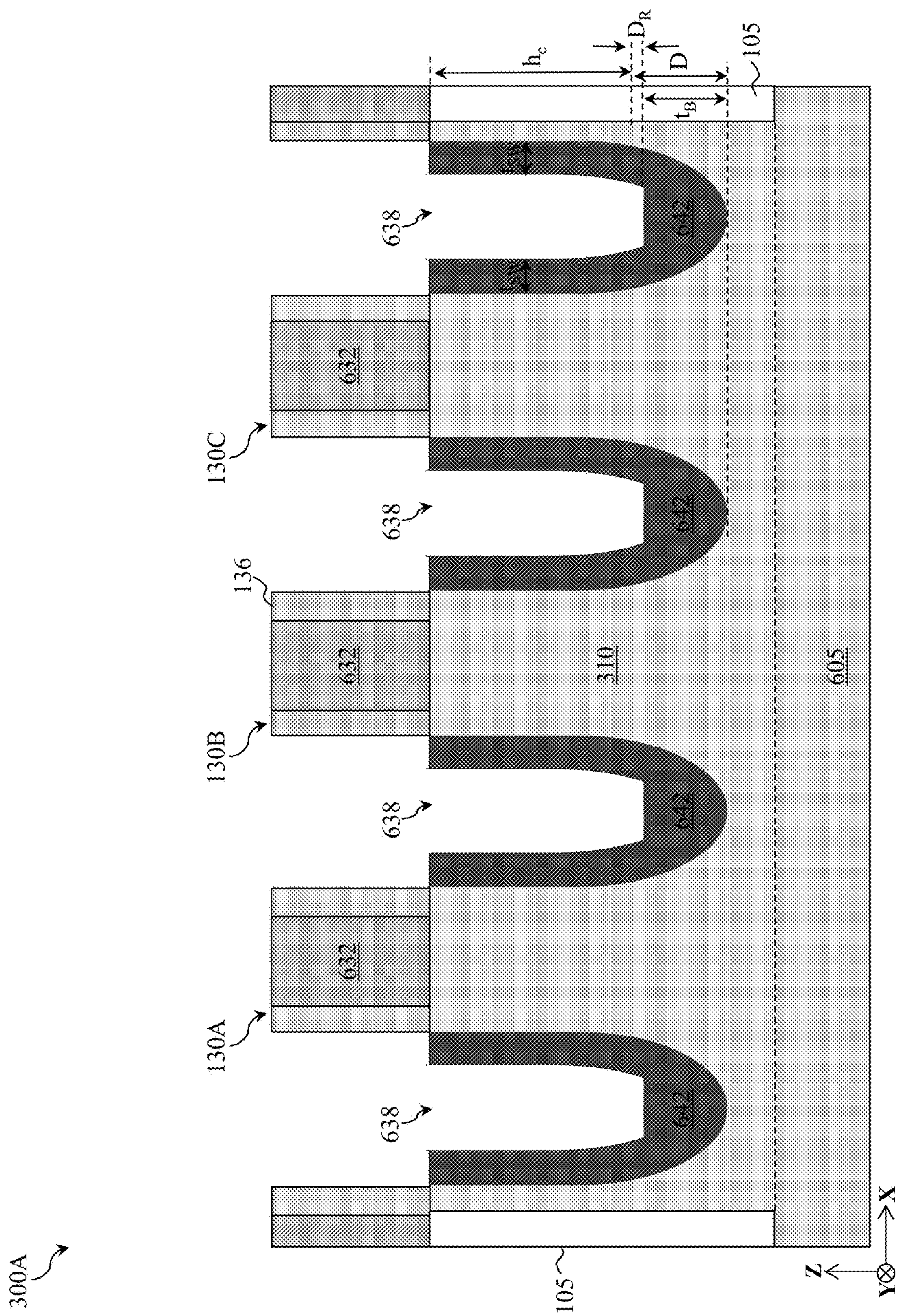
Figure 8D:
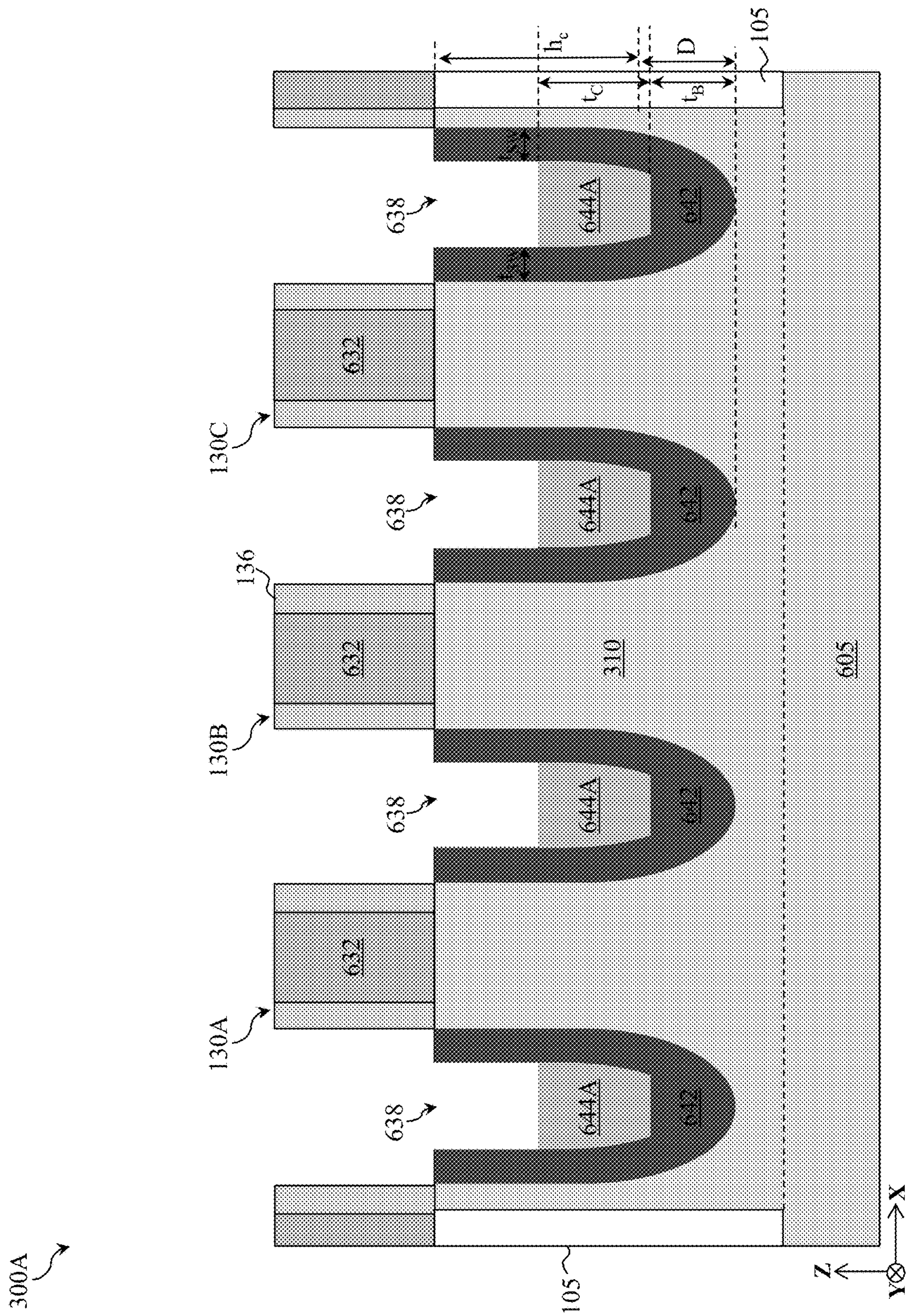
Figure 8E:
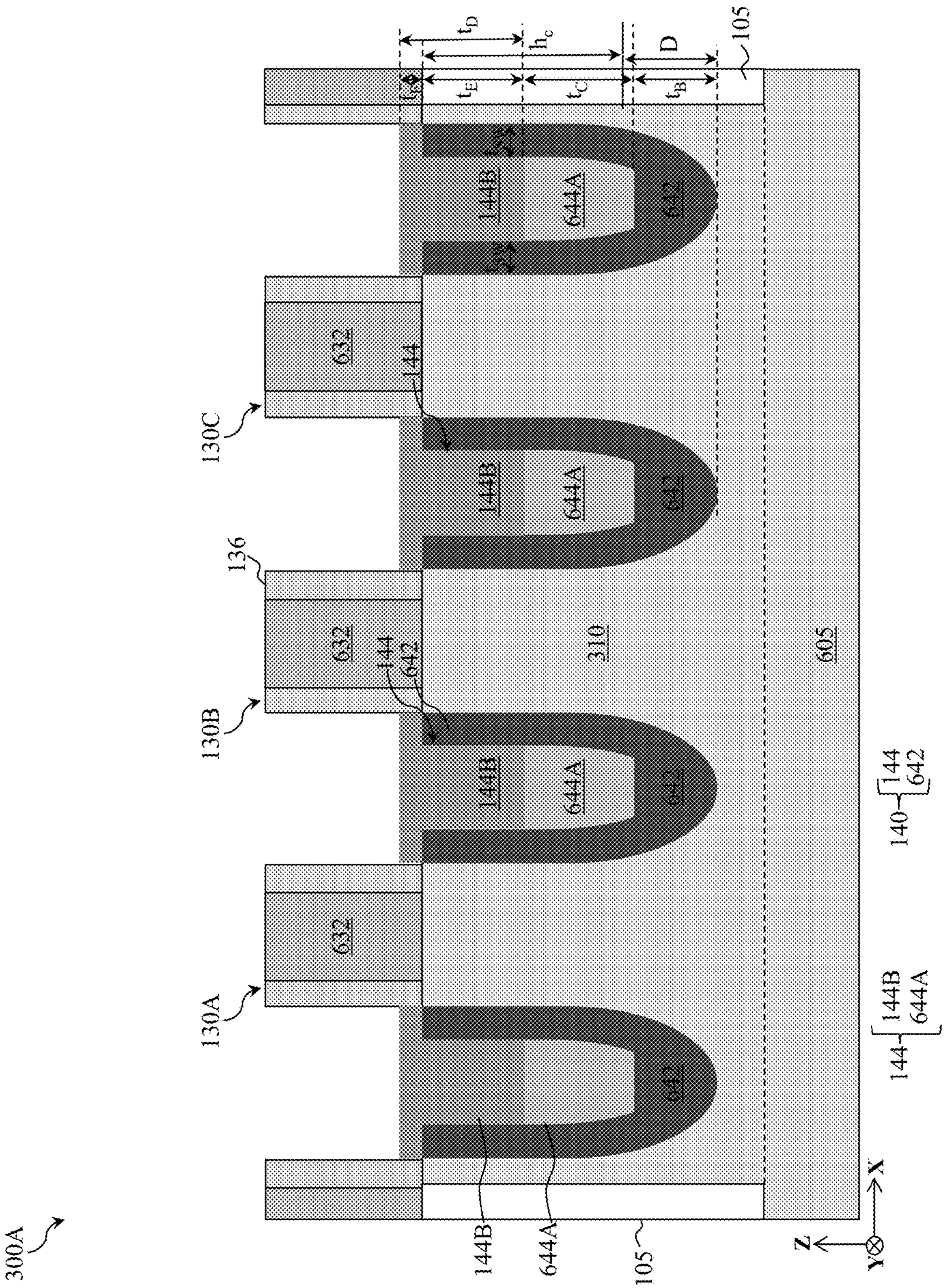
Figure 8F:
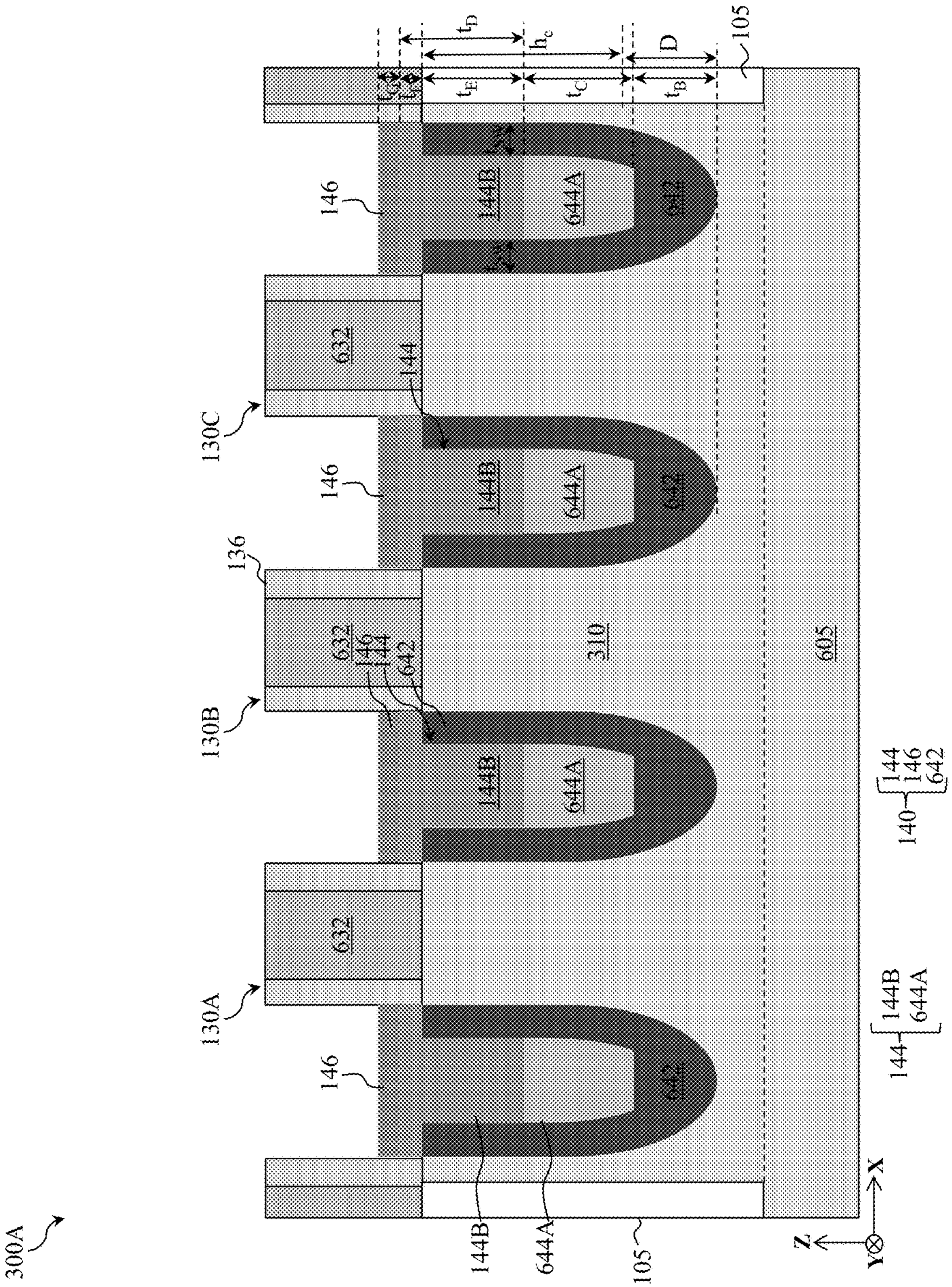
Figure 8G:
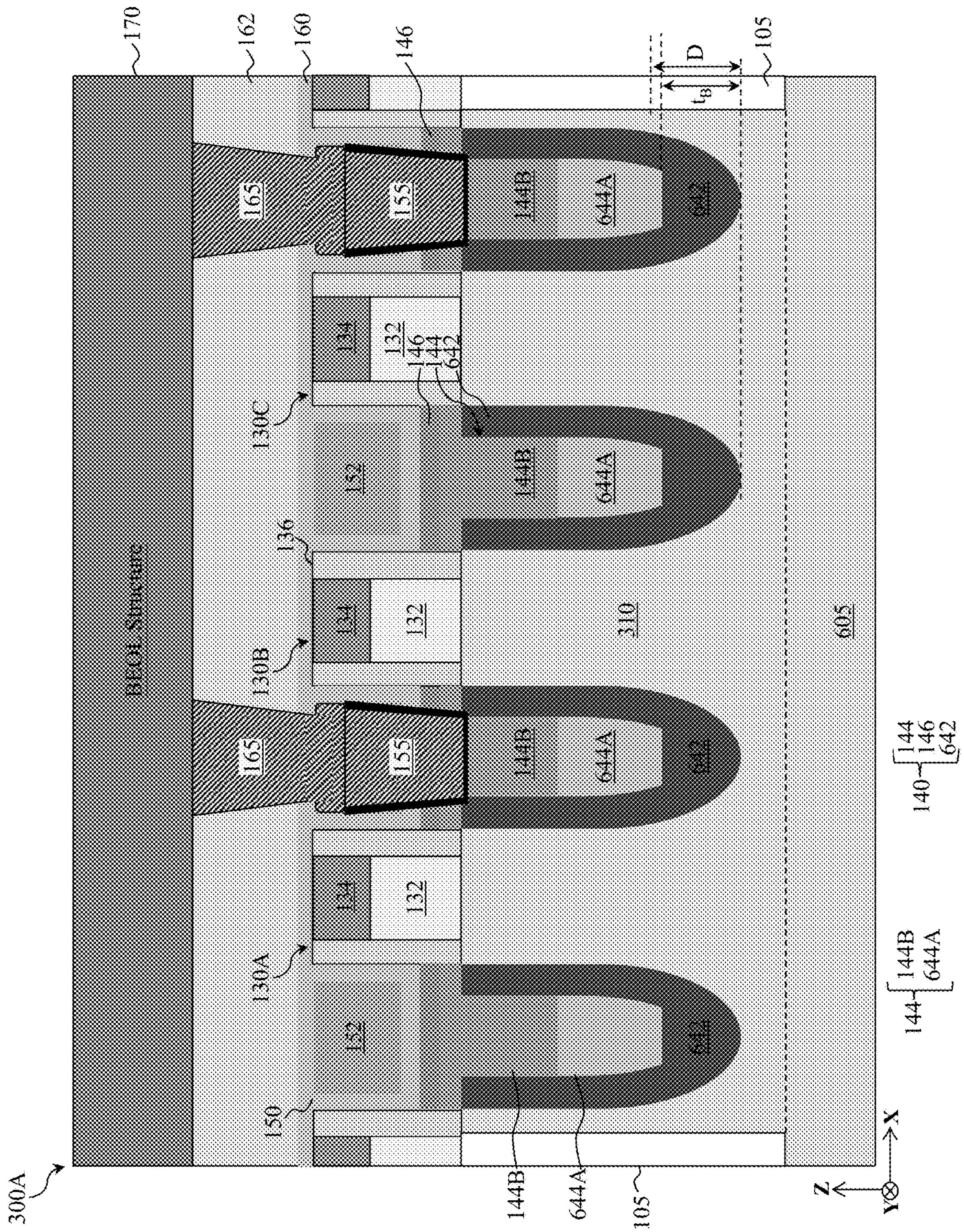
Figure 8H:
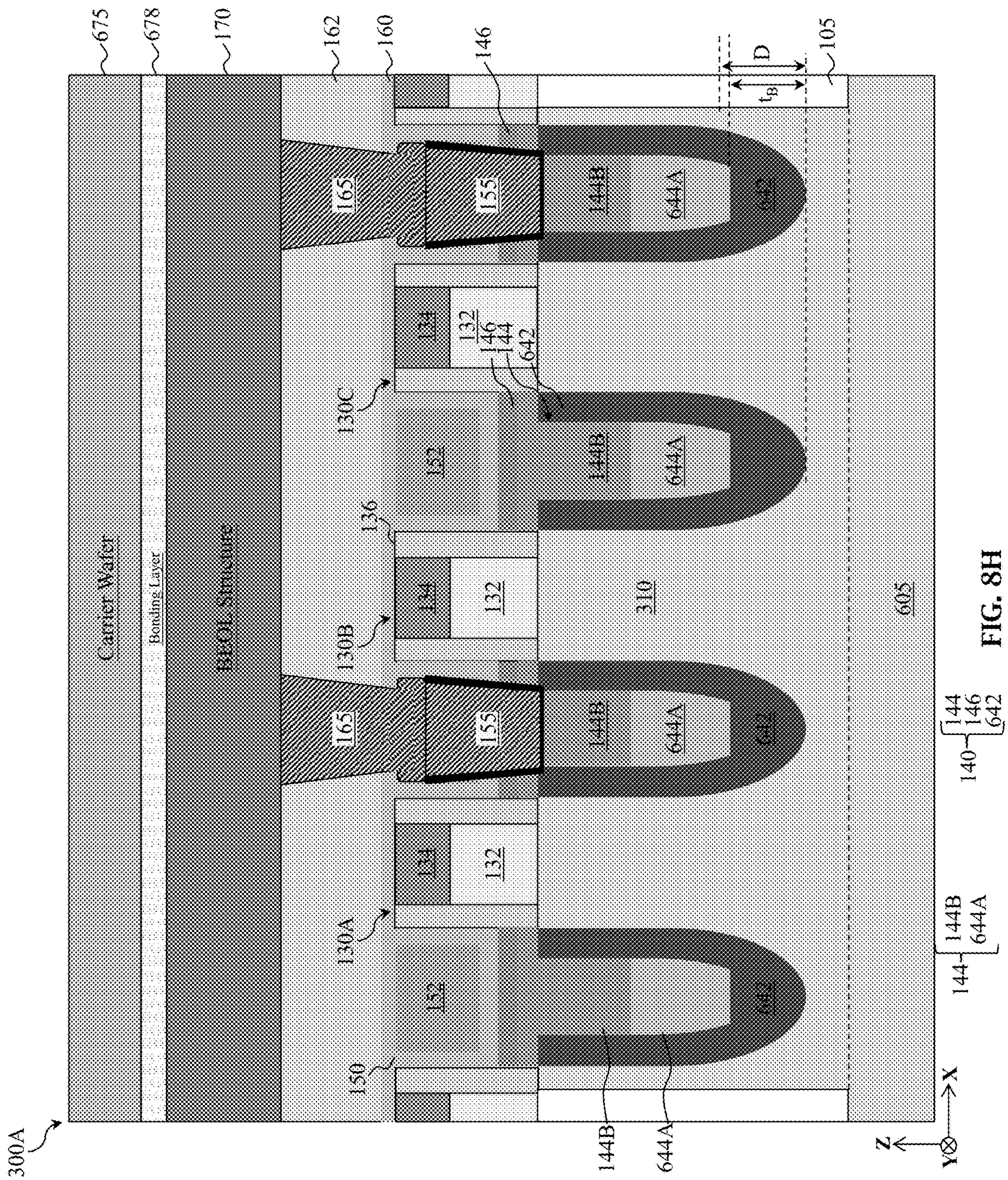
Figure 8I:
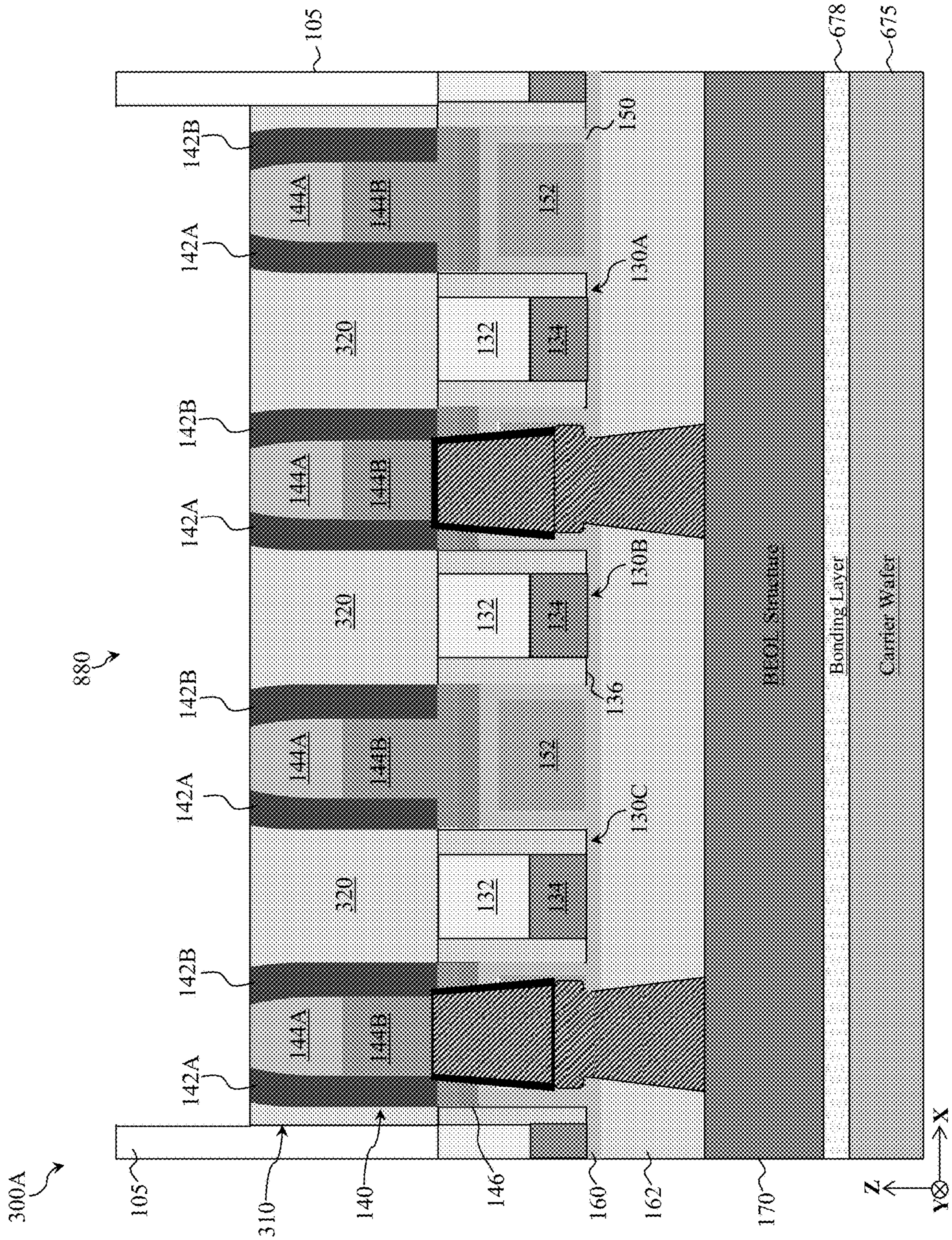
Figure 8J:
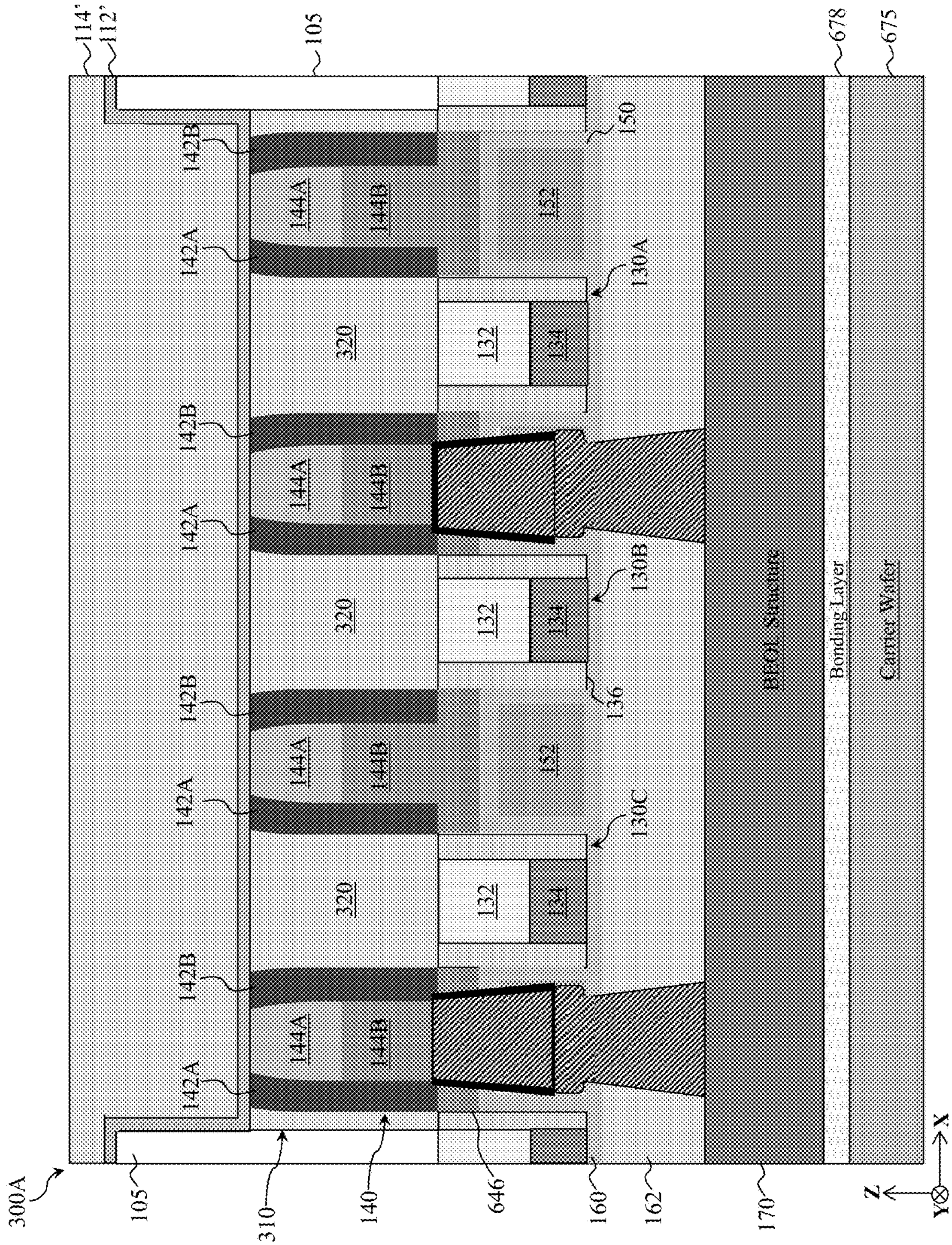
Figure 8K:
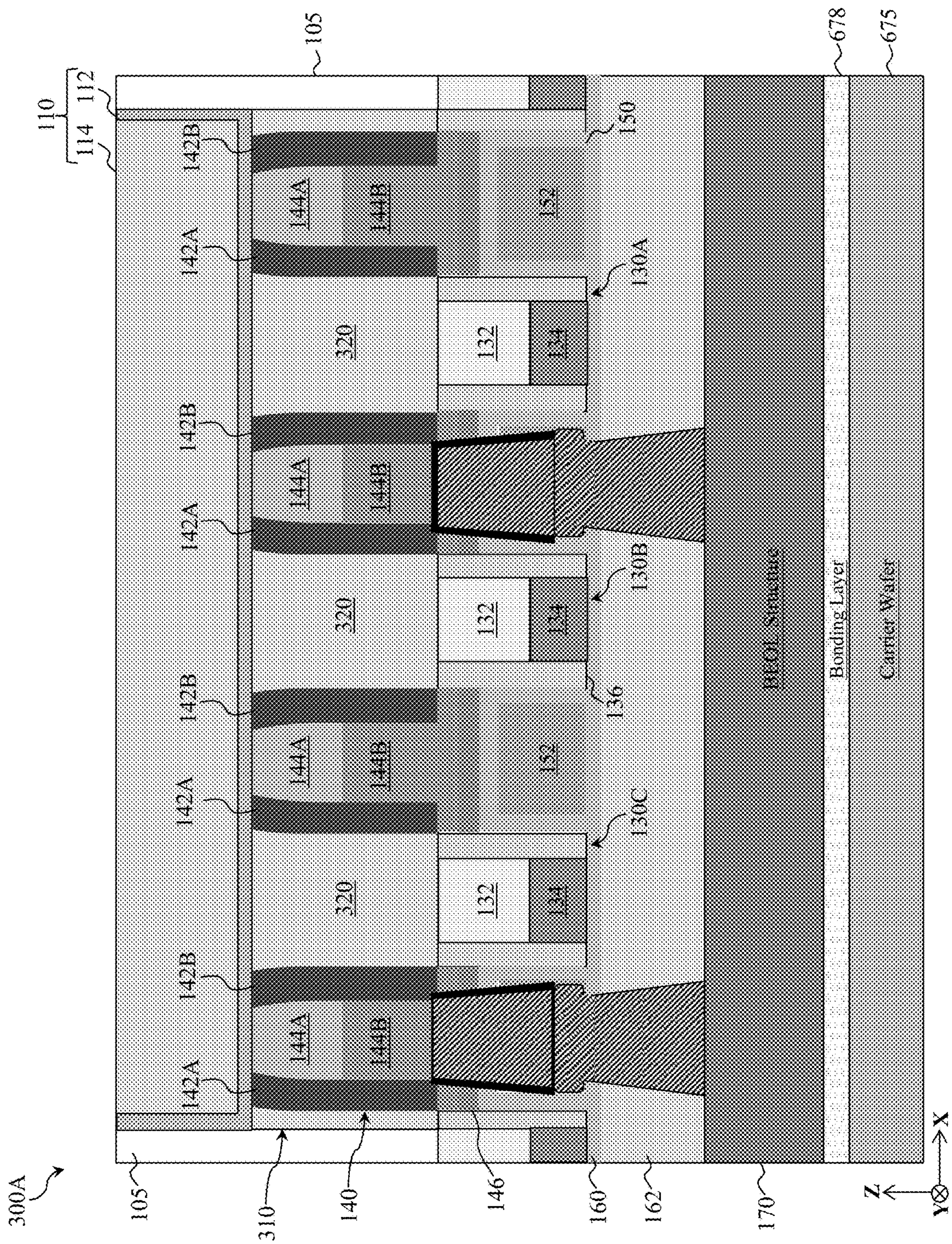
Figure 8L:
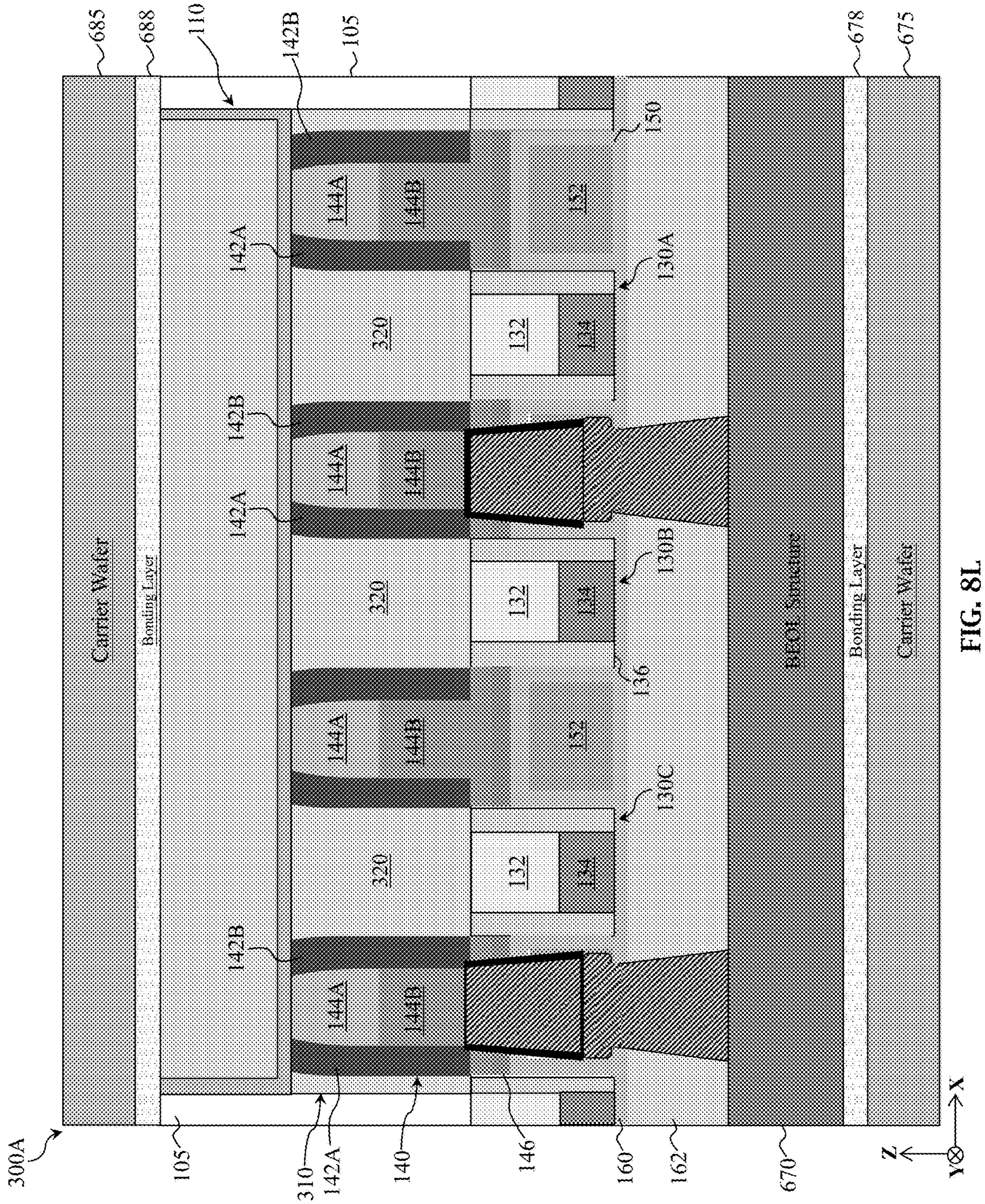
Figure 8M:
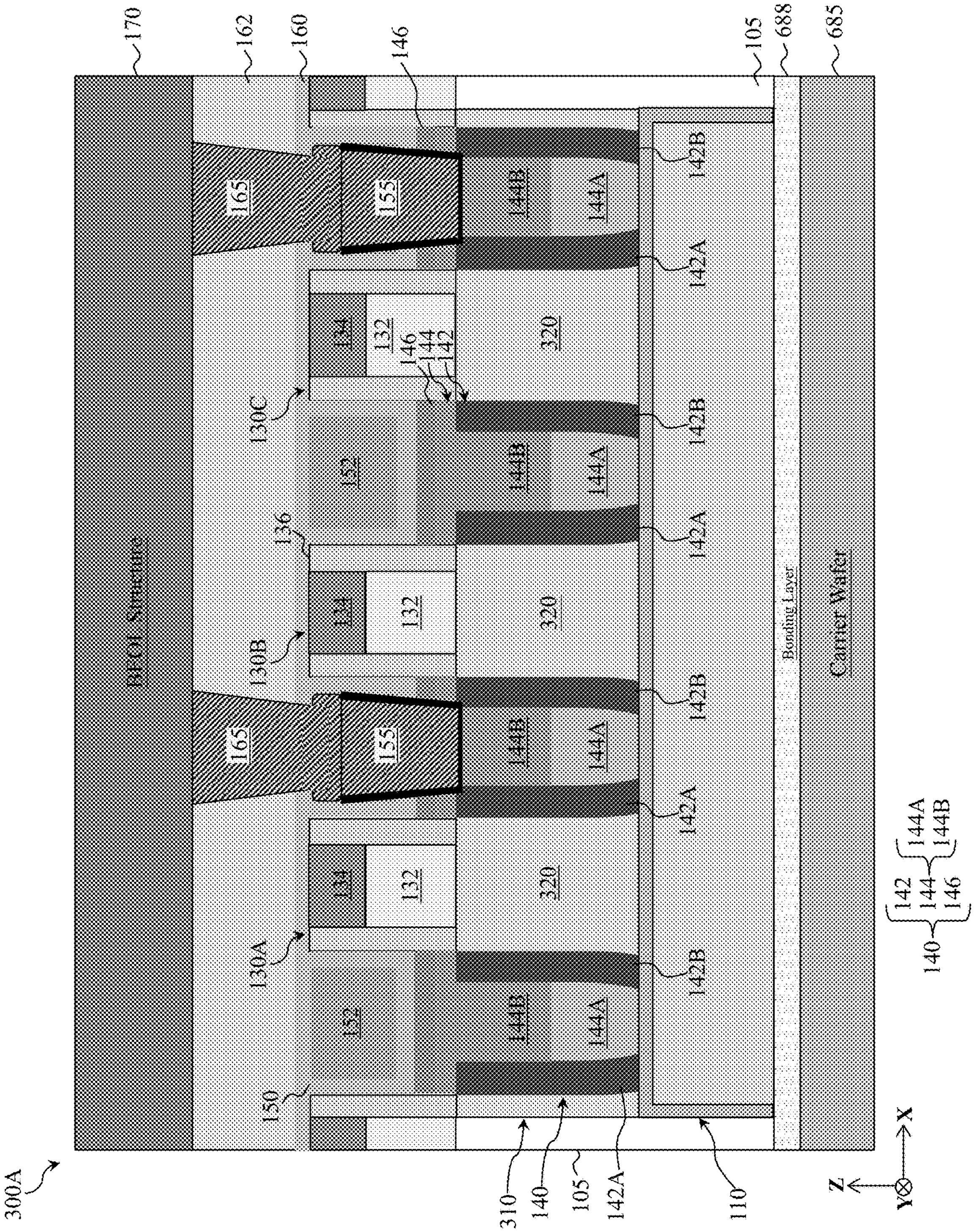

In some embodiments, method 500 is implemented to fabricate multigate device 300A of FIG. 3A and/or multigate device 300B of FIG. 3B. For example, FIGS. 8A-8M are fragmentary perspective views of a multigate device, such as multigate device 300A depicted in FIG. 3A, at various fabrication stages, such as those associated with the method in FIG. 5, according to various aspects of the present disclosure. Fabrication of multigate device 300A in FIGS. 8A-8M is similar in many respects to fabrication of multigate device 100A in FIGS. 6A-6M, except fabrication of multigate device 300A (and multigate device 300B) begins with receiving a multigate device precursor 800 at block 510 that includes fin 310 (also referred to as a fin structure) extending from semiconductor substrate 605, instead of a semiconductor layer stack 610. Then, fabrication proceeds with forming source/drain recesses 638 in source/drain regions of fin 310 at block 520 (FIG. 8B), epitaxially growing epitaxial layers 642 (i.e., first semiconductor layers) in source/drain recesses 638 at block 530 (FIG. 8C), epitaxially growing epitaxial layers 144 (i.e., second semiconductor layers), such as epitaxial sub-layers 644A and epitaxial sub-layers 144B, over the first semiconductor layers in source/drain recesses 638 at block 540 (FIG. 8D and FIG. 8E), epitaxially growing epitaxial layers 146 over epitaxial layers 144 (FIG. 8F), and forming an MLI feature of multigate device 300A (FIG. 8G) in a manner similar to that described above with reference to FIGS. 6B-6G. In the depicted embodiment, in FIG. 8B, total depth $D_T$ of source/drain recesses 638 is greater than a desired channel height $h_c$ of semiconductor layers 320 (i.e., fin channels), such that source/drain recesses 638 extend depth D into semiconductor substrate 605 (here, a portion of fin 310 that is below desired channel height $h_c$), and in FIG. 8C, bottom thickness $t_b$ is less than depth D, such that remaining source/drain recesses 638 extend remaining depth $D_R$ below desired channel height $h_c$. Then, fabrication proceeds with replacing semiconductor substrate 605 with dielectric substrate 110 at block 550 in FIGS. 8H-8M in a manner similar to that described above with reference to FIGS. 6H-6M. For example, fabrication proceeds with forming carrier layer 675 and bonding layer 678 over a frontside of multigate device 300A (FIG. 8H) and removing semiconductor substrate 605, any portion of fin 310 disposed below desired channel height $h_c$, and any portion of epitaxial source/drain structures 140 disposed below desired channel height $h_c$, thereby forming epitaxial sidewalls 142A, epitaxial sidewalls 142B, and epitaxial sub-layers 144A of epitaxial source/drain structures 140 and forming a trench 880 having sidewalls formed by isolation features 105 and bottoms formed by semiconductor layers 320, epitaxial sidewalls 142A, 142B, and epitaxial sub-layers 144A (FIG. 8I). Fabrication can then proceed with forming dielectric substrate 110 in trench 880 (FIG. 8J and FIG. 8K), forming carrier layer 685 and bonding layer 688 over a backside of multigate device 300A (FIG. 8L), and removing carrier layer 675 and bonding layer 678 from the frontside of multigate device 300A (FIG. 8M). FIGS. 8A-8M have been simplified for the sake of clarity to better understand the inventive concepts of the present disclosure.

Epitaxial source/drain structures for enhancing performance of multigate devices, such as fin-like field-effect transistors (FETs) or gate-all-around (GAA) FETs, and methods of fabricating the epitaxial source/drain structures, are disclosed herein. The present disclosure provides for many different embodiments. An exemplary device includes a dielectric substrate. The device further includes a channel layer, a gate disposed over the channel layer, and an epitaxial source/drain structure disposed adjacent to the channel layer. The channel layer, the gate, and the epitaxial source/drain structure are disposed over the dielectric substrate. The epitaxial source/drain structure includes an inner portion having a first dopant concentration and an outer portion having a second dopant concentration that is less than the first dopant concentration. The inner portion physically contacts the dielectric substrate, and the outer portion is disposed between the inner portion and the channel layer. In some embodiments, the outer portion physically contacts the dielectric substrate. In some embodiments, the inner portion includes a lower portion having a first composition that physically contacts the dielectric substrate and an upper portion having a second composition disposed over the lower portion, wherein the second composition is different than the first composition. In some embodiments, the first composition includes a first germanium concentration and the second composition includes a second germanium concentration that is greater than the first germanium concentration. In some embodiments, the gate wraps the channel layer and the channel layer physically contacts the dielectric substrate. In some embodiments, the gate surrounds the channel layer and the gate physically contacts the dielectric substrate. In some embodiments, the epitaxial source/drain structure further includes a capping layer disposed over the inner portion and the outer portion. In some embodiments, the dielectric substrate is disposed between a first isolation feature and a second isolation feature.

An exemplary device includes a dielectric substrate. The device further includes a transistor having a channel layer, a gate disposed over at least two sides of the channel layer, and an epitaxial source/drain structure disposed adjacent to the channel layer. The channel layer, the gate, and the epitaxial source/drain structure are disposed over the dielectric substrate. The epitaxial source/drain structure includes a first epitaxial sidewall and a second epitaxial sidewall, and an epitaxial layer disposed between the first epitaxial sidewall and the second epitaxial sidewall. The first epitaxial sidewall and the second epitaxial sidewall each have a first dopant concentration. The epitaxial layer physically contacts the dielectric substrate, and the epitaxial layer has a second dopant concentration that is greater than the first dopant concentration. In some embodiments, the channel layer is a fin that physically contacts the dielectric substrate and the gate wraps the fin. In some embodiments, the channel layer is a suspended semiconductor layer, the gate surrounds the suspended semiconductor layer, and the gate surrounds physically contacts the dielectric substrate. In some embodiments, the dielectric substrate includes a first dielectric layer that wraps a second dielectric layer.

In some embodiments, the channel layer is a first channel layer and the semiconductor structure further includes a second channel layer disposed over the first channel layer. In some embodiments, the first epitaxial sidewall is disposed between the first channel layer and the epitaxial layer and between the second channel layer and the epitaxial layer, and the first epitaxial sidewall extends continuously from the first channel layer to the second channel layer and physically contacts the dielectric substrate. In some embodiments, the first epitaxial sidewall is disposed between the first channel layer and the epitaxial layer and between the second channel layer and the epitaxial layer, the first epitaxial sidewall is interrupted by the epitaxial layer, and the epitaxial layers is disposed between and separates the first epitaxial sidewall and the dielectric substrate. In some embodiments, the epitaxial layer is further disposed between and separates a first portion of the first epitaxial sidewall disposed along a first sidewall of the first channel layer and a second portion of the first epitaxial sidewall disposed along a second sidewall of the second channel layer.

An exemplary method includes forming a source/drain recess that extends a depth into a semiconductor substrate and epitaxially growing a first semiconductor layer having a first dopant concentration in the source/drain recess. The first semiconductor layer is disposed along sidewalls and a bottom of the source/drain recess. A thickness of the first semiconductor layer along the bottom of the source/drain recess is less than the depth. The method further includes epitaxially growing a second semiconductor layer in the source/drain recess and over the first semiconductor layer. The second semiconductor layer has a second dopant concentration greater than the first dopant concentration. The method further includes replacing the semiconductor substrate with a dielectric substrate. The second semiconductor layer physically contacts the dielectric substrate. In some embodiments, replacing the semiconductor substrate with the dielectric substrate includes bonding a carrier wafer to a back-end-of-line structure disposed over a frontside of the semiconductor substrate, performing an etching process to remove the semiconductor substrate and a portion of the first semiconductor layer disposed below a top surface of the semiconductor substrate, thereby exposing the second semiconductor layer, and forming a dielectric layer over the exposed second semiconductor layer. In some embodiments, the carrier wafer is a first carrier wafer, and the method further includes bonding the dielectric substrate to a second carrier wafer and removing the first carrier wafer from the back-end-of-line structure. In some embodiments, the etching process further removes a portion of the second semiconductor layer disposed below the top surface of the semiconductor substrate. In some embodiments, no well implant process is performed on the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a dielectric substrate; and
a channel layer, a gate disposed over the channel layer, and an epitaxial source/drain structure disposed adjacent to the channel layer, wherein the channel layer, the gate, and the epitaxial source/drain structure are disposed over the dielectric substrate, and further wherein the epitaxial source/drain structure includes:
an inner portion having a first dopant concentration, wherein the inner portion physically contacts the dielectric substrate, and
an outer portion having a second dopant concentration, wherein the second dopant concentration is less than the first dopant concentration and the outer portion is disposed between the inner portion and the channel layer.

2. The semiconductor structure of claim 1, wherein the gate wraps the channel layer and the channel layer physically contacts the dielectric substrate.

3. The semiconductor structure of claim 1, wherein the gate surrounds the channel layer and the gate physically contacts the dielectric substrate.

4. The semiconductor structure of claim 1, wherein the outer portion physically contacts the dielectric substrate.

5. The semiconductor structure of claim 1, wherein the inner portion includes a lower portion having a first composition that physically contacts the dielectric substrate and an upper portion having a second composition disposed over the lower portion, wherein the second composition is different than the first composition.

6. The semiconductor structure of claim 5, wherein the first composition includes a first germanium concentration and the second composition includes a second germanium concentration that is greater than the first germanium concentration.

7. The semiconductor structure of claim 1, wherein the epitaxial source/drain structure further includes a capping layer disposed over the inner portion and the outer portion.

8. The semiconductor structure of claim 1, wherein the dielectric substrate is disposed between a first isolation feature and a second isolation feature.

9. A semiconductor structure comprising:
a dielectric substrate; and
a transistor having a channel layer, a gate disposed over at least two sides of the channel layer, and an epitaxial source/drain structure disposed adjacent to the channel layer, wherein the channel layer, the gate, and the epitaxial source/drain structure are disposed over the dielectric substrate, and further wherein the epitaxial source/drain structure includes:
a first epitaxial sidewall and a second epitaxial sidewall, wherein the first epitaxial sidewall and the second epitaxial sidewall each have a first dopant concentration, and an epitaxial layer disposed between the first epitaxial sidewall and the second epitaxial sidewall, wherein the epitaxial layer physically contacts the dielectric substrate and the epitaxial layer has a second dopant concentration that is greater than the first dopant concentration.

10. The semiconductor structure of claim 9, wherein the channel layer is a fin that physically contacts the dielectric substrate and the gate wraps the fin.

11. The semiconductor structure of claim 9, wherein the channel layer is a suspended semiconductor layer, the gate surrounds the suspended semiconductor layer, and the gate physically contacts the dielectric substrate.

12. The semiconductor structure of claim 9, wherein:

the channel layer is a first channel layer and the semiconductor structure further includes a second channel layer disposed over the first channel layer; and the first epitaxial sidewall is disposed between the first channel layer and the epitaxial layer and between the second channel layer and the epitaxial layer; and the first epitaxial sidewall extends continuously from the first channel layer to the second channel layer and physically contacts the dielectric substrate.

13. The semiconductor structure of claim 9, wherein:

the channel layer is a first channel layer and the semiconductor structure further includes a second channel layer disposed over the first channel layer;

the first epitaxial sidewall is disposed between the first channel layer and the epitaxial layer and between the second channel layer and the epitaxial layer; and the first epitaxial sidewall is interrupted by the epitaxial layer, wherein the epitaxial layer is disposed between and separates the first epitaxial sidewall and the dielectric substrate.

14. The semiconductor structure of claim 13, wherein the epitaxial layer is further disposed between and separates a first portion of the first epitaxial sidewall disposed along a first sidewall of the first channel layer and a second portion of the first epitaxial sidewall disposed along a second sidewall of the second channel layer.

15. The semiconductor structure of claim 9, wherein the dielectric substrate includes a first dielectric layer that wraps a second dielectric layer.

16. A method comprising:

forming a source/drain recess that extends a depth into a semiconductor substrate;

epitaxially growing a first semiconductor layer having a first dopant concentration in the source/drain recess, wherein the first semiconductor layer is disposed along sidewalls and a bottom of the source/drain recess, wherein a thickness of the first semiconductor layer along the bottom of the source/drain recess is less than the depth;

epitaxially growing a second semiconductor layer in the source/drain recess and over the first semiconductor layer, wherein the second semiconductor layer has a second dopant concentration greater than the first dopant concentration; and replacing the semiconductor substrate with a dielectric substrate, wherein the second semiconductor layer physically contacts the dielectric substrate.

17. The method of claim 16, wherein the replacing the semiconductor substrate with the dielectric substrate includes:

bonding a carrier wafer to a back-end-of-line structure disposed over a frontside of the semiconductor substrate;

performing an etching process to remove the semiconductor substrate and a portion of the first semiconductor layer disposed below a top surface of the semiconductor substrate, wherein the etching process exposes the second semiconductor layer; and forming a dielectric layer over the exposed second semiconductor layer.

18. The method of claim 17, wherein the carrier wafer is a first carrier wafer, the method further comprising:

bonding the dielectric substrate to a second carrier wafer; and removing the first carrier wafer from the back-end-of-line structure.

19. The method of claim 17, wherein the performing the etching process further removes a portion of the second semiconductor layer disposed below the top surface of the semiconductor substrate.

20. The method of claim 16, wherein no well implant process is performed on the semiconductor substrate.

* * * * *